(12) United States Patent
Kukita

(10) Patent No.: US 10,964,160 B2
(45) Date of Patent: Mar. 30, 2021

(54) PLAYER TRACKING DEVICE MAIN BODY AND PLAYER TRACKING DEVICE

(71) Applicant: Universal Entertainment Corporation, Tokyo (JP)

(72) Inventor: Noritoshi Kukita, Tokyo (JP)

(73) Assignee: Universal Entertainment Corporation, Tokyo (JP)

( * ) Notice: Subject to any disclaimer, the term of this patent is extended or adjusted under 35 U.S.C. 154(b) by 10 days.

(21) Appl. No.: 16/408,775

(22) Filed: May 10, 2019

(65) Prior Publication Data

US 2019/0266839 A1 Aug. 29, 2019

Related U.S. Application Data

(63) Continuation of application No. 15/548,847, filed as application No. PCT/JP2016/053178 on Feb. 3, 2016, now Pat. No. 10,332,342.

(30) Foreign Application Priority Data

Feb. 12, 2015 (JP) .................................. 2015-040663
Feb. 12, 2015 (JP) .................................. 2015-040664

(51) Int. Cl.
| G07F 17/32 | (2006.01) |
| H05K 7/20 | (2006.01) |
| H01L 23/367 | (2006.01) |
| H01L 23/36 | (2006.01) |
| G06K 7/00 | (2006.01) |
| F28D 21/00 | (2006.01) |
| G07F 17/34 | (2006.01) |

(52) U.S. Cl.
CPC ....... *G07F 17/3237* (2013.01); *G06K 7/0095* (2013.01); *G07F 17/3251* (2013.01); *H01L 23/36* (2013.01); *H01L 23/367* (2013.01); *H01L 23/3672* (2013.01); *H01L 23/3675* (2013.01); *H05K 7/20154* (2013.01); *F28D 2021/0029* (2013.01); *G07F 17/34* (2013.01)

(58) Field of Classification Search
CPC ... H01L 23/3672; H01L 23/467; H01L 23/36; H01L 23/3675; H01L 23/367; F28D 2021/0029; H05K 7/20154; H05K 2201/10371; G07F 17/3237; G07F 17/3251; G07F 17/34; G06K 7/0095
See application file for complete search history.

(56) References Cited

U.S. PATENT DOCUMENTS

| 4,352,008 A * | 9/1982 | Hofer ...................... H05B 3/50 165/183 |
| 2008/0074846 A1* | 3/2008 | Peng .................. H05K 7/20936 361/715 |

\* cited by examiner

*Primary Examiner* — Werner G Garner
(74) *Attorney, Agent, or Firm* — Simpson & Simpson, PLLC; S. Peter Konzel

(57) ABSTRACT

Objects of the present invention are to provide a player tracking device main body which can be stably located in various postures inside of a housing of a gaming machine; and a player tracking device which includes said player tracking device main body. A PTS main body 1700*b* includes a magnet cover 1801 formed as a protruding portion on a central upper side of a base panel 1803. Inside of the magnet cover 1801, magnets (1810, 1811, and 1812) which are sandwiched between the magnet cover 1801 and a base stopper 1815 are located.

24 Claims, 31 Drawing Sheets

FIG.26

SYMBOL COMBINATION TABLE

| SYMBOL COMBINATION | | | | | PAYOUT NUMBER | WINNING COMBINATION |
|---|---|---|---|---|---|---|
| FIRST REEL | SECOND REEL | THIRD REEL | FOURTH REEL | FIFTH REEL | | |
| RED | RED | RED | RED | RED | 15 | RED |
| APPLE | APPLE | APPLE | APPLE | APPLE | 12 | APPLE |
| BLUE 7 | BLUE 7 | BLUE 7 | BLUE 7 | BLUE 7 | 10 | BLUE |
| BELL | BELL | BELL | BELL | BELL | 8 | BELL |
| CHERRY | CHERRY | CHERRY | CHERRY | CHERRY | 5 | CHERRY3 |
| STRAWBERRY | STRAWBERRY | STRAWBERRY | STRAWBERRY | STRAWBERRY | 5 | STRAWBERRY |
| PLUM | PLUM | PLUM | PLUM | PLUM | 4 | PLUM |
| ORANGE | ORANGE | ORANGE | ORANGE | ORANGE | 3 | ORANGE3 |
| CHERRY | CHERRY | CHERRY | (ANY) | (ANY) | 2 | CHERRY2 |
| ORANGE | ORANGE | ORANGE | (ANY) | (ANY) | 2 | ORANGE2 |
| CHERRY | (ANY) | (ANY) | (ANY) | (ANY) | 1 | CHERRY1 |
| ORANGE | (ANY) | (ANY) | (ANY) | (ANY) | 1 | ORANGE1 |

PLAYER TRACKING DEVICE MAIN BODY AND PLAYER TRACKING DEVICE

CROSS REFERENCE TO RELATED APPLICATIONS

This application is continuation of U.S. patent application Ser. No. 15/548,847 filed Aug. 4, 2017, which application is the U.S. Nat. Stage of Int. App. No. PCT/JP2016/053178 filed Feb. 3, 2016, which application claims priority to Japanese Pat. App. Nos. 2015-040663 and 2015-040664 both filed Feb. 12, 2015, each of which above-identified applications are incorporated herein by reference in their entireties.

TECHNICAL FIELD

The present invention relates to a player tracking device which is incorporated into a gaming machine.

BACKGROUND ART

Conventionally, there has been proposed a gaming system which includes: player tracking devices, each of which receives information for identifying a player and provides information pertinent to contents and the like (a bonus game and the like) for the identified player; a plurality of gaming machines, each of which has the player tracking device; and a player server which identifies a player at each of the gaming machines based on player identification information from each of the player tracking devices (refer to Patent Literature 1).

Here, the above-mentioned player tracking device is constituted of, for example, a front unit integrally mounted on a front face of each of the gaming machines; and a main body connected to the front unit and including a control device and the like and realizes a player tracking system (PTS). Main purposes of the player tracking device is to identify and manage a player playing on each of the gaming machines for each of the gaming machines and to provide individual information, point service, a game play which is different from those played on each of the gaming machines, and the like for each player.

CITATION LIST

Patent Literature

Patent Literature 1: U.S. Pat. No. 8,403,745 Specification

SUMMARY OF THE INVENTION

Technical Problem

As described above, the player tracking device identifies a player for each of the gaming machines, manages behavior of each player, and provides individual information, point service, a game play which is different from those played on each of the gaming machines, and the like for each player. In the game system as disclosed in Patent Literature 1, contents such as a bonus game and the like is provided for each player by the player tracking device and the player server.

However, although there are needs for the introduction of the player tracking devices as described above on gaming machines having various configurations, the player tracking device main body of each of the conventional player tracking devices cannot be located inside of a housing of each of the gaming machines stably in various postures. In addition, the player tracking device main body cannot be easily attached and detached.

Solution to Problem

The present invention provides a player tracking device main body and a player tracking device as described below.

In view of the above-described regard, the present invention has been made. Objects of the present invention are to provide a player tracking device main body which can be located in various postures inside of a housing of a gaming machine and a player tracking device which includes said player tracking device main body.

In addition, objects of the present invention are to provide a player tracking device main body having a configuration which allows easy attachment and detachment onto and from the housing of the gaming machine; and a player tracking device which includes said player tracking device main body.

The player tracking device main body according to a first aspect of the present invention includes the below-described configuration.

The player tracking device main body (for example, a PTS main body 1700*b*) is connected to a front unit (for example, a PTS front unit 1700*a*) of a player tracking device, the player tracking device including an operation part (for example, an LCD 1719 having a touch panel function) operated by a player of a gaming machine (for example, a slot machine 1010), the player tracking device main body being located so as to be spaced apart from the front unit, the player tracking device main body including an attachment part (for example, a magnet cover 1801 or the like) which includes magnets (for example, magnets (1810, 1811, and 1812)), the magnets being arranged so as to allow the player tracking device main body to be attached inside of a housing (for example, a cabinet 1011 or a top box 1012) of the gaming machine.

By employing the above-described configuration, since the attachment part of the player tracking device main body is configured to include the magnets, the player tracking device main body can be stably located in various postures inside of the housing of the gaming machine. Further, attachment and detachment thereof to and from the housing of the gaming machine can be facilitated.

In the first aspect, the player tracking device main body according to a second aspect of the present invention further has the below-described configuration.

The player tracking device main body includes a supporting part (for example, a base panel 1803) for supporting the attachment part, and the attachment part is configured as a protruding portion which protrudes from the supporting part.

By employing the above-described configuration, since the attachment part of the player tracking device main body is configured as the protruding portion, heat can be effectively dissipated.

In the second aspect, the player tracking device main body according to a third aspect of the present invention further has the below-described configuration.

The protruding portion is located in a center of the supporting part.

By employing the above-described configuration, since the protruding portion of the player tracking device main body is configured to be located in the center of the supporting part, when the player tracking device main body is located inside of the housing of the gaming machine, the player tracking device main body can be easily stabilized in terms of the center of gravity and balance. In addition, it is made easy for a face in contact with a place where the PTS main body is located inside of the housing of the gaming machine to be provided in a continuous and wide manner, whereby its friction resistance causes displacement thereof to hardly occur.

In the third aspect, the player tracking device main body according to a fourth aspect of the present invention further has the below-described configuration.

The protruding portion is formed to be of a circular shape, and a plurality of the magnets are located concentrically with the circular shape.

By employing the above-described configuration, since the protruding portion is formed to be of the circular shape and the plurality of the magnets are located concentrically with the circular shape, upon detaching the player tracking device main body, when the detachment is performed even from any angle, the detaching force is made even and the detachment is facilitated.

In the first aspect, the player tracking device according to a fifth aspect of the present invention further has the below-described configuration.

The player tracking device (for example, a PTS terminal 1700) includes the player tracking device main body according to the first aspect.

By employing the above-described configuration, since the attachment part of the player tracking device main body is configured to include the magnets, the player tracking device main body can be stably located in various posture inside of the housing of the gaming machine. Further, attachment and detachment thereof to and from the housing of the gaming machine can be facilitated.

Advantageous Effects of the Invention

A player tracking device main body according to the present invention can be stably located in various postures inside of a housing of a gaming machine and can be easily attached and detached to and from the housing of the gaming machine.

BRIEF DESCRIPTION OF THE DRAWINGS

FIG. 26 is a diagram showing an example of a symbol combination table which the slot machine according to the one embodiment of the present invention includes.

DESCRIPTION OF EMBODIMENTS

One embodiment of the present invention will be described with reference to the accompanying drawings.

[Description of Outline of Game System]

Figure 1:
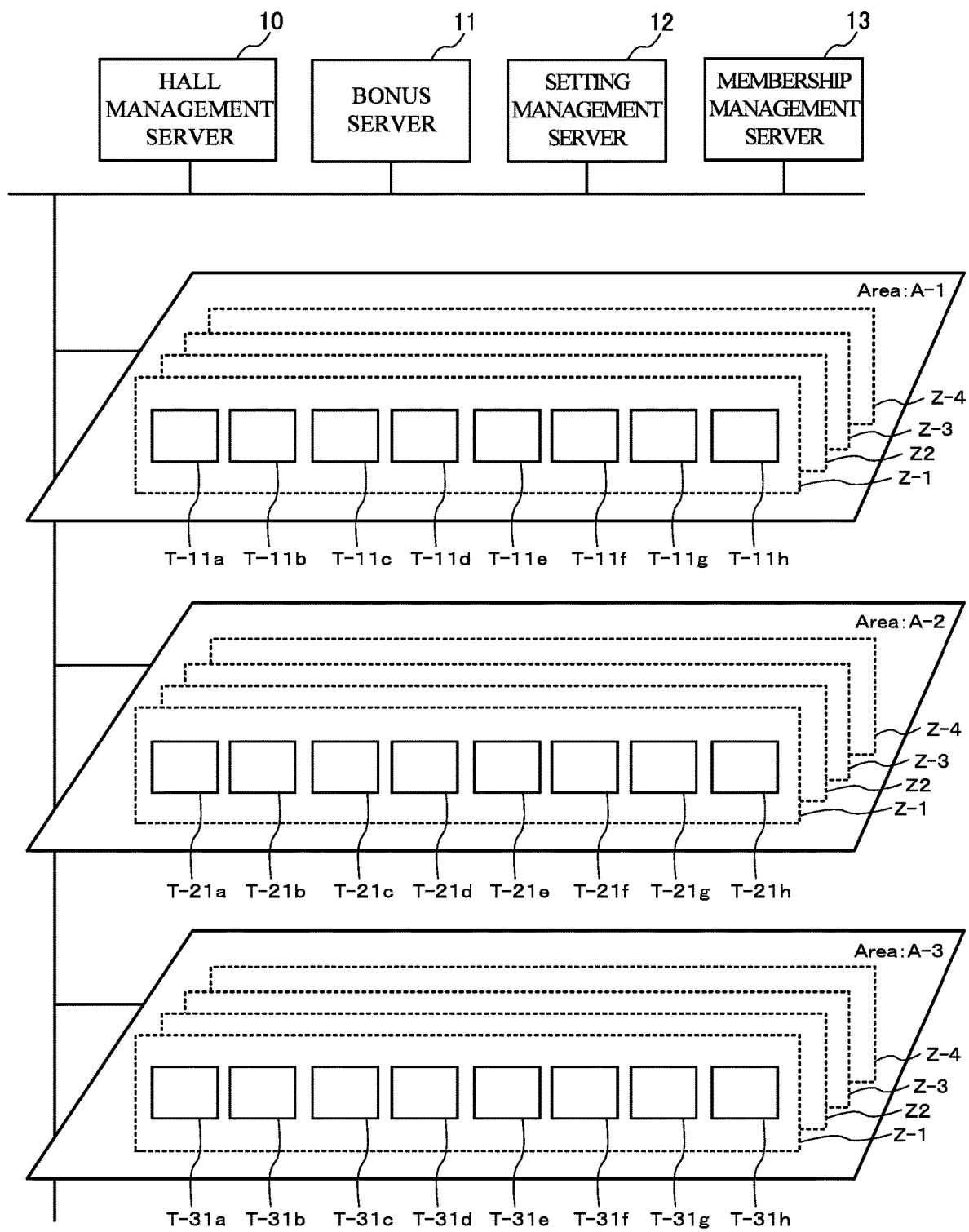
FIG. 1 is a diagram schematically illustrating a game system according to one embodiment of the present invention.

First, with reference to FIG. 1, an outline of a game system will be described. FIG. 1 is a schematic diagram schematically illustrating an overview of the game system 1 according to the one embodiment of the present invention.

The game system 1 includes: a hall management server 10, a bonus server 11, a setting management server 12, a membership management server 13, and a plurality of gaming machines.

The hall management server 10 totalizes and manages a flow of money within a hall (game facility), prepares a balance sheet and the like, and manages the other servers. In addition, the hall management server 10 obtains, from the respective gaming machines, accounting information which includes timing at which each of the gaming machines starts a unit game; timing at which each of the gaming machines terminates the unit game; a drawing result in the unit game; and the like and accumulates the accounting information.

The bonus server 11 controls a bonus drawing in a bonus game and predetermined presentation conducted in association with the bonus drawing. In addition, the bonus server 11, for example, manages an accumulated value for providing a bonus (for example, credits accumulated for a progressive bonus). The setting management server 12 stores and manages setting related to gaming machines, on each of which the bonus drawing is conducted, and setting related to the presentation. It is to be noted that although in the present embodiment, the description is given by taking the bonus game as an example, other kinds of games such as a slot tournament may be conducted.

The membership management server 13 is a server which stores and manages personal information of members, membership card (IC card) information, the past game outcomes of the members, and the like. Issuance of membership cards (IC cards) is made by, for example, a membership card issuing terminal. The personal information of the members, inputted upon member registration, is stored on the membership management server 13 together with identification codes of the membership cards. In addition, the membership card issuing terminal is provided with a camera which allows also shooting of a face of a player for which an IC card is issued upon issuing of a membership card. The shot image is stored on the membership management server 13 so as to be associated with an identification code.

As shown in FIG. 1, the gaming machines are installed in a plurality of areas (for example, as shown in FIG. 1, A-1 to A-3). Here, the areas correspond to, for example, one floor of a hall or areas within the floor. In this example, although the areas from A-1 to A-3 are shown, this is merely one example.

Further, the gaming machines are installed in each zone (for example, as shown in FIG. 1, in Z-1 to Z-4) within each of the areas. Here, each of the zones corresponds to specific space within each of the areas. In this example, although the four zones (Z-1 to Z-4) are provided in each of the areas, respectively, this is also merely one example. In addition, in this example, although eight gaming machines are installed in each one of the zones, respectively, this is also merely one example, and various numbers of the gaming machines can be installed.

As shown in FIG. 1, in the zone Z-1 of the area A-1, eight gaming machines of T-11a to T-11h are installed; similarly, in the zone Z-2 of the area A-1, eight gaming machines of T-12a to T-12h are installed (thereinafter, not shown); in the zone Z-3 of the area A-1, eight gaming machines of T-13a to T-13h are installed; and in the zone Z-4 of the area A-1, eight gaming machines of T-14a to T-14h are installed.

Further, as shown in FIG. 1, in the zone Z-1 of the area A-2, eight gaming machines of T-21a to T-21h are installed; similarly, in the zone Z-2 of the area A-2, eight gaming machines of T-22a to T-22h are installed (thereinafter, not shown); in the zone Z-3 of the area A-2, eight gaming machines of T-23a to T-23h are installed; and in the zone Z-4 of the area A-2, eight gaming machines of T-24a to T-24h are installed. In addition, in the zone Z-1 of the area A-3, eight gaming machines of T-31a to T-31h are installed; similarly, in the zone Z-2 of the area A-3, eight gaming machines of T-32a to T-32h are installed (thereinafter, not shown); in the zone Z-3 of the area A-3, eight gaming machines of T-33a to T-33h are installed; and in the zone Z-4 of the area A-3, eight gaming machines of T-34a to T-34h are installed.

It is to be noted that although it is schematically shown that the respective gaming machines are connected to the hall management server 10 and the bonus server 11 via a LAN connection by Ethernet (a registered trademark), the more detailed connection form will be described later.

In addition, each of the gaming machines is provided with a unique identifier, and the hall management server 10 and the like identify transmission sources of data transmitted from the respective gaming machines by using the identifiers. In addition, also in a case where the hall management server 10 and the like transmit data to the gaming machines, based on the identifiers, transmission destinations are specified. Although as the identifiers, for example, network addresses such as IP addresses can be used, identifiers other than the network addresses may be provided, also thereby allowing the individual gaming machines to be managed.

It is to be noted that the game system 1 may be constructed within one hall (game facility) where various games can be conducted or may be constructed over a plurality of halls. In addition, when the game system 1 is constructed in a single hall, the game system 1 may be constructed in each floor or section of the hall. A communication line for connecting the servers and the gaming machines may be a wired or wireless line, and as the communication line, a dedicated line, an exchange line, or the like can also be adopted.

[Description of Outline of Gaming Machine]

Figure 2:
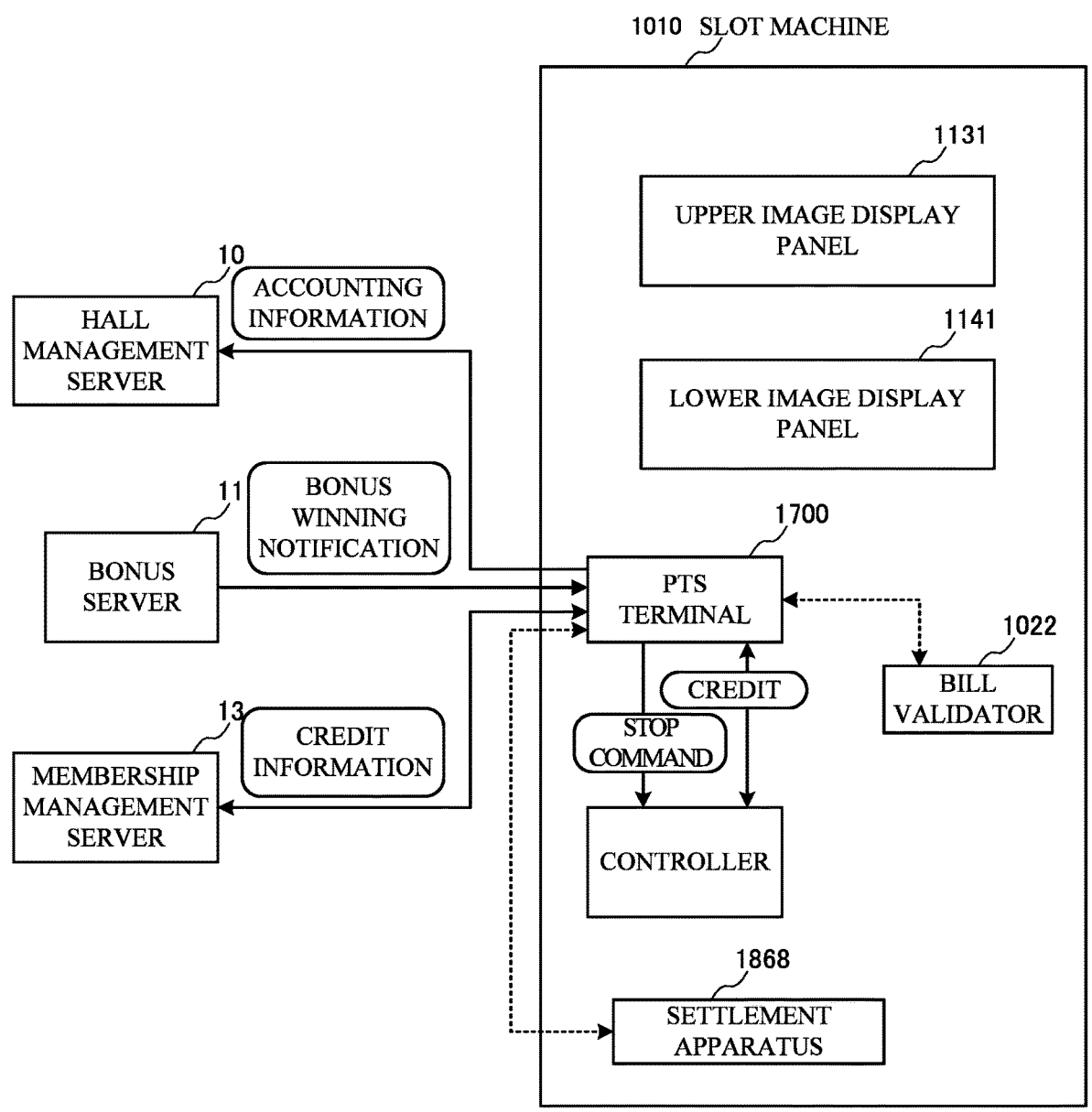
FIG. 2 is a diagram schematically illustrating a slot machine according to one embodiment of the present invention.

Next, with reference to FIG. 2, an outline of a gaming machine according to the embodiment of the present invention will be described. In FIG. 2, a configuration of a slot machine 1010 which is a gaming machine including a player tracking device (Player Tracking Device) is conceptually shown. It is to be noted that the player tracking device is a terminal for realizing a player tracking system (Player Tracking System) and in the present specification, hereinafter, this device is referred to as a PTS terminal. In addition, the PTS terminal in the present embodiment is configured to include a PTS front unit and a PTS main body. The PTS front unit is arranged integrally with a front face of the gaming machine and includes an operation part operated by a player. In addition, the PTS main body includes a control part connected to the PTS front unit by cables and the like and is located so as to be spaced apart from the PTS front unit. It is to be noted that although in the below description, a case where the slot machine is used as the gaming machine will be described, the present invention is not limited to the case of the slot machine and is applicable to gaming machines which conduct a variety of games.

As shown in FIG. 2, the slot machine 1010 has the PTS terminal 1700 mounted therein and further includes a settlement apparatus 1868. The slot machine 1010 is connected via the PTS terminal 1700 to the hall management server 10, the bonus server 11, and the like via a network. In the present embodiment, one slot machine 1010 is provided with one PTS terminal 1700.

In the present embodiment, the PTS terminal 1700 is connected to a bill validator 1022 via the communication line (or the slot machine 1010).

In addition, based on a predetermined protocol, the PTS terminal 1700 conducts transmission and reception of data to and from a controller (the later-described controller 1100 of the slot machine 1010) and conducts data communication with the hall management server 10, the bonus server 11, and the like connected via the network. For example, from the PTS terminal 1700 to the controller 1100, information pertinent to a credit required to start a game, a stop command to instruct to stop a unit game upon predetermined presentation, and the like can be transmitted, and from the controller 1100 to the PTS terminal 1700, information pertinent to a credit as a game outcome, start notification of the unit game, and termination notification thereof can be transmitted.

In addition, from the PTS terminal 1700 to the hall management server 10, the start notification and the termination notification of the unit game, accounting information including a drawing result or the like, and the like are transmitted. From the bonus server 11 to the PTS terminal 1700 (of a predetermined slot machine 1010), bonus winning notification is transmitted. Further, between the PTS terminal 1700 and the membership management server 13, information pertinent to credits of members and the like is communicated.

Here, an outline of a game flow in a case of members is as described below. First, member registration is conducted by using the membership card issuing terminal, and at this time, a membership card (IC card) is issued. Thereafter, a player inserts the membership card into the PTS terminal 1700 of the slot machine 1010 and inputs cash there. When a bill or bills have been inputted, the bill validator 1022 identifies a currency kind and a money amount and transmits currency kind data and money amount data as an identification result to the PTS terminal 1700. The PTS terminal 1700 calculates a credit for a game from the currency kind data and the money amount data and transmits the calculated credit to the controller 1100.

Based on the credit transmitted from the PTS terminal 1700, the controller 1100 executes the game. A credit in accordance with a game outcome is transmitted from the controller 1100 to the PTS terminal 1700, calculation for paying-out based on the game outcome is performed on the PTS terminal 1700, and a money amount to be paid out to a player is determined. On the PTS terminal 1700, the determined money amount is written onto the membership card as it is, and the membership card is ejected. In addition, in accordance with the execution or the like of the game, predetermined points are provided for the membership card.

In a case where a player who is a member plays a game next, the PTS terminal 1700 reads the inserted membership card and then reads out the money amount stored in the membership card. The read-out money amount is converted to a credit and the converted credit is transmitted to the controller 1100. A credit in accordance with a game outcome is transmitted from the controller 1100 to the PTS terminal 1700 as mentioned above, calculation for paying-out based on the game outcome is performed on the PTS terminal 1700, and a money amount to be paid out to a player is determined. At this time, the money amount obtained as the game outcome is added to the money amount of the membership card, thereby updating this.

Further, at this time, the PTS terminal 1700 transmits an identification code (or a member ID) read out from the membership card and the updated money amount to the membership management server 13, and the membership management server 13 adds the money amount transmitted from the PTS terminal 1700 to a money amount of a member identified by the above-mentioned identification code and stores said money amount. By conducting this processing, the money amount which the member holds is invariably managed.

Thereafter, if needed, a player who is a member can make settlement at a cashier counter or the like, based on the money amount stored on the membership card. In addition, as in the above-described slot machine 1010, in a case where the settlement apparatus 1868 is included therein, on said slot machine 1010, the settlement can be made by using the membership card.

On the other hand, an outline of a game flow in a case where a player is a non-member is as described below. A player inputs cash to the PTS terminal 1700 of the slot machine 1010. When the bill or bills have been inputted, the bill validator 1022 identifies a currency kind and a money amount and transmits currency kind data and money amount data as an identification result to the PTS terminal 1700. The PTS terminal 1700 calculates a credit for a game from the currency kind data and the money amount data and transmits the calculated credit to the controller 1100.

Based on the credit transmitted from the PTS terminal 1700, the controller 1100 executes the game. A credit in accordance with a game outcome is transmitted from the controller 1100 to the PTS terminal 1700, calculation for paying-out based on the game outcome is performed on the PTS terminal 1700, and a money amount to be paid out to a player is determined. On the PTS terminal 1700, this determined money amount is written onto a new IC card stocked in the slot machine 1010, and the IC card is ejected. Here, the non-member gets the IC card for the first time.

Thereafter, if needed, a player who is the non-member can make settlement at a cashier counter or the like based on the money amount stored on the IC card. In addition, as in the above-described slot machine 1010, in a case where the settlement apparatus 1868 is included therein, on said slot machine 1010, the settlement can be made by using the IC card.

[Description of Function Flow Diagram]

Figure 3:
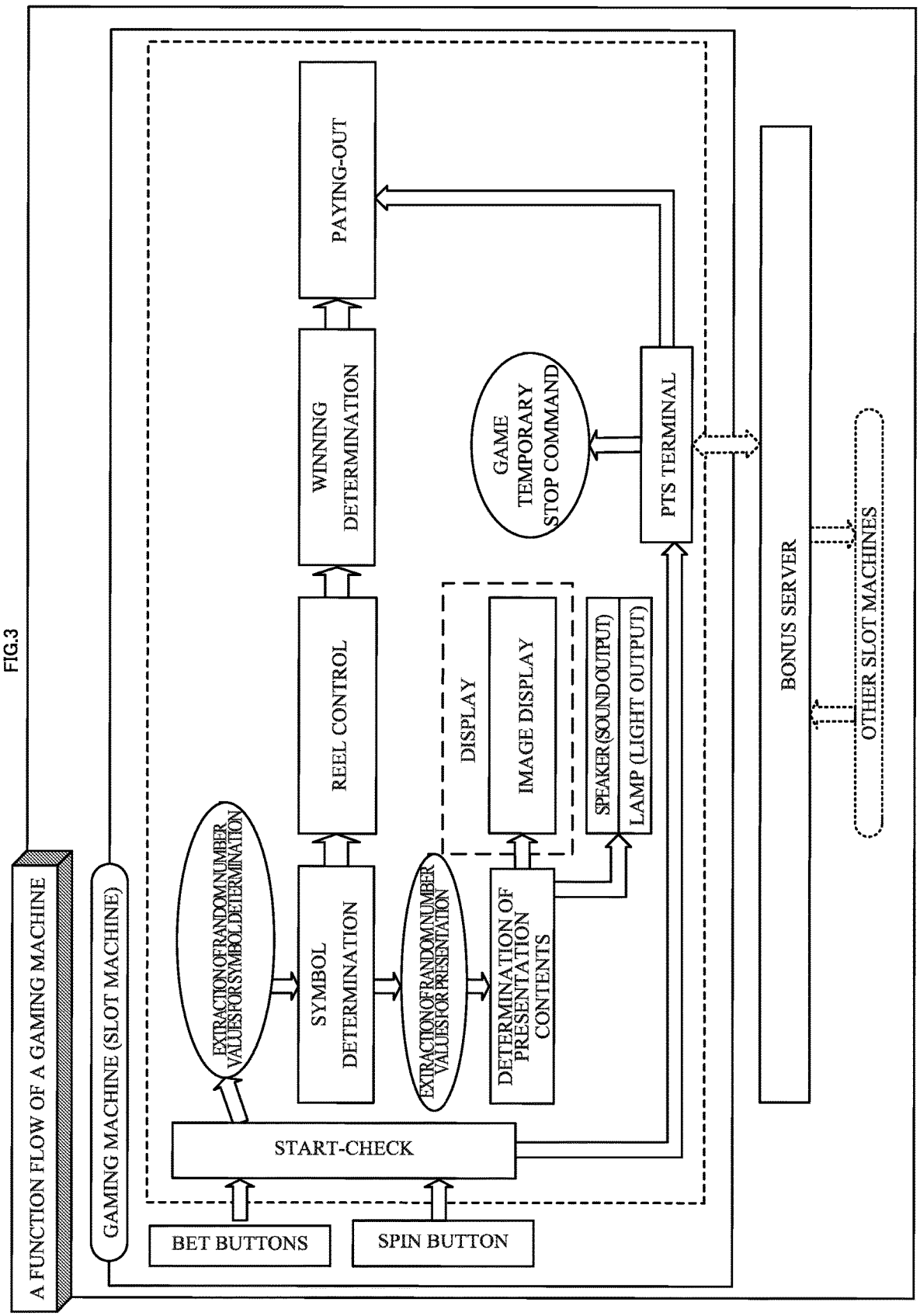
FIG. 3 is a diagram showing basic functions of the slot machine according to the one embodiment of the present invention.

With reference to FIG. 3, basic functions of a slot machine according to one embodiment of the present invention will be described. As shown in FIG. 3, the slot machine 1010 is connected to an external control device (for example, a bonus server 11) so as to allow data communication, and the external control device is connected to a plurality of other slot machines 1010 installed in a hall so as to allow data communication.

<Start-Check>

First, the slot machine 1010 checks whether or not a BET button has been pressed by a player and subsequently checks whether or not a spin button has been pressed by a player.

<Symbol Determination>

Next, when the spin button has been pressed by a player, the slot machine 1010 extracts random number values for symbol determination and determines symbols to be displayed to a player with respect to a plurality of reels displayed on a display at the time of stopping the rotation of the reels.

<Reel Control>

Next, the slot machine 1010 starts the rotation of each of the reels and then stops the rotation such that the determined symbols are displayed to a player.

<Winning Determination>

Next, when the rotation of each of the reels has been stopped, the slot machine 1010 determines whether or not a combination of symbols displayed to a player is a combination related to winning.

<Paying-Out>

Next, when the symbols displayed to a player is the combination related to the winning, the slot machine 1010 provides a benefit in accordance with a kind of the combination for a player. For example, when a combination of symbols related to paying-out of coins has been displayed, the slot machine 1010 adds a number of coins corresponding to the combination of symbols to a number of credits.

In addition, the slot machine 1010 is connected to the bonus server 11. On the bonus server 11, in a case where the spin button has been pressed by a player and a unit game has been thereby started and in a case where the unit game has been terminated, in response thereto, a drawing for a bonus game is conducted. When as a result of the drawing for the bonus game, winning has occurred on any of the slot machines 1010, predetermined presentation is conducted on a display device or the like of the PTS terminal 1700. Here, the unit game refers to a series of operations conducted from when the acceptance of betting is started to when winning is likely to be established.

On any of the slot machines 1010 which has won in the bonus game, the provision of the credit is conducted from the bonus server 11 via the PTS terminal 1700. In addition, it can be arranged such that the bonus server 11 accumulates, for example, one part of a credit consumed by a player on each of the slot machines 1010 as a credit for a progressive bonus and when any of the slot machines 1010 has won in the bonus game, adds a number of coins corresponding to one part of the progressive bonus (to a number of credits) for that slot machine 1010.

<Determination of Presentation>

The slot machine 1010 conducts presentation through displaying of images by a display, outputting of light by a lamp, and outputting of sound by a speaker. The slot machine 1010 extracts a random number value for the presentation and determines presentation contents based on symbols or the like determined by a drawing.

[Structure of Slot Machine]

Next, with reference to FIG. 4, an overall structure of a slot machine 1010 will be described.

On the slot machine 1010, as game media, bills or electronic valuable information corresponding to these are used. In particular, in the present embodiment, credit-related data such as cash data stored in an IC card 1500 is used. It is to be noted that although the slot machine 1010 has a structure in which coins are not used as the game media, this is merely one example, and the slot machine 1010 may be configured as a slot machine on which a variety of game media including the coins can be used.

The slot machine 1010 is provided with a housing which includes a cabinet 1011 and a top box 1012 attached on an upper side of the cabinet 1011. Main parts of the cabinet 1011 and the top box 1012 are formed of metallic plate members. In addition, on a front face of the cabinet 1011, an upper door 1142 and a lower door 1144 are provided.

On a lower side of a front face of the upper door 1142, a lower image display panel 1141 is provided. The lower image display panel 1141 is constituted of a liquid crystal panel and constitutes a display.

In addition, on the front face of the upper door 1142 and above the above-mentioned lower image display panel 1141, a symbol display window 1135 is provided. Through the symbol display window 1135, a reel apparatus M1 which is provided inside of the cabinet 1011 and is constituted of five reels M1$a$ to M1$e$ is visually recognizable. On a peripheral surface of each of the reels, 12 symbols are depicted. The 12 symbols are arranged in succession along a direction in which each of the reels of the reel apparatus M1 is rotated and form a symbol array. Each of the reels M1$a$ to M1$e$ is rotated, the symbols depicted on each of the reels are thereby rotated in a longitudinal direction, and thereafter, the rotation is stopped, thereby allowing the symbols to be rearranged.

Here, the "rearrangement" means a state in which after the arrangement of the symbols has been released, the symbols are arranged again. The "arrangement" means a state in which the symbols can be visually confirmed by a player at the outside. The slot machine 1010 executes the so-called slot game in which based on the state of the arrangement of the symbols on the reels M1$a$ to M1$e$ which have been rotated and thereafter stopped, a payout in accordance with a predetermined combination is awarded.

It is to be noted that although in the present embodiment, the slot machine 1010 is a slot machine which includes the mechanical reel type reel apparatus M1, the slot machine 1010 may be a slot machine which includes a video reel type reel apparatus displaying pseudo reels, and the slot machine 1010 may be a slot machine in which the video reel type reel apparatus and the mechanical reel type reel apparatus are combined.

On a front face of the top box 1012, an upper image display panel 1131 is provided. The upper image display panel 1131 is constituted of a liquid crystal panel and constitutes a display. The upper image display panel 1131 displays images related to presentation and images showing introduction of contents of games and rules thereof.

On the above-mentioned lower image display panel 1141, arranged are a number-of-credits display part which indicates a state of credits (for example, a total number of credits which a player currently has) as necessary and a fraction cash display part which indicates fraction cash, and a variety of pieces of information pertinent to a game such as contents of betting are displayed. Here, the "credits" are virtual game media on a game, to be used when a player makes betting. In addition, the "fraction cash" is cash which is not converted to a credit because an inputted money amount is insufficient.

When the IC card 1500 has been inserted into the later-described PTS terminal 1700, a number of credits stored on the IC card is displayed on the number-of-credits display part, and fraction cash stored on the IC card is displayed on the fraction cash display part. It is to be noted that these numerical values are stored on the membership management server 13 so as to be associated with an identification code of the membership card.

Here, the IC card is, for example, a non-contact IC card and has incorporated thereon an IC (Integrated Circuit) for recording and computing a variety of pieces of data such as credits and enables short-range wireless communication using an RFID (Radio Frequency Identification) technology such as NFC (Near Field Communication), for example. By using the IC card 1500, a player can have the credit-related data and further, freely carries the IC card with him or her among different slot machines. A player inserts the IC card 1500 into the PTS terminal 1700 of the slot machine 1010 and thereby uses the credit-related data (money amount data) stored on the IC card 1500, thereby allowing a player to play a game such as a unit game on the slot machine 1010.

It is to be noted that it may be made possible for a player to deposit cash such as coins and bills as cash data on the IC card 1500 by using an apparatus installed in a hall.

On right and left sides of an uppermost portion of a front face of the lower door 1144, speakers 1112 are respectively provided. On the slot machine 1010, presentation for a unit game is executed through displaying of images by the upper image display panel 1131, outputting of sound by the speakers 1112, outputting of light by a lamp (not shown), and the like.

In addition, on the front face of the lower door 1144 and below said speaker 1112, a PTS front unit 1700*a* which is a front part of the PTS terminal 1700 is incorporated, and on a right side of the PTS front unit 1700*a*, a printed matter discharge outlet 1136 and a bill insertion slot 1137 are located.

Further, on the front face of the lower door 1144, below the PTS front unit 1700*a*, a control panel 1030 is located. The control panel 1030 includes a base plate which is of a flat plate shape, and on said base plate, a plurality of operation buttons (i.e. a spin button 1031, a MAX BET button 1032, a 5-BET button 1033, a 3-BET button 1034, a 2-BET button 1035, a 1-BET button 1036, a HELP button 1037, and a CASHOUT button 1038) are located.

In order to allow a player to easily perform a pressing operation of the spin button 1031 and easily identify the spin button 1031, the spin button 1031 is formed so as to be of a circular shape whose size is larger than those of the other buttons. The spin button 1031 is located in a right end portion of the base plate and has a function to start a game through the pressing operation.

The MAX BET button 1032 to 1-BET button 1036 are located on a left side of the spin button 1031 in an aligned manner at equal intervals. Each of these operation buttons is formed so as to be of a quadrangular shape. The MAX BET button 1032 located in a right end portion has a function to allow a game to be played with a maximum number of bets such as a decuple through a pressing operation. The 5-BET button 1033 has a function to allow a game to be played with a quintupled number of bets through a pressing operation. The 3-BET button 1034 has a function to allow a game to be played with a tripled number of bets through a pressing operation. The 2-BET button 1035 has a function to allow a game to be played with a doubled number of bets through a pressing operation. The 1-BET button 1036 has a function to allow a game to be played with one bet through a pressing operation.

The HELP button 1037 and the CASHOUT button 1038 are located in a longitudinal direction in a left end portion of the base plate. The HELP button 1037 has a function to display HELP information indicating a game method and the like on the lower image display panel 1141 or the like through a pressing operation. In addition, the CASHOUT button 1038 has a function to store a credit or the like on the IC card 1500 and to output the credit or the like in the form of a printed matter through a pressing operation.

Further, in the slot machine 1010, in a side portion of the cabinet 1011, air ventilation slots 1133 and an air intake slot 1134 are located and in a side portion of the top box 1012, air ventilation slots 1132 are located. In addition, in an inside portion of the cabinet 1011, which corresponds to a position of the air ventilation slots 1133, a fan (not shown) is arranged, and similarly, in an inside portion of the top box 1012, which corresponds to a position of the air ventilation slots 1132, a fan (not shown) is arranged. These fans allow air inside of the slot machine 1010 to be discharged to an outside and take in external air from the air intake slot 1134, and through such air circulation, a temperature inside of the slot machine 1010 is adjusted.

In addition, in a side portion of the cabinet 1011 of the slot machine 1010, provided are a key cylinder 1138 into which a key used to open the upper door 1142 and the lower door 1144 is inserted and a door lock bar 1139 with which the upper door 1142 and the lower door 1144 are locked.

Next, with reference to FIG. 5 and FIG. 6, the slot machine 1010 in a state in which the upper door 1142 and the lower door 1144 are opened and an internal structure of the cabinet 1101 will be described.

Figure 5:
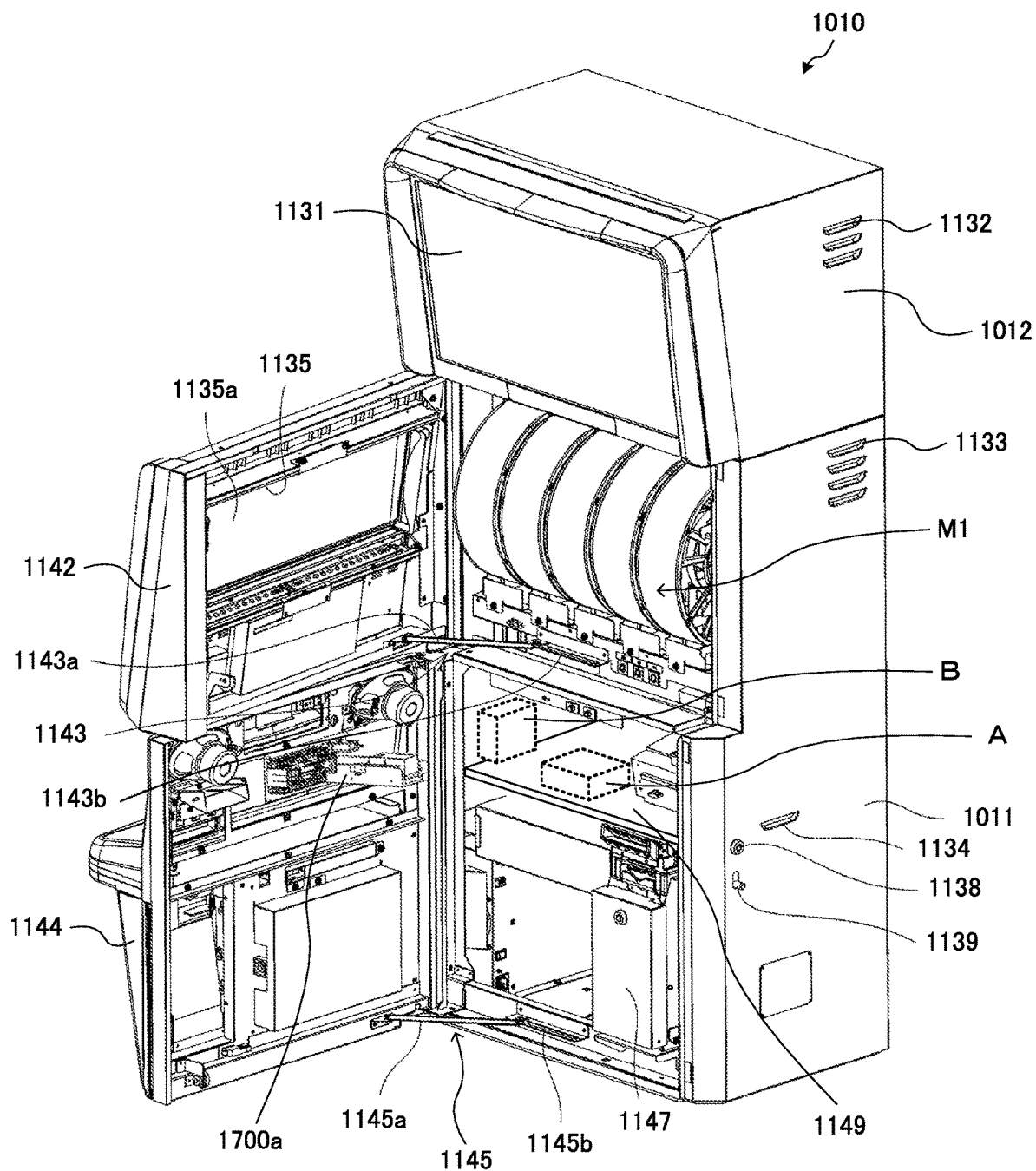
FIG. 5 is a perspective view illustrating a state in which an upper door and a lower door of the slot machine according to the one embodiment of the present invention are opened.

FIG. 5 is a perspective view illustrating the slot machine 1010 in the state in which the upper door 1142 and the lower door 1144 are opened. As shown in FIG. 5, on the front face of the top box 1012 of the slot machine 1010, as described above, the upper image display panel 1131 is located, and in the side portion of the top box 1012, the air ventilation slots 1132 are located. The cabinet 1011 of the slot machine 1010 is formed so as to be of a box-like shape with the front face being opened, and in an upper portion of the front face, the upper door 1142 is located, and in a lower portion of the front face, the lower door 1144 is located.

In addition, in an upper portion of the side portion of the cabinet 1011, the air ventilation slots 1133 are located, and in a middle portion of the side portion of the cabinet 1011, the air intake slot 1134 is located. Further, in the vicinity of the air intake slot 1134, the above-mentioned key cylinder 1138 and door lock bar 1139 are located.

As shown in FIG. 5, in a left end portion of the cabinet 1011, the cabinet 1011 pivotally supports the upper door 1142 and the lower door 1144 in a rotatable manner. On an upper end portion and a lower end portion of the upper door 1142, the upper door 1142 and the cabinet 1011 are pivotally supported in a rotatable manner and are coupled by an upper door opening mechanism 1143. The upper door opening mechanism 1143 is located on a lower side of the upper door 1142 and has a rod member 1143*a* whose one end portion is pivotally supported in a rotatable manner onto a rear face wall of the upper door 1142 and a slide member 1143*b* which is laterally provided on a front face side of the cabinet 1011. The slide member 1143*b* engages the other end portion of the rod member 1143*a* in a horizontally movable manner, temporarily stops the upper door 1142 at a predetermined opening angle, and when a predetermined force or more is applied externally in a direction in which the upper door 1142 is closed, moves the upper door 1142 in a rotatable manner in a closing direction.

In addition, on an upper end portion and a lower end portion of the lower door 1144, the lower door 1144 and the cabinet 1011 are pivotally supported in a rotatable manner and are coupled by a lower door opening mechanism 1145. The lower door opening mechanism 1145 is located on a lower side of the lower door 1144 and has a rod member 1145*a* whose one end portion is pivotally supported in a rotatable manner onto a rear face wall of the lower door 1144 and a slide member 1145*b* which is laterally provided on a front face side of the cabinet 1011. The slide member 1145*b* engages the other end portion of the rod member 1145*a* in a horizontally movable manner, temporarily stops the lower door 1144 at a predetermined opening angle, and when a predetermined force or more is applied externally in a direction in which the lower door 1144 is closed, moves the lower door 1144 in a rotatable manner in a closing direction.

In the upper door 1142, as described above, the symbol display window 1135 is arranged, and the symbol display window 1135 is covered with a reel cover 1135*a*. The reel cover 1135*a* includes: for example, a base panel such as a transparent liquid crystal panel and a transparent panel; and a touch panel provided on a front face of the base panel. The symbol display window 1135 covered with the reel cover 1135*a* allows 15 symbols in areas of 5 columns×3 rows among symbols depicted on peripheral surfaces of the respective reels of the reel apparatus M1 to be made viewable externally.

In addition, in FIG. 5, the PTS front unit 1700*a* located in the middle portion of the lower door 1144 is shown. With the lower door 1144 being closed, the PTS front unit 1700*a* comes to be housed inside of the cabinet 1011. A configuration of the PTS terminal 1700 including the PTS front unit 1700*a* will be described below in detail.

In a right lower portion of the cabinet 1011, a bill stocker 1147 is housed. The bill insertion slot 1137 shown in FIG. 4 communicates with an insertion slot (an insertion slot of the later-described bill validator 1022) of the bill stocker 1147. The bill stocker 1147 has a function to pull in bills inputted into the bill insertion slot 1137; thereafter, to determine authenticity of the bills; if any of the bills are bogus, to discharge the bogus bills from the bill insertion slot 1137; and if the bills are authentic, to classify the bills according to kinds of the bills and for example, to house the bills. In addition, in a middle portion of the cabinet 1011, a shelf plate member 1149 which partitions inner space of the cabinet 1011 is located. The shelf plate member 1149 is formed of a metallic thin plate.

In FIG. 5, a box A and a box B are indicated by dotted lines, and the PTS main body is located, for example, in a position indicated by each of these boxes in a posture of each of said boxes. The PTS main body has magnets, and in a case where the PTS main body is located in the posture of the box A, the PTS main body is attracted and attached in contact with an upper side of the shelf plate member 1149 by the magnets. At this time, a portion of the upper side of the shelf plate member 1149, which comes in contact with or close to said magnets, is formed of at least a metallic member. On the other hand, in a case where the PTS main body is located in the posture of the box B, the PTS main body is attracted and attached in contact with an inner side face of the cabinet 1011 by the magnets. At this time, a portion of the inner side face of the cabinet 1011, which comes in contact with or close to said magnets, is formed of at least the metallic member. It is to be noted that in FIG. 6, the box A and the box B are not shown.

Figure 6:
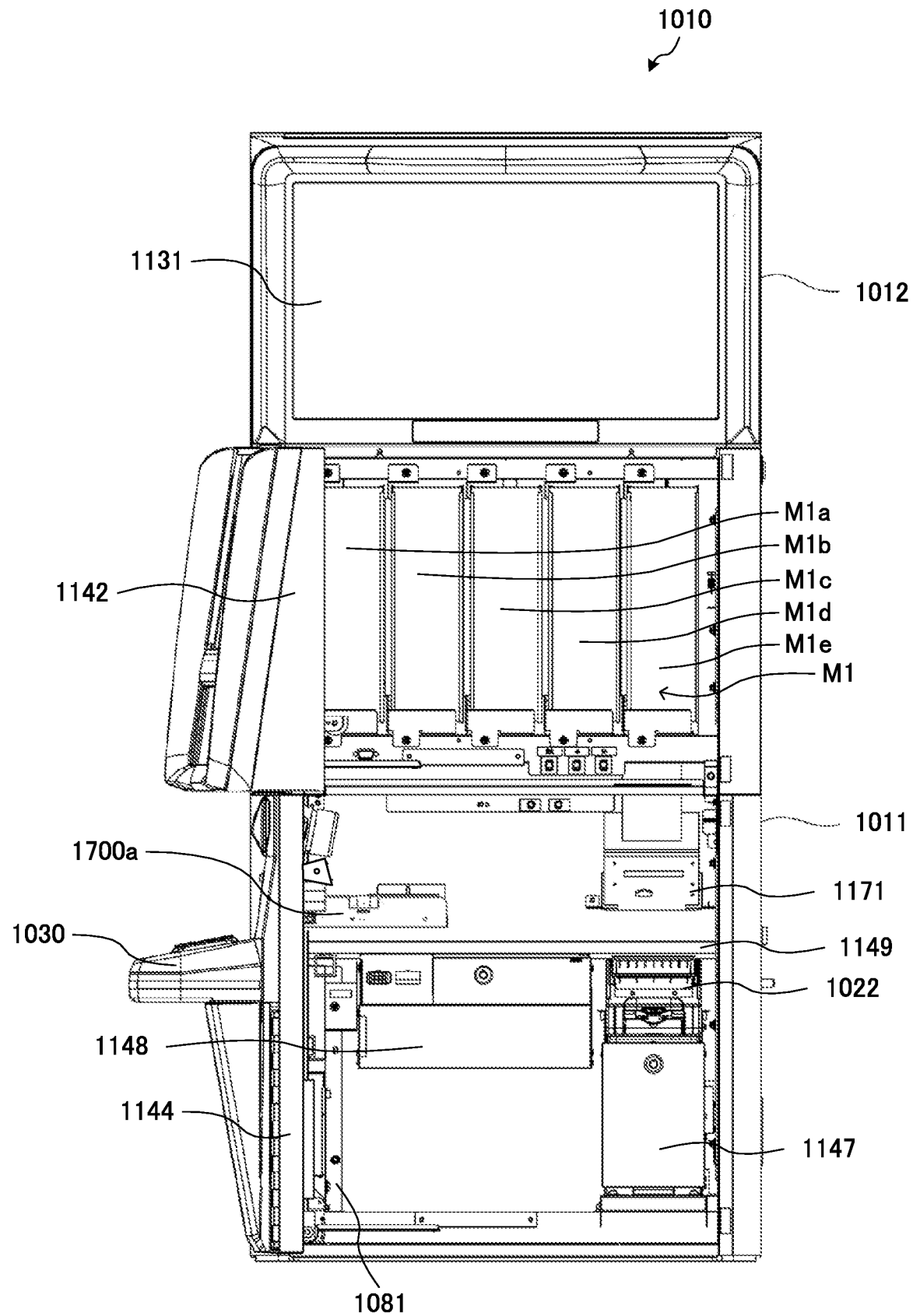
FIG. 6 is a front view illustrating the state in which the upper door and the lower door of the slot machine according to the one embodiment of the present invention are opened.

FIG. 6 is a front view of the slot machine 1010 in the state in which the upper door 1142 and the lower door 1144 are opened. On a front face of the top box 1012, as described above, the upper image display panel 1131 is located.

In an uppermost portion of the cabinet 1011, the reel apparatus M1 is detachably provided. In a middle portion of the lower door 1144, the control panel 1030 is located so as to protrude. On an upper side of the control panel 1030, the PTS front unit 1700*a* is located.

In addition, in a middle portion on a right side of the cabinet 1011, a printer 1171 is supported. The printed matter discharge outlet 1136 shown in FIG. 4 communicates with a discharge outlet of the printer 1171, and when printed matter is outputted from the printer 1171, said printed matter is discharged from the printed matter discharge outlet 1136.

Under the printer 1171 and in a middle portion of the cabinet 1011, the shelf plate member 1149 shown in FIG. 5 is located so as to vertically partition a space of the cabinet 1011.

In a right lower portion of the cabinet 1011, the bill validator 1022 and the bill stocker 1147 for housing bills provided from the bill insertion slot 1137 to the bill validator 1022 are located. In addition, in a left lower portion of the cabinet 1011, a power supply unit 1081 is located.

Further, in a middle portion of the cabinet 1011 and under the shelf plate member 1149, a security cage 1148 having housed therein electrical components and the like, which are highly confidential in particular (for example, the later-described gaming board 1050 and motherboard 1070) is located.

Figure 4:
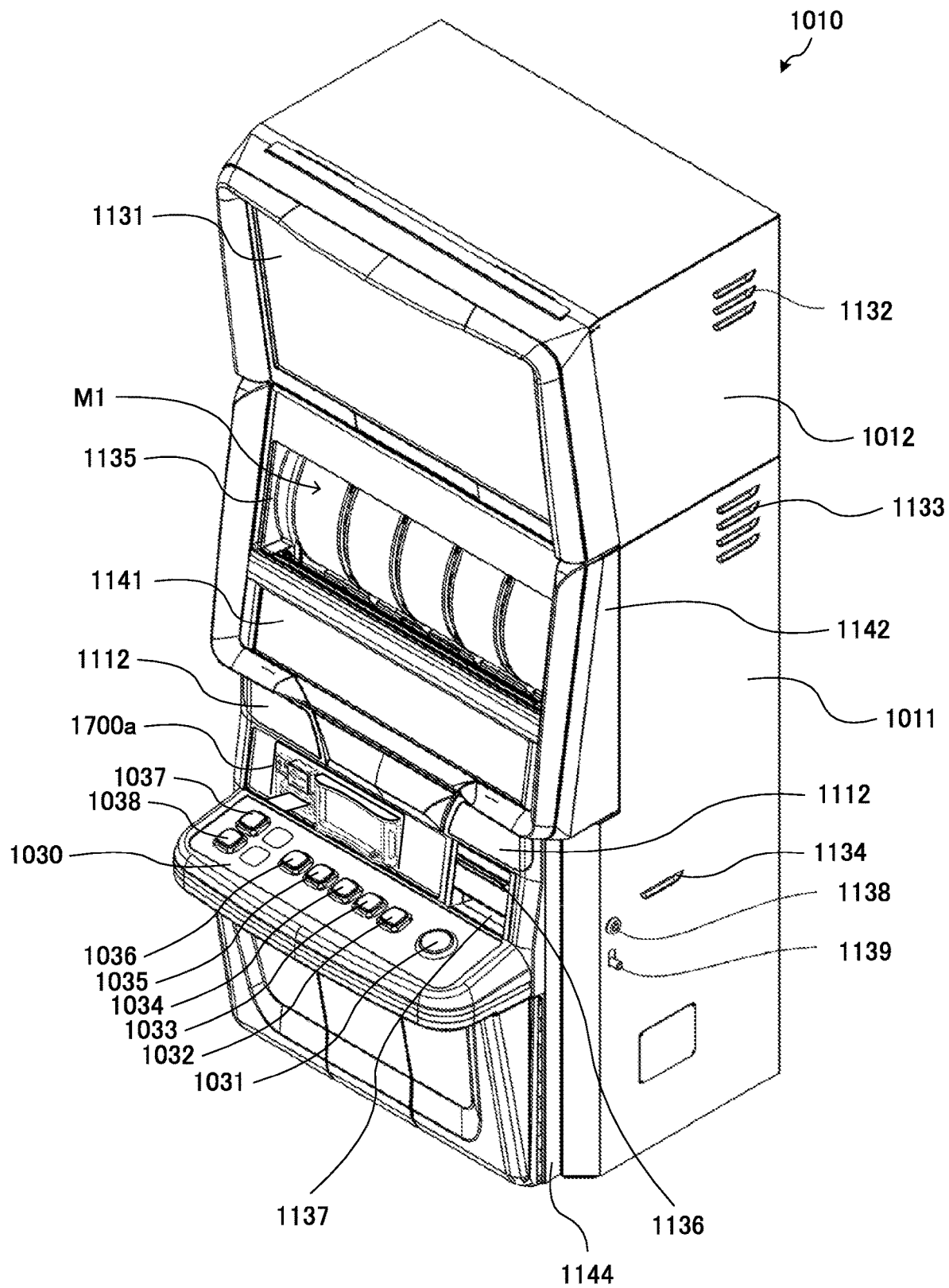
FIG. 4 is a perspective view illustrating an overall structure of the slot machine according to the one embodiment of the present invention.

It is to be noted that although hereinabove, the slot machine 1010 is described as the apparatus having the configuration as shown in FIG. 4 and FIG. 6, a variety of other configurations may be adopted.

[Configuration of PTS Terminal]

Next, a configuration of a PTS terminal 1700 will be described. The PTS terminal 1700 includes a PTS front unit 1700*a* incorporated into a lower door 1144 of a slot machine 1010 and a PTS main body 1700*b* housed inside of a cabinet 1011 of the slot machine 1010. The PTS front unit 1700*a* and the PTS main body 1700*b* are connected by a predetermined network (for example, a predetermined cable). It is to be noted that the PTS terminal 1700 uses a data interface which is commonalized for gaming machines to communicate data and can be thereby incorporated into a variety of types of gaming machines manufactured by a variety of makers.

Figure 7:
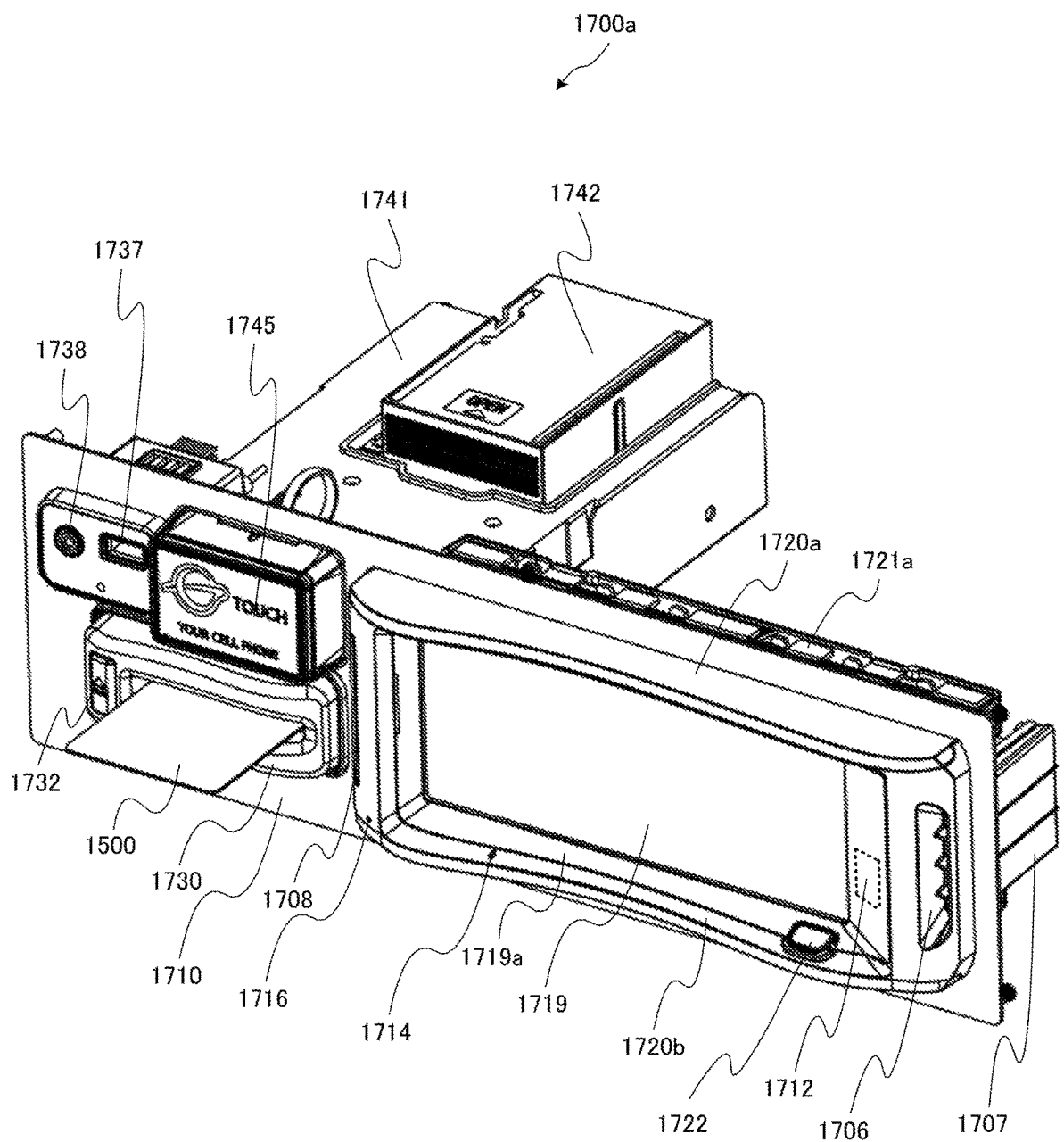
FIG. 7 is a perspective view illustrating a PTS front unit of a PTS terminal incorporated into the slot machine, according to one embodiment of the present invention.

First, with reference to FIG. 7, a configuration of the PTS front unit 1700*a* will be described. FIG. 7 is a diagram illustrating only the PTS front unit 1700*a* shown in FIG. 4 to FIG. 6 in an enlarged manner. As shown in FIG. 7, the PTS front unit 1700*a* has a panel 1710, respective parts located on a front face of the panel 1710 are viewable by a player, and members located on a rear face of the panel 1710 are housed inside of the cabinet 1011 of the slot machine 1010 and are not viewable by a player.

On a right side of the front face of the panel 1710, an LCD 1719 having a touch panel function is provided. The LCD 1719 displays, for example, information related to members and information for members, and a size of a screen thereof is 6.2 inches (approximately 15.7 cm). In addition, around the LCD 1719, an LCD cover 1719*a* is provided. It is to be noted that although in this example, the LCD 1719 is configured to have the touch panel function, instructions issued by a player may be inputted with other input devices such as a keyboard, a mouse, and buttons.

In addition, above the LCD 1719 and the LCD cover 1719*a*, a light emitting plate 1720*a* which is connected to LEDs and emits light is provided. The light emitting plate 1720*a* is formed of, for example, polycarbonate and is connected to a plurality of (for example, seven) full-color LEDs 1721a located on a rear side of the panel 1710 and emits light in accordance with light emitting of the full-color LEDs 1721a.

Below the LCD 1719 and the LCD cover 1719a, similarly, a light emitting plate 1720b which is connected to LEDs and emits light is provided. The light emitting plate 1720b is formed of, for example, polycarbonate and is connected to a plurality of (for example, seven) full-color LEDs 1721b (not shown) located on the rear side of the panel 1710 and emits light in accordance with light emitting of the full-color LEDs 1721b.

In addition, on a right side of the LCD 1719, an image pickup window 1712 is provided, and a human body detection camera 1713 (not shown) located inside of the LCD cover 1719a or on the rear side of the panel 1710 shoots an image of a player via this image pickup window 1712. The image pickup window 1712 may be also formed of, for example, a half mirror material which has undergone shield processing such as smoke processing.

In addition, at a position of the LCD cover 1719a, which is below the LCD 1719 and is on a right side, a home button 1722 is provided. The home button 1722 is a button to shift a screen displayed on the LCD 1719 to a predetermined upper level screen.

Further, at a position of the LCD cover 1719a, which is on the right side of the LCD 1719, a speaker duct 1706 is provided, and in a portion on the rear side of the panel 1710, which corresponds to a position of the speaker duct 1706, a bass reflex type speaker 1707 is provided. Similarly, on a left side of the LCD 1719, a speaker duct 1708 is provided, and in a portion on the rear side of the panel 1710, which corresponds to a position of the speaker duct 1708, a bass reflex type speaker 1709 (not shown) is provided. These speakers are speakers dedicated to the PTS terminal 1700 and are provided separately from the speakers 1112 for a slot machine game provided on the slot machine 1010. These speakers are capable of realizing presentation and a phone call by voice and of outputting notification sound for notifying a player that an IC card 1500 is left unremoved. It is to be noted that since the configuration thereof is made such that sound from the speakers passes through the above-described speaker ducts 1706 and 1708 and is heard in front thereof (on a player side) in a stereophonic manner, the speakers can be installed on the rear side of the panel 1710 and as a result, space-saving of the PTS front unit 1700a (panel face) can be realized.

In addition, at positions of the LCD cover 1719a, which are below the LCD 1719 and are on a left side, a microphone opening part 1714 and a microphone opening part 1716 are provided. In portions corresponding to the microphone opening part 1714 and the microphone opening part 1716 inside of the LCD cover 1719a, microphones 1715 and 1717 (not shown) are provided, respectively.

In a left lower portion of the front face of the panel 1710, a card insertion slot 1730 which allows the IC card 1500 to be inserted thereto and removed therefrom is provided. In a card insertion part of the card insertion slot 1730, full-color LEDs 1731 (not shown) are provided, which are lit up in a plurality of colors, thereby allowing the remaining number of IC cards 1500 stacked in the later-described card stacker 1742 to be notified. At the card insertion slot 1730, an eject button 1732 is provided, and in the vicinity of the eject button 1732, an LED 1733 (not shown) is provided, which is lit up in red, thereby allowing a position and a way of an ejection operation of the eject button 1732 to be found.

In addition, in positions on a rear side of the panel 1710, which correspond to the card insertion slot 1730, a card unit 1741 and the card stacker 1742 are provided, and the card insertion slot 1730 is configured as one part of the card unit 1741. In the card stacker 1742, approximately 30 IC cards 1500 can be retained, and when a player who has newly played a unit game makes settlement of credits, an IC card 1500 retained in the card stacker 1742 is taken out and ejected to the card insertion slot 1730.

For the IC card 1500 taken in from the card insertion slot 1730 and retained in the card unit 1741, upon the settlement of credits, credit information is updated by NFC or the like, and thereafter, the IC card 1500 is ejected from the card insertion slot 1730. While a player is playing a unit game, the IC card 1500 is completely housed inside of the card unit 1741.

In addition, in a case where upon the settlement of credits, in spite of the IC card 1500 left unremoved, absence of a player is detected by the human body detection camera or the like, the configuration may be arranged such that the IC card 1500 can be retained in the card stacker 1742. Thus, for example, even in a case where a player has learned that the remaining number of credits is small and yet has left his or her seat with the IC card 1500 left unremoved or in a case where a player has simply forgotten to remove the IC card 1500 and has left his or her seat, it does not occur that the IC card 1500 is left retained in the card unit 1741 over a long period of time.

In positions on a left upper side of the front face of the panel 1710, a USB terminal 1737 and an audio terminal 1738 are provided. The USB terminal 1737 is configured to allow battery charge or the like by connecting a USB device thereto. In addition, the audio terminal 1738 is, for example, a four-pole terminal, and a headset is inserted thereto, thereby allowing a phone call with other person to be made with the headphones and the microphones. In addition, the audio terminal 1738 may be configured to be a two-pole or three-pole terminal, thereby allowing sound to be listened with the headphones.

On the front face of the panel 1710 and on the left side of the LCD 1719, a touch unit 1745 is provided. The touch unit 1745 includes an RFID module which can function as a writer to write data through data communication to an IC device (for example, a non-contact IC card, a mobile phone and a smartphone, each of which has a communication function by NFC, and the like) including an IC chip and which can function as a reader to read data through the data communication from said IC device. In addition, in four corners of the front face of the touch unit 1745, LEDs 1746 (not shown) are located, respectively. In addition, besides the touch unit 1745 or instead of the touch unit 1745, an information recording medium reading device for reading information stored in an information recording medium such as a magnetic card may be provided. In this case, instead of the IC card 1500, the magnetic card may be a membership card.

As described above, the PTS front unit 1700a according to the present embodiment is formed such that the variety of devices having the microphone function, the camera function, the speaker function, the display function, and the like are integrated into one unit, thus realizing space-saving. In addition, although hereinabove, the PTS front unit 1700a is described as the apparatus having the configuration shown in FIG. 7, the PTS front unit 1700a may be apparatuses having a variety of other configurations.

Figure 8:
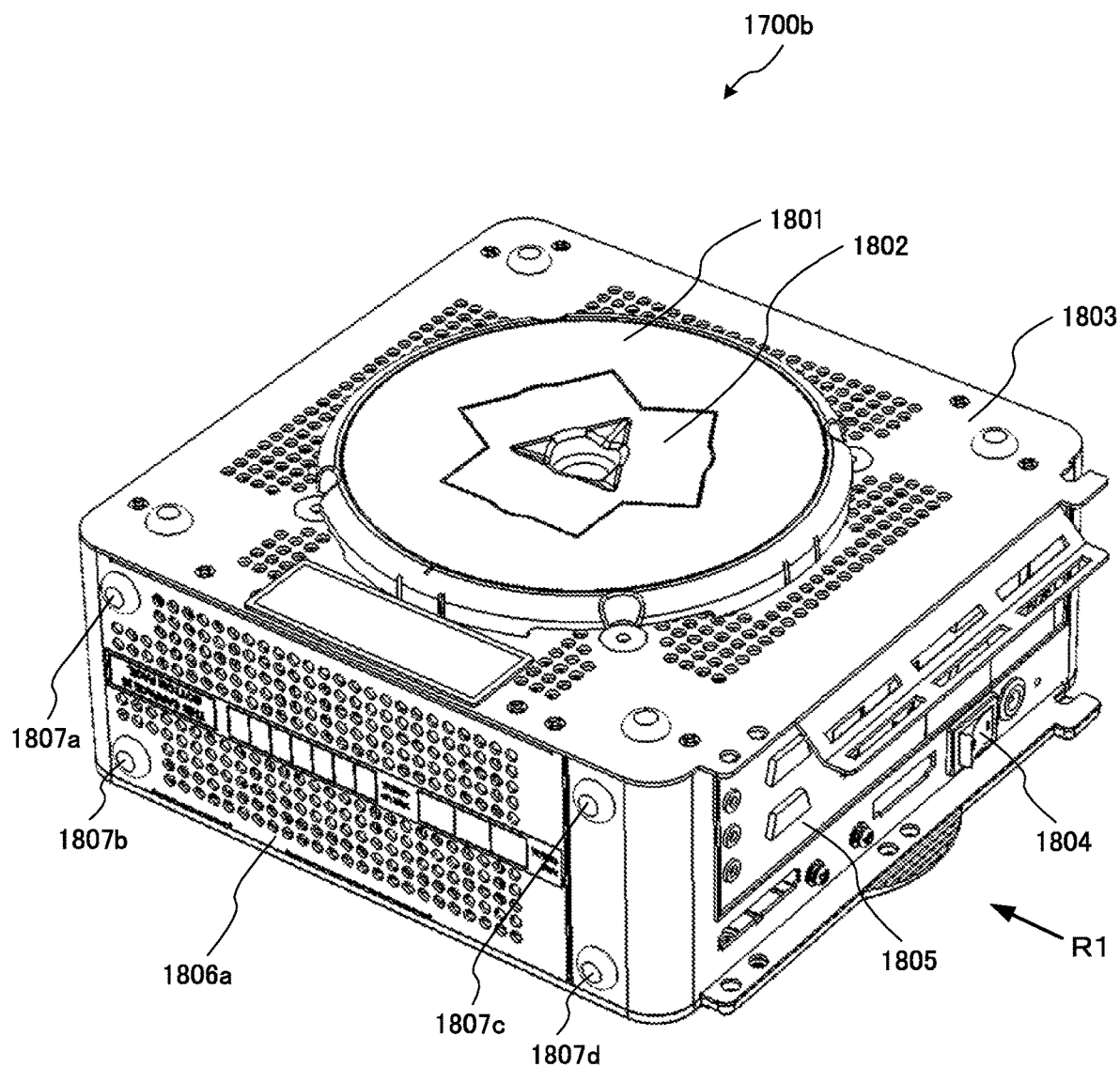
FIG. 8 is a perspective view illustrating a PTS main body of the PTS terminal incorporated into the slot machine, according to one embodiment of the present invention.

Next, with reference to FIG. 8 to FIG. 18, a configuration of the PTS main body 1700b connected to the PTS front unit 1700*a* shown in FIG. 7 and the like will be described. FIG. 8 is a perspective view illustrating external appearance of the PTS main body 1700*b*.

The external appearance of the PTS main body 1700*b* is of a box-shape as shown in FIG. 8 (substantially a cube-shape). Inside thereof, a control part which includes a variety of circuits (refer to the later-described circuit of the PTS main body 1700*b* shown in FIG. 25) is located. This control part is configured to include a motherboard. In addition, a CPU 1751 (refer to FIG. 25) of the PTS main body 1700*b* is, for example, a fanless CPU having heat dissipation fins.

In addition, although as described later, the PTS main body 1700*b* may be housed inside of the cabinet 1011 in any posture, here, a face of an upper side shown in FIG. 8 is defined as a reverse face (bottom face) of the PTS main body 1700*b*. The PTS main body 1700*b* is formed by arranging three side parts and one side face which is a back panel 1805, which are located between a base panel 1803 which is the reverse face and a top cover 1821 (refer to FIG. 14) which is an obverse face facing this base panel 1803. It is to be noted that here, the above-mentioned CPU 1751 is located inside of the PTS main body 1700*b* in proximity to the base panel 1803.

In the base panel 1803, a plurality of ventilation holes are provided. In addition, one side part 1806*a* among the three side parts is configured to include a back cover provided with a plurality of ventilation holes. Each of the other two side parts (a side part 1806*b* and a side part 1806*c* (refer to FIG. 14)) has a back cover provided with a plurality of long and narrow ventilation slits. Further, a back air cover provided with long and narrow ventilation slits, which are located so as to be perpendicular to the ventilation slits of said back cover, is arranged so as to be superposed on the back cover (refer to FIG. 14). The sizes and the configurations of these ventilation holes and ventilation slits are arranged for the heat dissipation of the PTS main body 1700*b*, and at the same time, are suitably designed not to allow easy entering of dust and dirt in the slot machine 1010 into an inside of the PTS main body 1700*b*.

In the back panel 1805, connectors (terminals) for connecting with respective circuits of the PTS front unit 1700*a* are arranged. These connectors are connected by respectively corresponding connectors of the PTS front unit 1700*a* by cables or like, thereby allowing the PTS front unit 1700*a* and the PTS main body 1700*b* to function as the PTS terminal 1700.

In the back panel 1805, a power connector 1805*a* (refer to FIG. 12) to which one end of a power cable provided with a power adapter (for example, an AC adapter) is connected is also arranged. The one end of the power cable is connected to the power connector 1805*a* and the other end of the power cable is connected to a power supply source, thereby allowing power to be supplied to the PTS main body 1700*b* and the PTS front unit 1700*a*. In the present embodiment, the other end of the power cable is connected to a power supply unit 1081 of the slot machine 1010. In addition, in the back panel 1805, a power switch 1804 is arranged.

On the side part 1806*a*, four leg parts 1807*a* to 1807*d* are arranged and in a case where the PTS main body 1700*b* is located with the side part 1806*a* being a bottom face, these leg parts 1807*a* to 1807*d* come in contact with a floor surface.

In the vicinity of the middle of an upper portion of the base panel 1803 of the PTS main body 1700*b*, a magnet cover 1801 is located. In the vicinity of a middle portion of the magnet cover 1801, a projection part 1802 for storing magnets thereinside is provided.

Since the magnet cover 1801 is located so as to protrude from the base panel 1803 and the magnets are provided thereinside, the PTS main body 1700*b* is attached onto the metallic member at this mounting face by an attracting force of said magnet, whereby the PTS main body 1700*b* is held inside of the slot machine 1010. For example, in the present embodiment, the PTS main body 1700*b* is attached (held) onto the reverse face of the cabinet 1011 or the f metallic member inside of the cabinet 1011 by a magnetic force.

Figure 9:
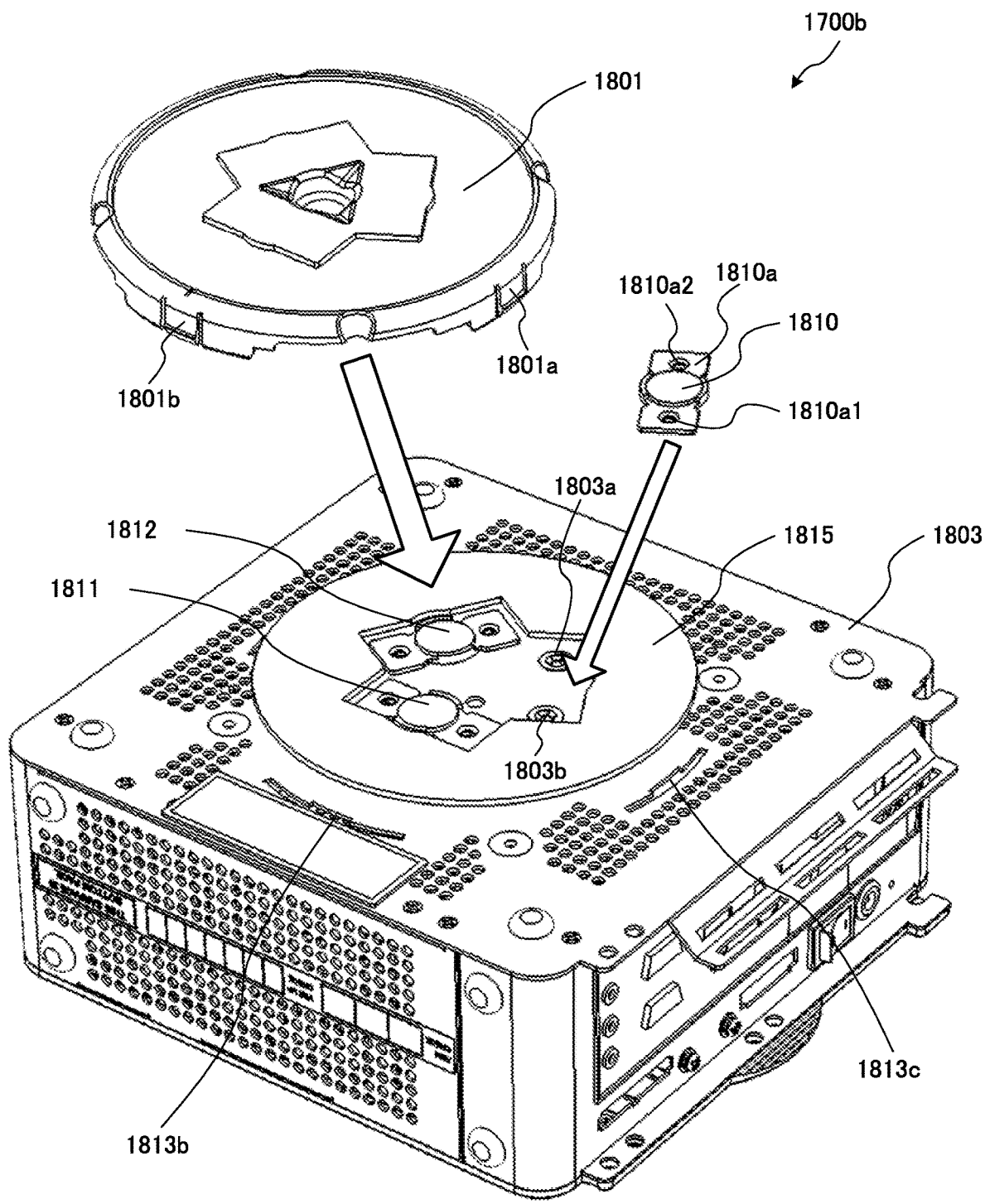
FIG. 9 is an exploded perspective view illustrating the PTS main body of the PTS terminal incorporated into the slot machine according to the one embodiment of the present invention.

FIG. 9 is an exploded perspective view illustrating a state in which the magnet cover 1801 and one part of a magnet 1810 of the PTS main body 1700*b* are detached.

Below the magnet cover 1801, a base stopper 1815 is located. Between the magnet cover 1801 and the base stopper 1815, three magnets (1810, 1811, and 1812) are sandwiched. The magnet 1810 is held in a magnet holder 1810*a* having hole parts (1810*a*1 and 1810*a*2) on the right and the left of the magnet. The base panel 1803 is provided with hole parts 1803*a* and 1803*b* in positions which correspond to the hole parts 1810*a*1 and 1810*a*2. It is to be noted that the above-described relationship among the magnet, the magnet holder, and the base panel 1803 is the same as that of each of the other magnets (that is, the magnets 1811 and 1812).

Figure 11:
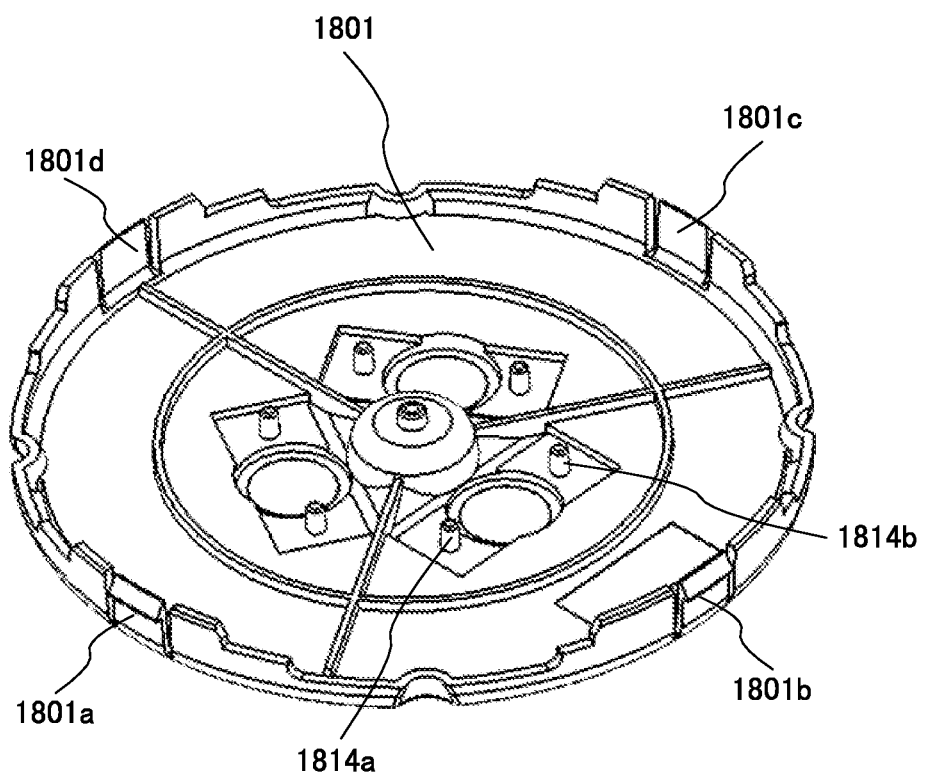
FIG. 11 is a perspective view illustrating a reverse face of a magnet holder of the PTS main body according to the one embodiment of the present invention.

When the magnet cover 1801 is placed on the base panel 1803, projection parts (projection parts (1814*a* and 1814*b*) shown in FIG. 11) provided on a reverse face of the magnet cover 1801 respectively penetrate through the hole parts 1810*a*1 and 1810*a*2 of the magnet holder 1810*a* and are inserted into the hole parts 1803*a* and 1803*b* of the base panel 1803, whereby the magnet 1810 is held in the PTS main body 1700*b*. It is to be noted that the above-described way of holding the magnet is the same as that of holding each of the other magnets (that is, the magnets 1811 and 1812).

Figure 10:
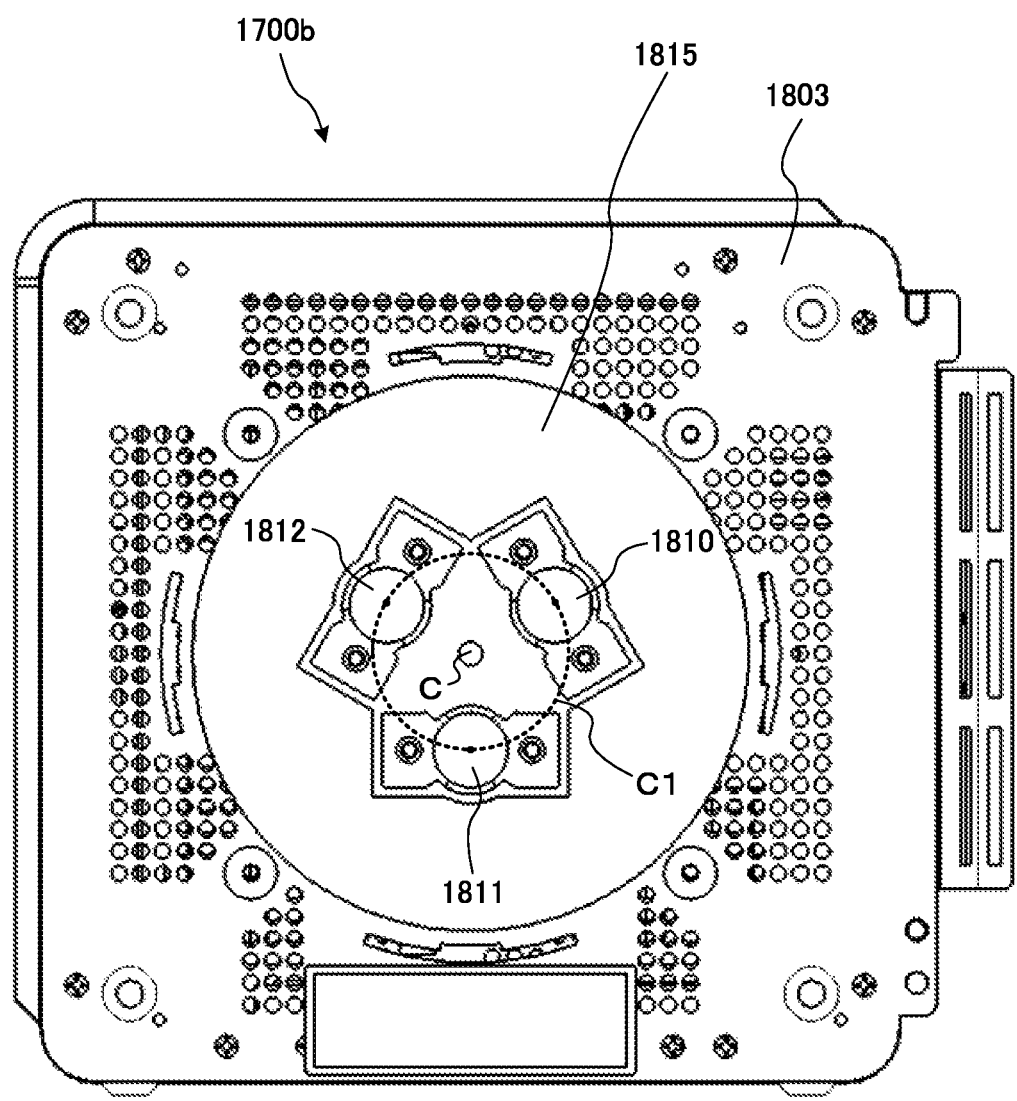
FIG. 10 is a bottom view illustrating a reverse face of the PTS main body according to the one embodiment of the present invention in a state in which a magnet cover is detached.

FIG. 10 is a bottom view illustrating a reverse face (that is, a bottom face) of the PTS main body 1700*b* in a state in which the magnet cover 1801 is detached. In the base stopper 1815 located on the base panel 1803, the three magnets (1810, 1811, and 1812) are located so as to be concentrated in a central protruding portion.

Since the magnets are located in the central circular protruding portion, when the PTS main body 1700*b* is arranged inside of the housing of the slot machine 1010, it is made easy for the PTS main body 1700*b* to be in a stable state in terms of the center of gravity and balance. In addition, it is made easy for a surface in contact with a place where the PTS main body 1700*b* is arranged inside of the housing of the slot machine 1010 to be provided in a continuous and wide manner, whereby its friction resistance causes displacement thereof to hardly occur.

In addition, as is seen from FIG. 10, these three magnets are respectively arranged in a concentric and equally spaced manner, with the centers of the magnets being located along a circle C1, indicated by a dotted line, whose center is a center C of the circular protruding portion (this center is also the center of the base stopper 1815 and is substantially the center of the base panel 1803 constituting the reverse face of the PTS main body 1700*b*).

The above-described arrangement of the magnets allows the PTS main body 1700*b* to be easily detached by a substantially even force from anywhere (for example, by hooking even any of four corners of the PTS main body 1700*b* which is of the box-shape).

FIG. 11 is a diagram illustrating the magnet cover 1801 with the reverse face thereof facing upward. As shown in FIG. 11, the magnet cover 1801 is held in the PTS main body 1700b by fitting four groove insertion projection parts (1801a to 1801d) into four groove parts of the base panel 1803, respectively. An outer peripheral portion of the magnet cover 1801 provided with the four insertion projection parts (1801a to 1801d) is formed of, for example, resin such as plastic. In addition, the central portion surrounded by the outer peripheral portion of the magnet cover 1801 may be formed of metal or may be formed of resin such as plastic. It is to be noted that in FIG. 9, only two groove parts (1813b and 1813c) among the four groove parts of the base panel 1803 are shown.

In the present embodiment, as described above, the configuration is arranged such that the three magnets (1810, 1811, and 1812) are sandwiched between the magnet cover 1801 and the base stopper 1815. However, as the way of holding the magnets in the portion protruding from one face of the PTS main body 1700b, other various ways can be employed.

Here, the magnets (1810, 1811, and 1812) are, for example, magnet catches constituted of neodymium magnets.

Figure 12:
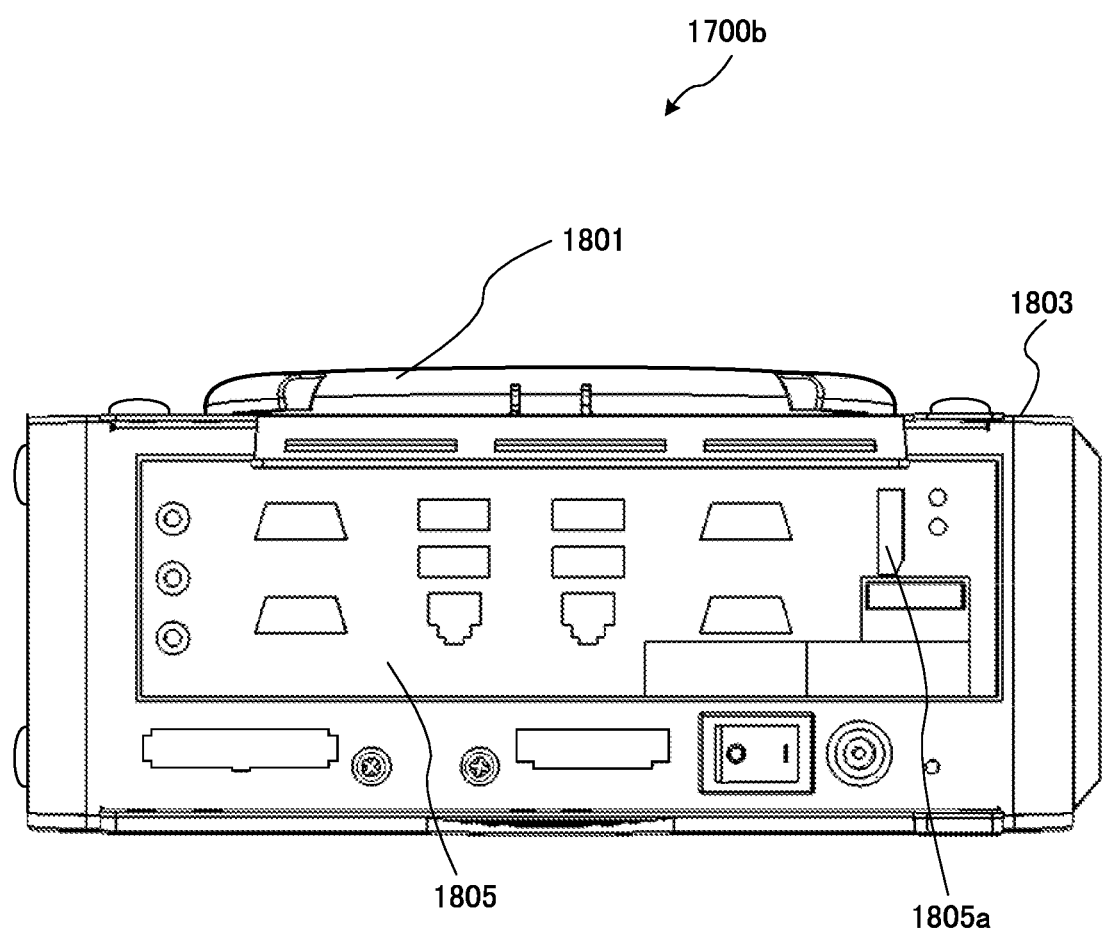
FIG. 12 is a side view of the PTS main body according to the one embodiment of the present invention.

FIG. 12 is a side view in which the PTS main body 1700b is viewed from a direction of R1 in FIG. 8 and the back panel 1805 is shown so as to face forward. As shown in FIG. 12, the magnet cover 1801 is located in a state in which the magnet cover 1801 protrudes from the face of the base panel 1803. Inside of an uppermost portion of the magnet cover 1801, as described above, the three magnets (1810, 1811, and 1812) are arranged.

Through the above-described configuration of the PTS main body 1700b, the PTS main body 1700b comes in contact with a surface of the metallic member in the uppermost portion of the magnet cover 1801 and is located (that is, held) inside of the housing of the gaming machine by the magnetic force of the three magnets (1810, 1811, and 1812). Accordingly, the PTS main body 1700b can be held inside of the cabinet 1011 or onto other metallic members regardless of postures of the PTS main body 1700b.

FIG. 13 shows a state in which the PTS main body 1700b is located on a metallic member 1817. It is to be noted that in FIG. 13, a posture of the PTS main body 1700b is different from the posture thereof shown in FIG. 8 to FIG. 12, with the face of the base panel 1803 facing downward (that is, with the reverse face (bottom face) of the PTS main body 1700b facing downward).

Figure 13A:
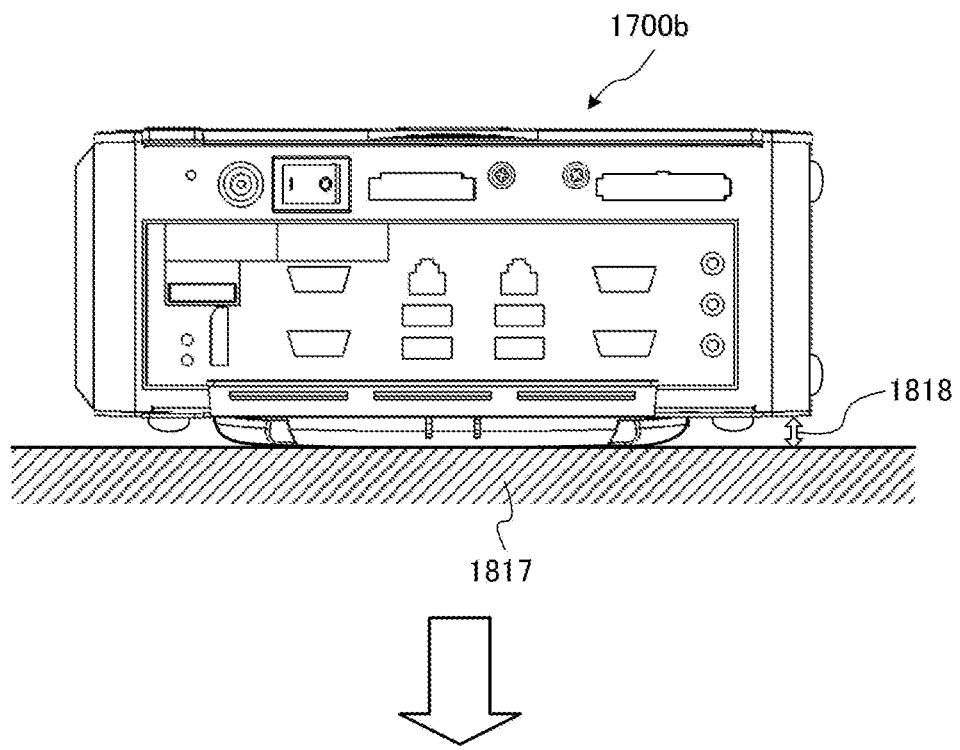
FIGS. 13A and 13B are diagrams for describing a state in which the PTS main body according to the one embodiment of the present invention is detached from the slot machine.
Figure 13B:
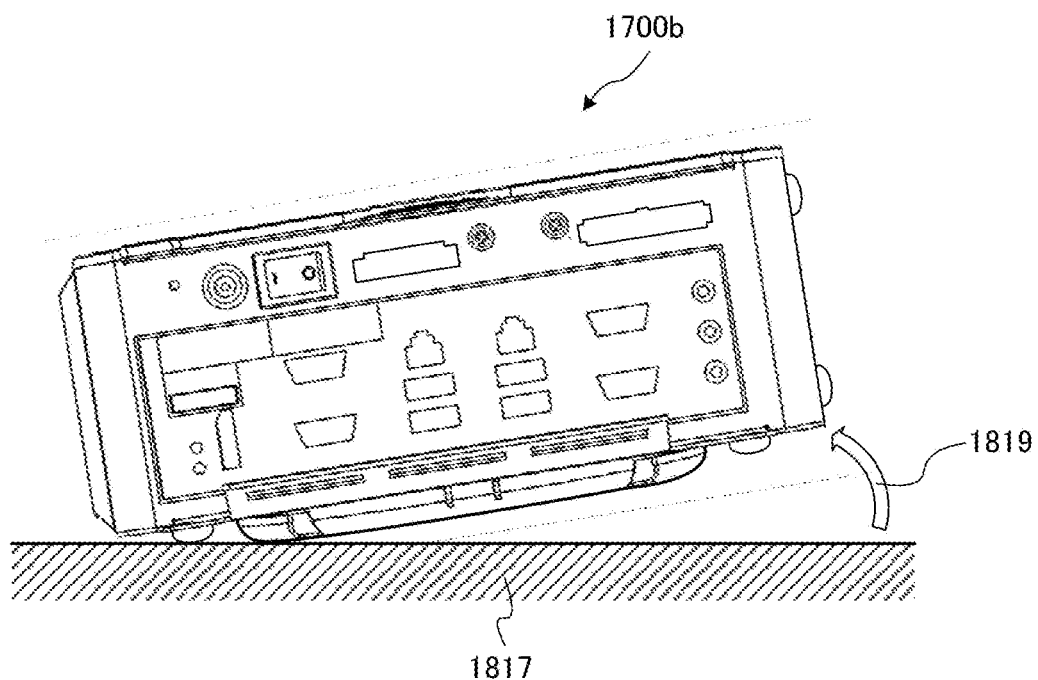

In FIG. 13A, the PTS main body 1700b is attached onto an obverse face of the metallic member 1817 by the magnetic force of the three magnets (1810, 1811, and 1812). Since in the present embodiment, the magnet cover 1801 forms the projection part in the vicinity of the central portion of the base panel 1803, as shown in FIG. 13A, in a state in which the PTS main body 1700b is attached thereonto, a gap enough to allow, for example, a human finger to enter therethrough is present between a peripheral portion of the base panel 1803 and the metallic member 1817 as indicated by an arrow 1818, and further, between the attracting portions by the powerful magnetic force and the point of action (the position of the finger), a certain distance results. Therefore, action of attaching or detaching the PTS main body 1700b into or from the slot machine 1010 or of changing the position where the PTS main body 1700b is located can be easily performed (see an arrow 1819 shown in FIG. 13B), thereby leading to enhancement in maintainability.

In addition, since the space indicated by the arrow 1818 is ensured, heat dissipation from the plurality of ventilation holes (refer to FIG. 8) provided in the base panel 1803 is effectively conducted. In particular, in the present embodiment, since the CPU 1751 is located in proximity to the base panel 1803, the above-described configuration allows more effective heat dissipation to be conducted.

In addition, as described above, since the magnets are located in the central protruding portion, when the PTS main body 1700b is located inside of the housing of the slot machine 1010, it is made easy for the PTS main body 1700b to be in a stable state in terms of the center of gravity and balance. In addition, it is made easy for a face in contact with a place where the PTS main body 1700b is located inside of the housing of the slot machine 1010 to be provided in a continuous and wide manner, whereby its friction resistance causes displacement thereof to hardly occur.

Further, since the magnets are located in the concentric and evenly spaced manner in the central circular protruding portion, the PTS main body 1700b can be easily detached by the substantially even force from anywhere (for example, by hooking even any of the four corners of the PTS main body 1700b which is of the box-shape).

As to the positions of the magnet in the PTS main body 1700b, the above-described arrangement is preferable. However, the plurality of magnets can also be arranged so as to protrude in the peripheral portion of the base panel 1803. In addition, at this time, large distances among the magnets can also be taken so as to provide a gap enough to allow a finger to enter between the peripheral portion of the base panel 1803 and the obverse face of the metallic member 1817.

Figure 14:
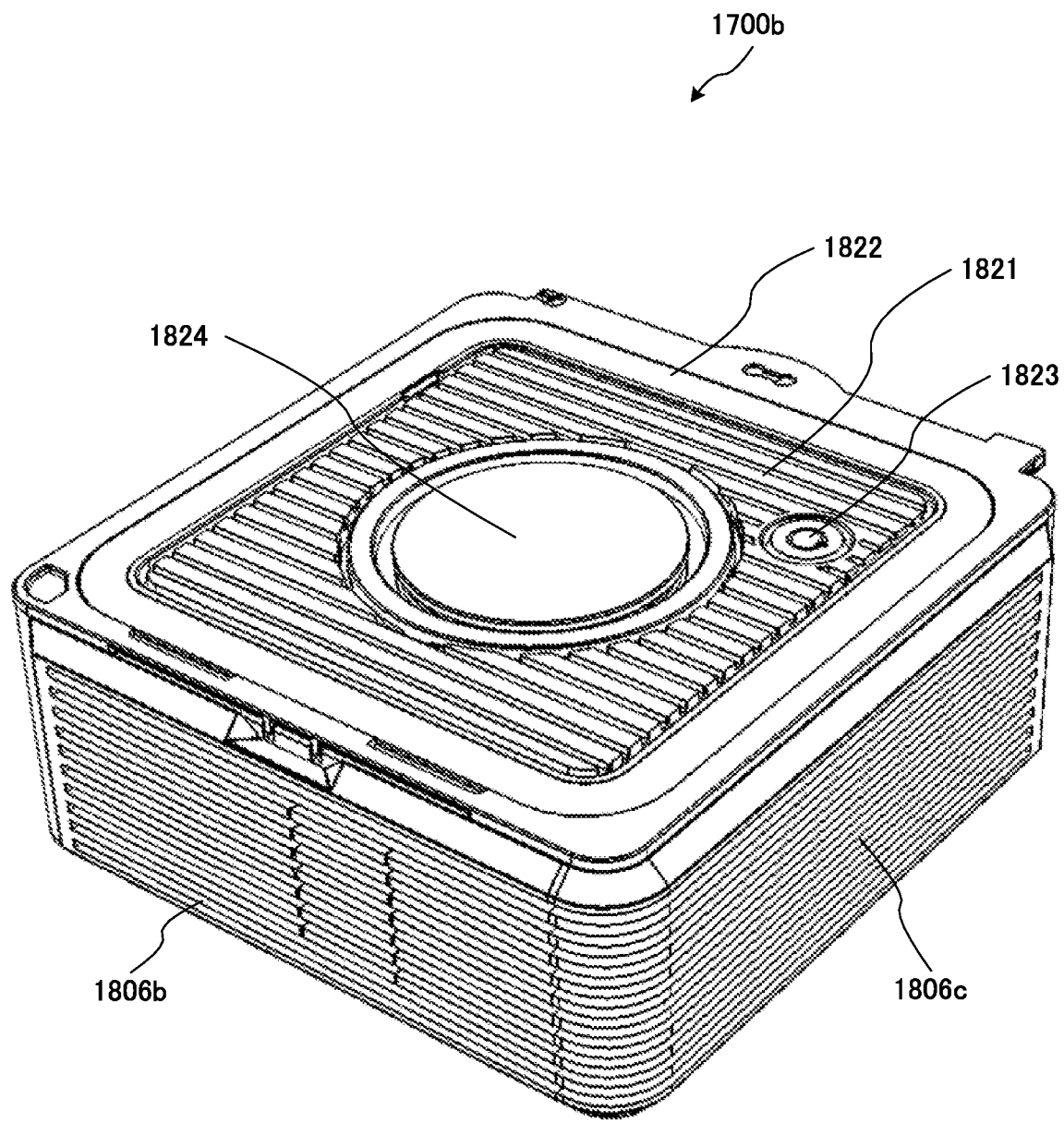
FIG. 14 is a perspective view illustrating the PTS main body of the PTS terminal incorporated into the slot machine according to the one embodiment of the present invention.

FIG. 14 is a perspective view in which an obverse face (upper face) of the PTS main body 1700b faces upward. The side part 1806b and the side part 1806c of the PTS main body 1700b are shown, and on the obverse face, the top cover 1821 and a top cover guard 1822 are located. The central portion of the top cover 1821 is formed of, for example, resin such as plastic, the top cover 1821 is partially provided with slits for heat dissipation. The sizes and configurations of these slits are, as with those in the base panel 1803 and the side parts (1806a to 1806c), designed not to allow easy entering of dust and dirt in the slot machine 1010 into an inside of the PTS main body 1700b.

In addition, on the right side of the top cover 1821, a key cylinder 1823 for opening the top cover 1821 is located, and in the vicinity of the central portion of the top cover 1821, a circular top plate 1824 is located.

Figure 15:
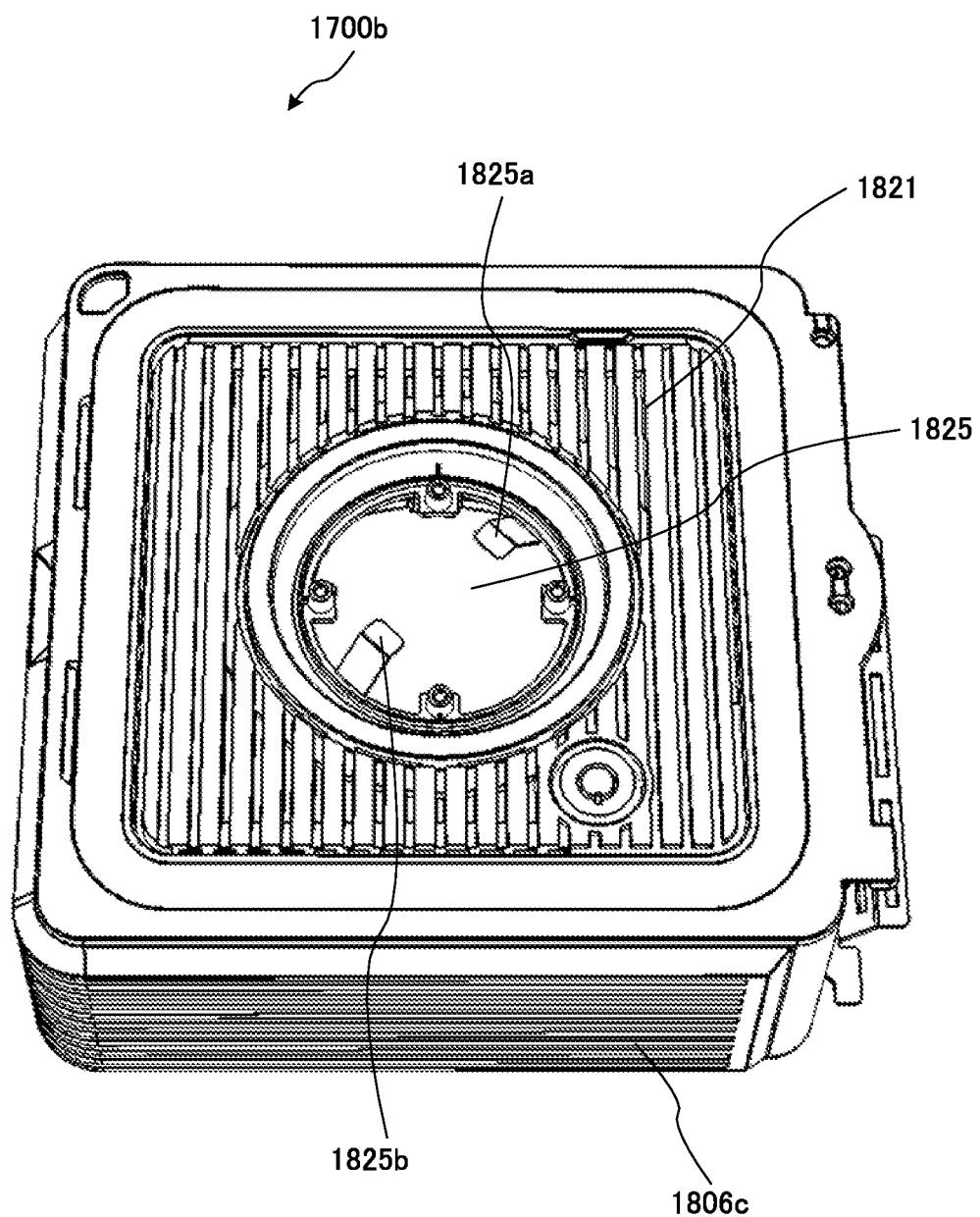
FIG. 15 is a perspective view illustrating the PTS main body of the PTS terminal incorporated into the slot machine according to the one embodiment of the present invention.

FIG. 15 shows a state in which in the PTS main body 1700b shown in FIG. 14, the top plate 1824 and a base plate (not shown) are detached. After detaching the top plate 1824 and the base plate, in the vicinity of the central portion of the top cover 1821, a circular opening part 1825 appears. From an outer periphery of the opening part 1825, two ground plates 1825a and 1825b extend upward, and when the base plate is returned to the original position, the ground plates 1825a and 1825b come in contact with the base plate.

Figure 16:
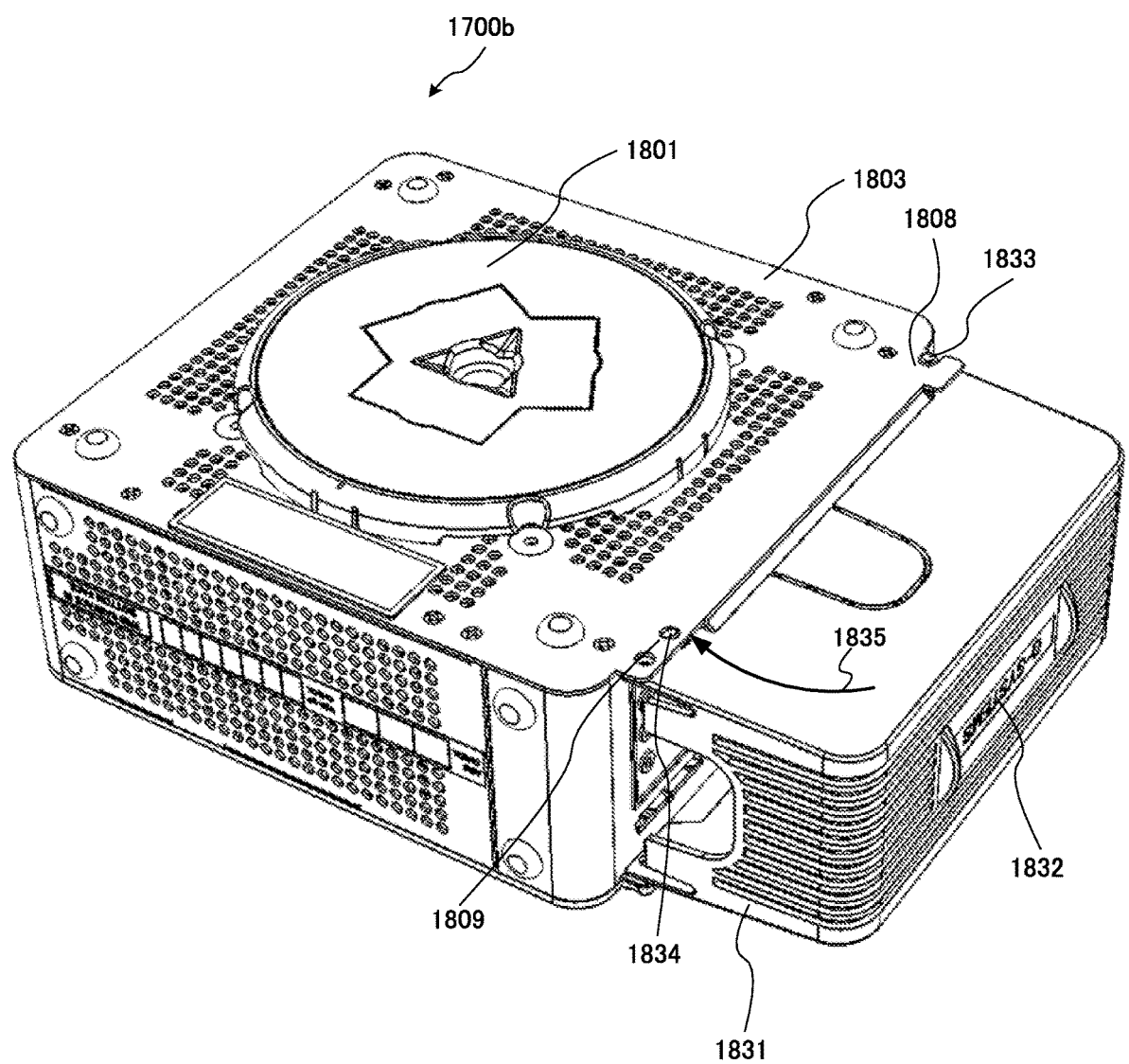
FIG. 16 is a perspective view illustrating the PTS main body of the PTS terminal and a cable cover, incorporated into the slot machine according to the one embodiment of the present invention.

FIG. 16 shows a state in which a cable cover 1831 is attached onto the PTS main body 1700b. The PTS main body 1700b is in a posture in which the base panel 1803 faces upward, as with that shown in FIG. 8, and in the vicinity of the central portion of the base panel 1803, the magnet cover 1801 is located. The cable cover 1831 is to house cables together, which are connected to the respective connectors located on the back panel 1805. It is to be noted that in FIG. 16, the respective kinds of cable are not shown.

In the present embodiment, the cable cover 1831 has upper and lower rotating shaft parts 1833, respectively. In a state in which the rotating shaft parts 1833 are fitted into bearing parts 1808 (of the base panel 1803 and the top cover 1821) to which the rotating shaft parts 1833 correspond, with the rotating shaft parts 1833 being a rotating axis, the other end of the cable cover 1831 is rotated toward the PTS main body 1700*b* (in a direction indicated by an arrow 1835), and projection parts 1834 of the cable cover 1831 are fitted into hole parts 1809 (of the base panel 1803 and the top cover 1821), whereby the cable cover 1831 is attached onto the PTS main body 1700*b*.

The cable cover 1831 is also provided with slits for heat dissipation. In addition, the cable cover 1831 is provided with a fixture holding region 1832 for holding the later described power adapter fixture. In the fixture holding region 1832, for example, a magnet sheet is arranged to attract metallic members and magnets. In addition, the configuration may be arranged such that in the fixture holding region 1832 or on the periphery or the back side of the fixture holding region 1832, metallic members are located, thereby attracting the magnets.

Figure 17:
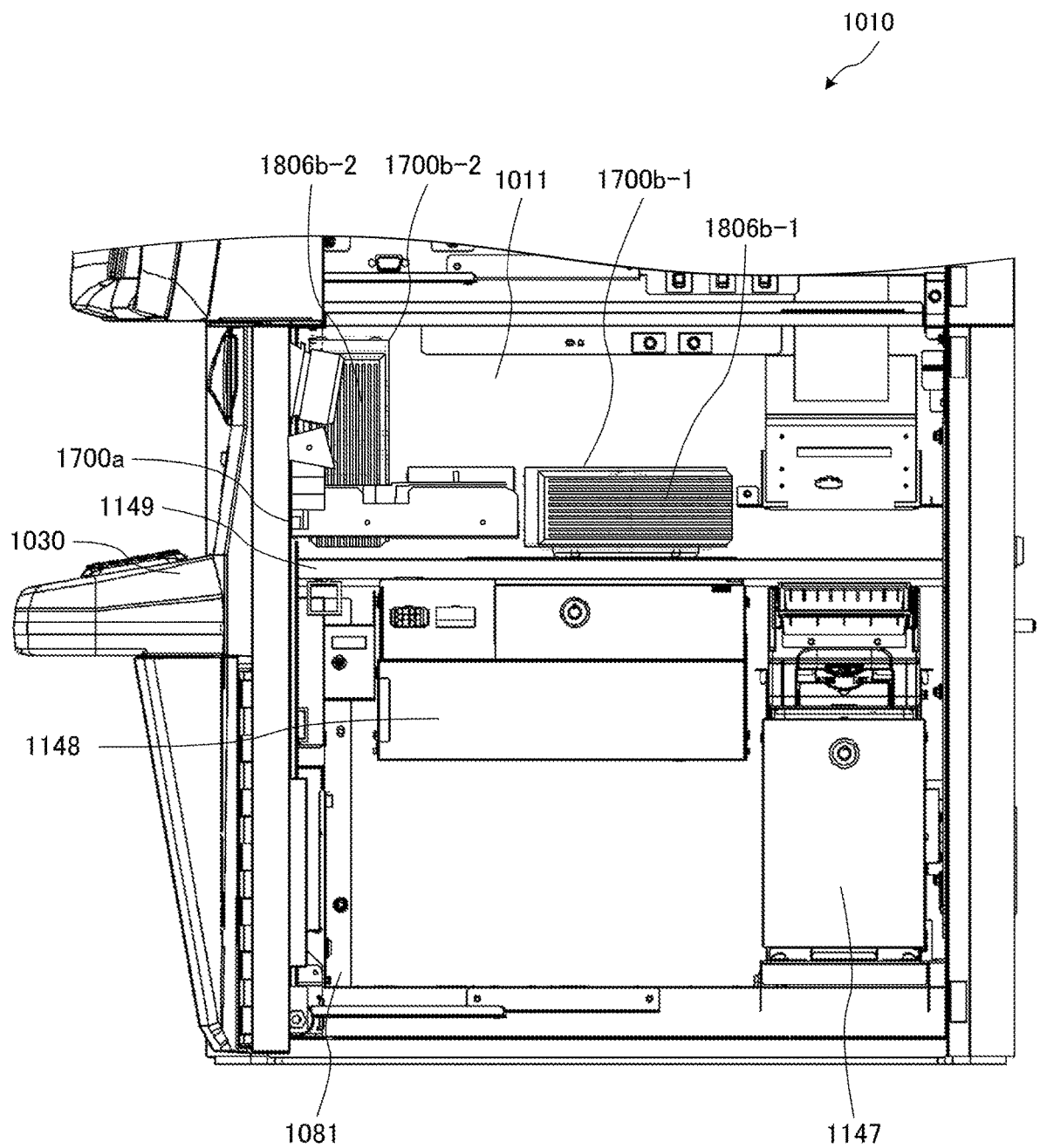
FIG. 17 is a diagram exemplifying a plurality of patterns, in each of which the PTS main body is housed inside of the slot machine according to the one embodiment of the present invention.

FIG. 17 exemplifies two representative patterns, in each of which the PTS main body 1700*b* is attached inside of the slot machine 1010. It is to be noted that in FIG. 17, respective kinds of cables connecting the PTS front unit 1700*a* and the PTS main body 1700*b* are not shown.

As to the slot machine 1010 shown in FIG. 17, the cabinet 1011 of the slot machine 1010 with the upper door 1142 and the lower door 1144 being opened shown in FIG. 6 is partially illustrated.

A PTS main body 1700*b*-1 is attached on the shelf plate member 1149 by the magnetic force of the three magnets (1810, 1811, and 1812) in a state in which the magnet cover 1801 is in contact with a metallic plate member of an upper side of the shelf plate member 1149. On the front side, a side part 1806*b*-1 corresponding to the side part 1806*b* of the PTS main body 1700*b* appears. The above-mentioned attaching position of the PTS main body 1700*b*-1 corresponds to the position of the box A shown in FIG. 5.

A PTS main body 1700*b*-2 is attached on a left side of the cabinet 1011 of the slot machine 1010 by the magnetic force of the three magnets (1810, 1811, and 1812) in a state in which the magnet cover 1801 is in contact with a side part metallic plate member on an inner side of the cabinet 1011. On the front, a side part 1806*b*-2 corresponding to the side part 1806*b* of the PTS main body 1700*b* appears. The above-mentioned attaching position of the PTS main body 1700*b*-2 corresponds to the position of the box B shown in FIG. 5.

Figure 18:
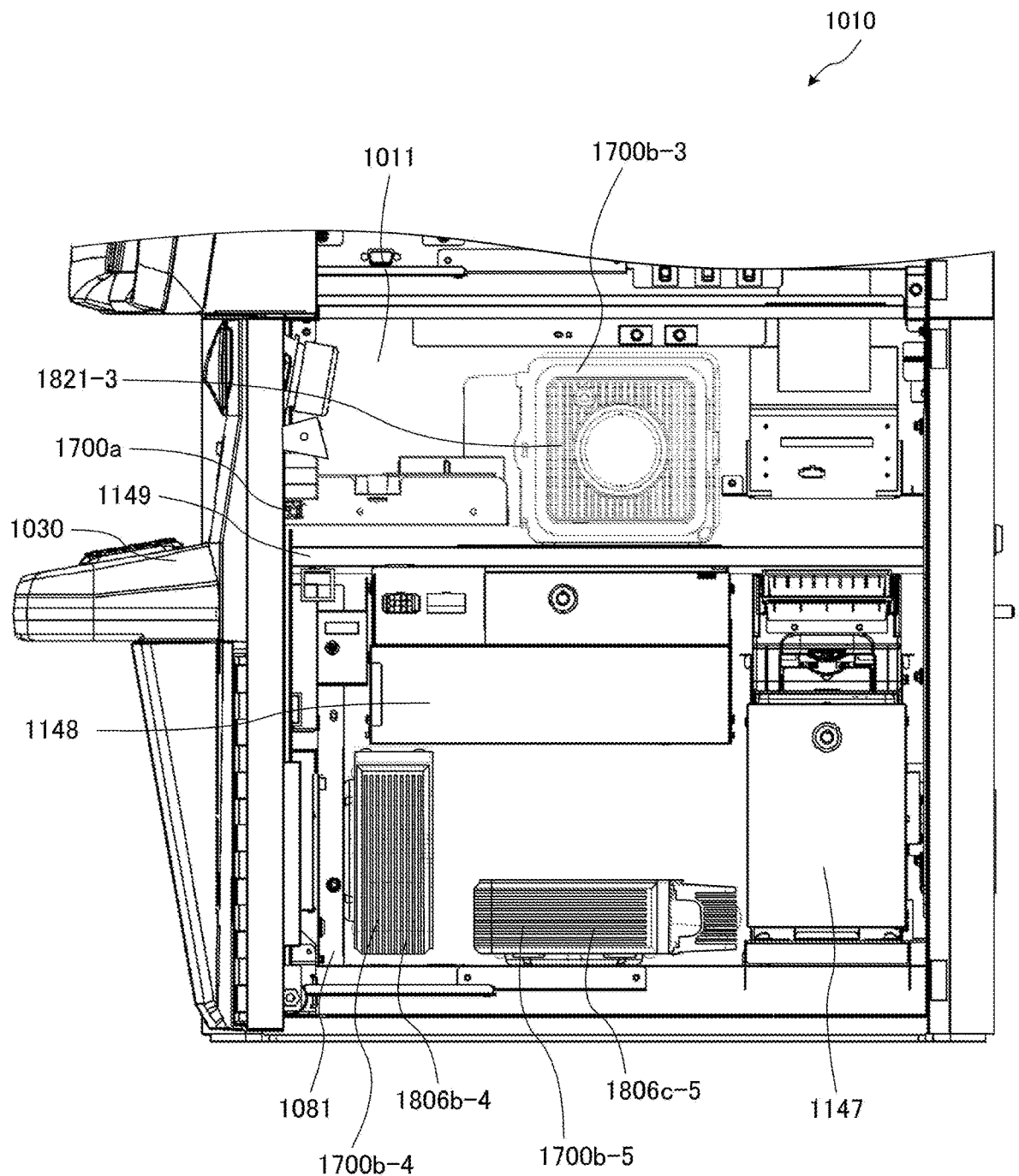
FIG. 18 is a diagram exemplifying a plurality of patterns, in each of which the PTS main body is housed inside of the slot machine according to the one embodiment of the present invention.

FIG. 18 exemplifies further other three representative patterns, in each of which the PTS main body 1700*b* is attached inside of the slot machine 1010. It is to be noted that in FIG. 18, respective kinds of cables connecting the PTS front unit 1700*a* and the PTS main body 1700*b* are not shown.

In FIG. 18, the cabinet 1011 of the slot machine 1010 with the upper door 1142 and the lower door 1144 being opened shown in FIG. 6 is partially illustrated.

A PTS main body 1700*b*-3 is attached on the shelf plate member 1149 by the magnetic force of the three magnets (1810, 1811, and 1812) in a state in which the magnet cover 1801 is in contact with a metallic plate member of a back face of the cabinet 1011. On the front side, a top cover 1821-3 corresponding to the top cover 1821 of the PTS main body 1700*b* appears.

A PTS main body 1700*b*-4 is attached below a security cage 1148 by the magnetic force of the three magnets (1810, 1811, and 1812) in a state in which the magnet cover 1801 is in contact with a side part metallic plate member of the power supply unit 1081. On the front side, a side part 1806*b*-4 corresponding to the side part 1806*b* of the PTS main body 1700*b* appears.

A PTS main body 1700*b*-5 is attached below the security cage 1148 and on a left side of a bill stocker 1147 by the magnetic force of the three magnets (1810, 1811, and 1812) in a state in which the magnet cover 1801 is in contact with a metallic plate member of a bottom face of the cabinet 1011. On the front side, a side part 1806*c*-5 corresponding to the side part 1806*c* of the PTS main body 1700*b* appears.

In addition thereto, though not shown, also considered is a pattern in which the PTS main body 1700*b* is hung from above in a state in which the magnet cover 1801 is in contact with a metallic plate member of a bottom face of the security cage 1148.

As shown in FIG. 17 and FIG. 18, the PTS main body 1700*b* can be located in various positions and in various postures. However, each of the patterns shown in FIG. 17 and FIG. 18 is merely one example. As long as there is a space where the PTS main body 1700*b* is housed inside of the slot machine 1010, various other housing patterns can be considered. It is to be noted that although in FIG. 17, the PTS main body 1700*b* is housed inside of the slot machine 1010 in the state in which the cable cover 1831 is detached and in FIG. 18, the PTS main body 1700*b* is housed inside of the slot machine 1010 in the state in which the cable cover 1831 is attached, the selection of the attachment or the detachment of the cable cover 1831 can be made as needed.

In addition, in each of the examples shown in FIG. 17 and FIG. 18, the PTS main body 1700*b* is located inside of the cabinet 1011. However, in various positions inside of the housing of the slot machine 1010, which includes a position of the top box 1012, the PTS main body 1700*b* can be located. It is to be noted that in a case where a video reel type reel apparatus, instead of the mechanical reel type reel apparatus M1 as in the present embodiment, is adopted in the slot machine 1010, the reel apparatus M1 is not needed and the PTS main body 1700*b* can be located also in the position where the reel apparatus M1 is housed (that is, in an upper portion of the cabinet 1011).

Through the above-described configuration of the PTS main body 1700*b*, the attachment and detachment of the PTS main body 1700*b* can be easily performed. As a result, work such as the installation of the PTS main body 1700*b* and changing of the position of the installation thereof can be easily conducted, thereby remarkably enhancing maintainability. In addition, the upper face, the bottom face, and the side parts of the PTS main body 1700*b* are provided with the ventilation holes and the slits, and the configuration thereof is arranged such that the ventilation and the heat dissipation are considered and at the same time, intrusion of the dust and dirt is also considered.

In addition, the CPU 1751 is located in proximity to the base panel 1803 on which the magnet cover 1801 constituting the contact face with the metallic plate member is located, and the magnet cover 1801 is configured as the protruding portion. Therefore, the heat generated by the CPU 1751 can be effectively dissipated via the metallic plate member and the space.

As described above, the PTS main body 1700*b* is attached onto the metallic member inside of the housing of the slot machine 1010 by the attachment part (that is, the protruding portion including the magnet cover 1801 and the magnets (1810, 1811, and 1812)) formed as the protruding portion of the supporting part (that is, like the base panel 1803, one part of the box shape) of the PTS main body 1700*b*. However, said attachment part can be configured in various forms. For example, the magnets may be located so as to be exposed on an obverse face of the attachment part. In addition, the magnets may be held by various ways other than the way of the configuration in which the magnets are sandwiched between the magnet cover 1801 and the base stopper 1815 as in the present embodiment. In addition, in the present embodiment, the three magnets are located in the central portion of the magnet cover 1801. However, in consideration of a size and a weight of the PTS main body 1700b, a number of the magnets, kinds thereof, a size, an arrangement position, and the like can be suitably designed.

Figure 19:
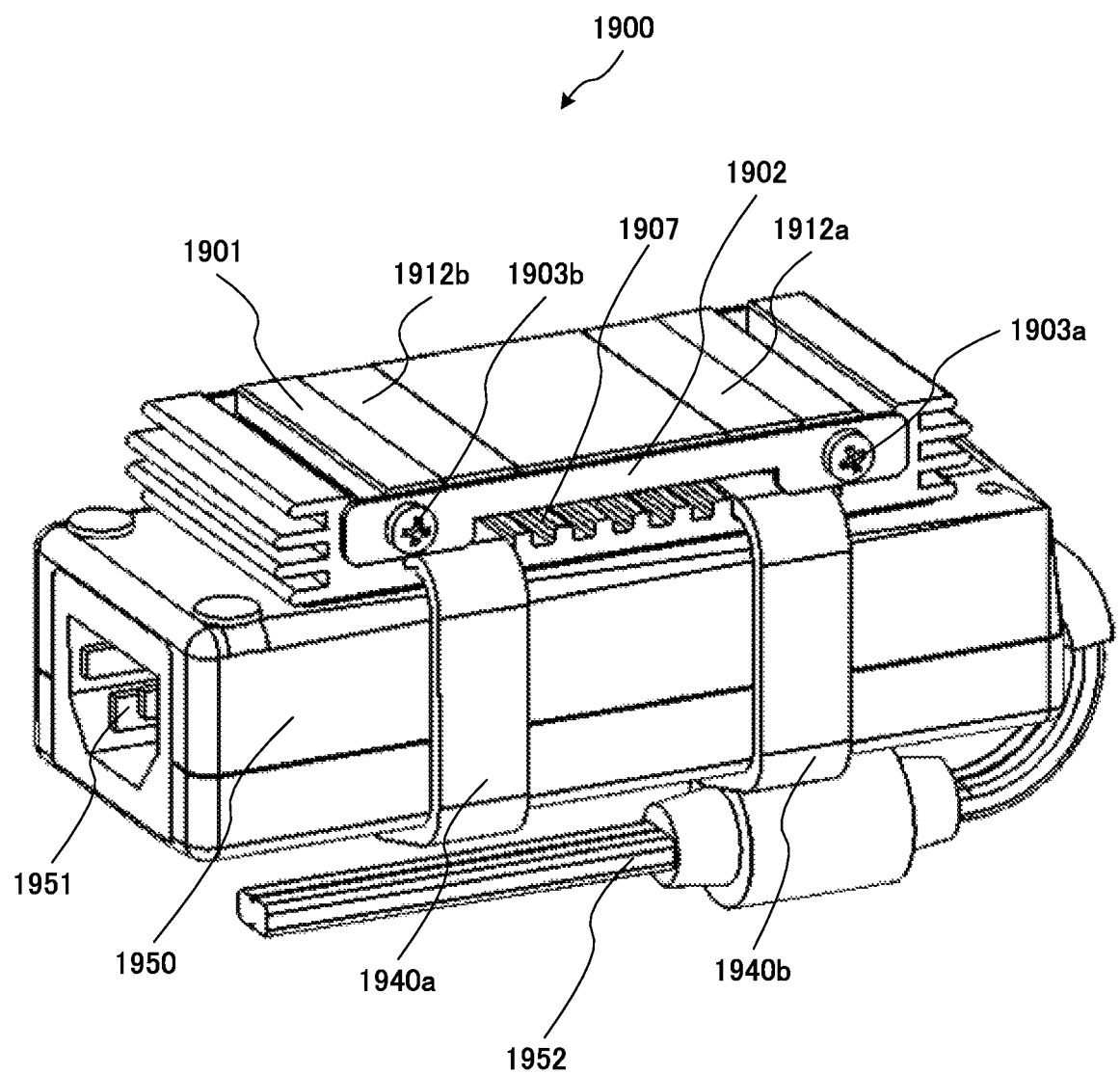
FIG. 19 is a perspective view illustrating a power adapter and a power adapter fixture of the PTS main body according to the one embodiment of the present invention.

Next, with reference to FIG. 19 to FIG. 23, a power adapter fixture for attaching a power adapter will be described. This power adapter is, for example, a power adapter of a power cable which is connected to the power connector 1805a (refer to FIG. 12) of the PTS main body 1700b shown in FIG. 8 and the like. FIG. 19 shows a state in which a power adapter fixture 1900 is held onto the power adapter.

The power adapter fixture 1900 includes a fixture main body 1901, stopper members 1902, magnet sheets 1912a and 1912b, screws 1903a and 1903b, and is in contact with a metallic member at a part of an upper side (attachment part) shown in FIG. 19. As shown in FIG. 19, the power adapter fixture 1900 is held by belts 1940a and 1940b such that a lower portion of the fixture main body 1901 comes in contact with a power adapter 1950 (for example, a plane part of the power adapter). In addition, the fixture main body 1901 has a hollow part 1907, and said hollow part 1907 is opened on both side face sides of the fixture main body 1901.

The power adapter 1950 is provided with a connector 1951 into which a terminal of the power cable connected to a power source (for example, a power supply unit 1081 of the slot machine 1010) is inserted. In addition, connected to the power adapter 1950 is a cable 1952 connected to a device of a power supply destination (here, the PTS main body 1700b) (an end part thereof is not shown).

Figure 20:
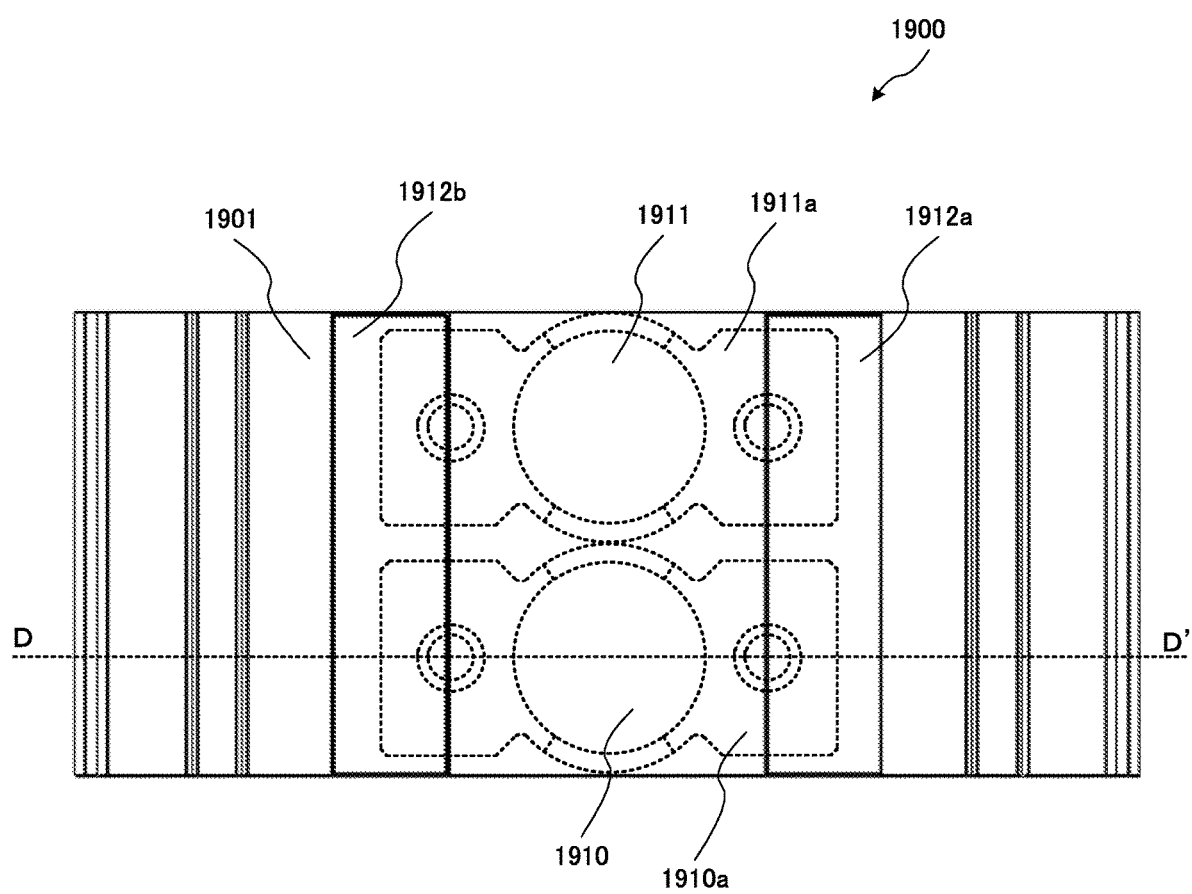
FIG. 20 is a top view of the power adapter fixture according to the one embodiment of the present invention.

FIG. 20 is a top view illustrating the fixture main body 1901. A magnet 1910, and a magnet holder 1910a as well as a magnet 1911 and a magnet holder 1911a are embedded in the fixture main body 1901, respectively and the shapes thereof are indicated by dotted lines.

In addition, on upper portions of the magnet holder 1910a and the magnet holder 1910b, the magnet sheets 1912a and 1912b are located.

Figure 21:
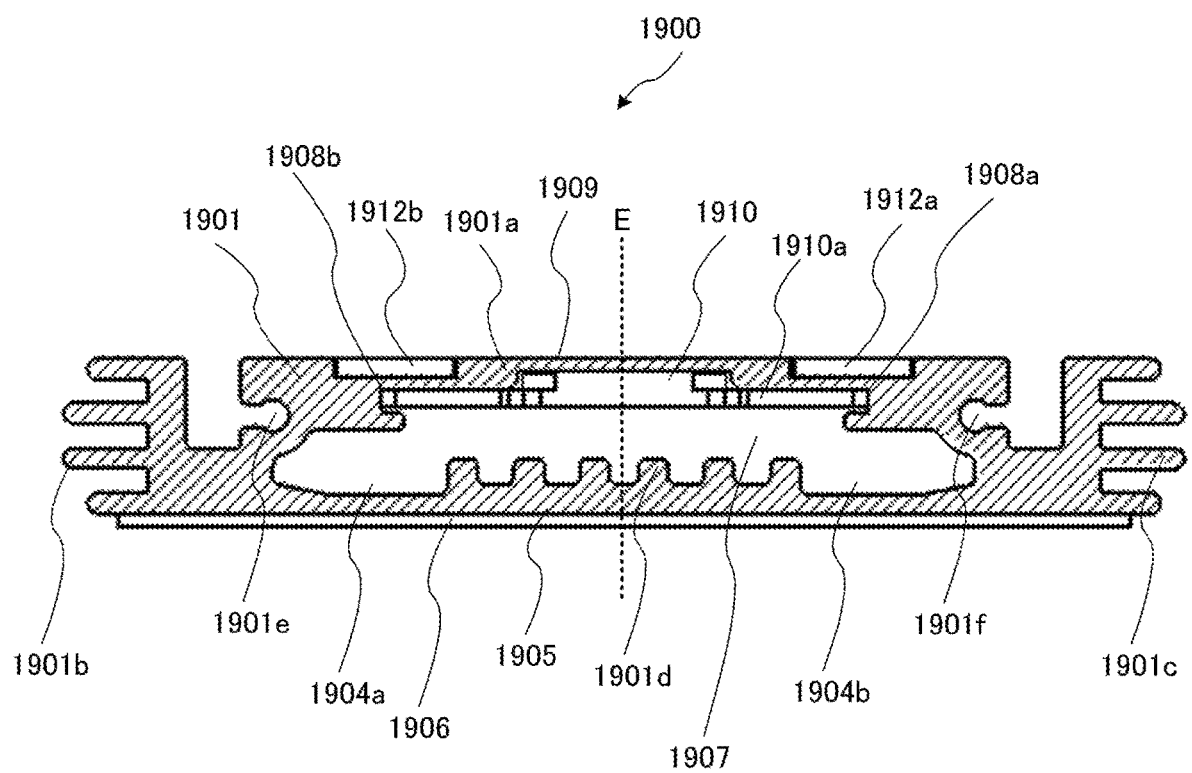
FIG. 21 is a sectional view of the power adapter fixture according to the one embodiment of the present invention.

FIG. 21 is a sectional view illustrating a cross-section of the power adapter fixture 1900 along a dotted line, taken from a dotted line D-D' shown in FIG. 20, and the cross-section of the fixture main body 1901 is indicated by diagonal lines. In FIG. 21, the power adapter fixture 1900 is in a state in which the stopper members 1902 and the screws 1903a and 1903b are removed and further, the belts 1940a and 1940b are detached. It is to be noted that the fixture main body 1901 is formed of, for example, a metallic member such as aluminum, whose thermal conductivity is high.

As is seen from FIG. 21, the power adapter fixture 1900 further includes a sheet 1906 provided between the power adapter 1950 and the fixture main body 1901, a magnet, and a magnet holder. Although as shown in FIG. 20, the power adapter fixture 1900 has two sets, each of which includes the magnet and the magnet holder, the cross-section of only one of the sets (that is, the magnet 1910 and the magnet holder 1910a) appears in FIG. 21.

The fixture main body 1901 is connected with an obverse face of the power adapter 1950 on the connection part 1905 of the fixture main body 1901 (with the sheet 1906 being sandwiched therebetween). It is to be noted that the connection part 1905 and the obverse face of the power adapter 1950 may be directly connected without any inserted matter such as the sheet 1906. For example, the connection part 1905 and the power adapter 1950 have respective connection planes, and it is preferable that these connection planes come directly or indirectly in contact with each other, whereby thermal conduction is performed.

In addition, the fixture main body 1901 is provided with magnet holding parts 1908a and 1908b which are recessed parts for holding the magnets. Both ends of the magnet holder 1910a of the magnet 1910 are fitted into the recessed parts, whereby the magnet is held such that the stopper members 1902 and screws 1903a and 1903b prevent the magnet from moving thereoutside. A screw 1903a is screwed with a screw hole 1901e and fixed, and a screw 1903b is screwed with a screw hole 1901f and fixed. The magnet 1910 is housed in the fixture main body 1901 as a projection part corresponding to the recessed part 1901a of the fixture main body 1901.

A portion on a reverse side of the magnet 1910, which is an upper portion of the fixture main body 1901 shown in FIG. 21, constitutes an attachment part 1909, that is, the magnet 1910 is located on an inner face of an attachment part side of the hollow part 1907 (this is the same as with the magnet 1911). This attachment part 1909 is attracted and attached onto the external metallic member by the magnet, whereby the power adapter fixture 1900 and the power adapter 1950 are attached onto this metallic member. Since the power adapter fixture 1900 and the power adapter 1950 are attracted and attached onto the external metallic member, attachment of the power adapter 1950 outside and detachment thereof can be easily performed. It is preferable that the attachment part 1909 is formed to be a plane in order to facilitate the attraction and attachment onto the external metallic member and the heat dissipation.

The attachment part 1909 also functions as a heat dissipation part which conducts heat dissipation to the external metallic member. Since the attachment part 1909 is attached onto the metallic member which is excellent in thermal conduction, more effective heat dissipation is made possible. In addition, areas, in which the magnets (1910 and 1911) and the fixture main body 1901 come in contact with outside air, are increased by arranging the hollow part 1907, thereby making the heat dissipation more effective.

In addition, as shown in FIG. 21, the fixture main body 1901 is provided with a first heat dissipation fin 1901b, a second heat dissipation fin 1901c, and a third heat dissipation fin 1901d for conducting the heat dissipation (heat dissipation and heat exhaust to outside air) of the power adapter 1950. For example, the third heat dissipation fin 1901d is located on an inner face of a connection part of the hollow part 1907, thereby making effective the heat dissipation on the connection part side where a temperature becomes high. Further, the fixture main body 1901 has the hollow part 1907 which is opened on both side face sides of the fixture main body 1901, thereby enhancing a heat dissipation efficiency of the power adapter 1950. The third heat dissipation fin 1901d is located on an inner side of the hollow part 1907. Further, the fixture main body 1901 is provided with grooves 1904a and 1904b, by which the belts 1940a and 1940b are held so as not to move, inside of the hollow part 1907.

Through the above-described configuration, the magnet 1910 and the magnet 1911 can effectively dissipate the heat conducted from the connection part 1905 hollow part 1907 in proximity thereto. In addition thereto, the magnet 1910 and the magnet 1911 are located so as to be separated at a fixed distance from the heat source, and when the heat is conducted from the connection part 1905 with the fixture main body 1901 being a medium, the distance can be made long. As a result, a trouble such as a reduction in magnetic force of the magnets, caused by high temperatures thereof, can be prevented.

Further, as shown in FIG. 21, the fixture main body 1901 has the two recessed parts in the upper portions of the fixture main body 1901, and the magnet sheets 1912a and 1912b are held respectively in those recessed parts (for example, through attachment, fitting, or the like). As described above, the magnet sheets 1912a and 1912b are arranged and said magnets are thereby attracted and attached onto the metallic member. Through the magnetic force and friction of the above-described magnet sheets, the power adapter fixture 1900 and the power adapter 1950 can be prevented from being displaced from the attaching positions and slipping down, thereby allowing the stable attachment state thereof to be maintained.

Although in order to suppress the displacement of the power adapter fixture 1900 and the power adapter 1950, a method of strengthening the magnetic force of the magnets 1910 and 1911 can be employed, it is often the case that the detachment thereof becomes difficult. In contrast thereto, through arranging the above-described magnet sheets 1912a and 1912b, while the displacement is effectively suppressed, the facilitated detachment can be realized.

With respect to the arrangement positions and the number of the attraction and attachment members including the above-described magnet sheets, various variations can be considered. It is to be noted that as shown in FIG. 21, by keeping a large distance between the two magnet sheets, the displacement caused by the rotation of the fixture main body 1901 (for example, the rotation with a rotating axis which is a straight line extending from the attachment part 1909 of the fixture main body 1901 toward the connection part 1905, like a dotted line E shown in FIG. 21) can be effectively prevented.

Figure 22:
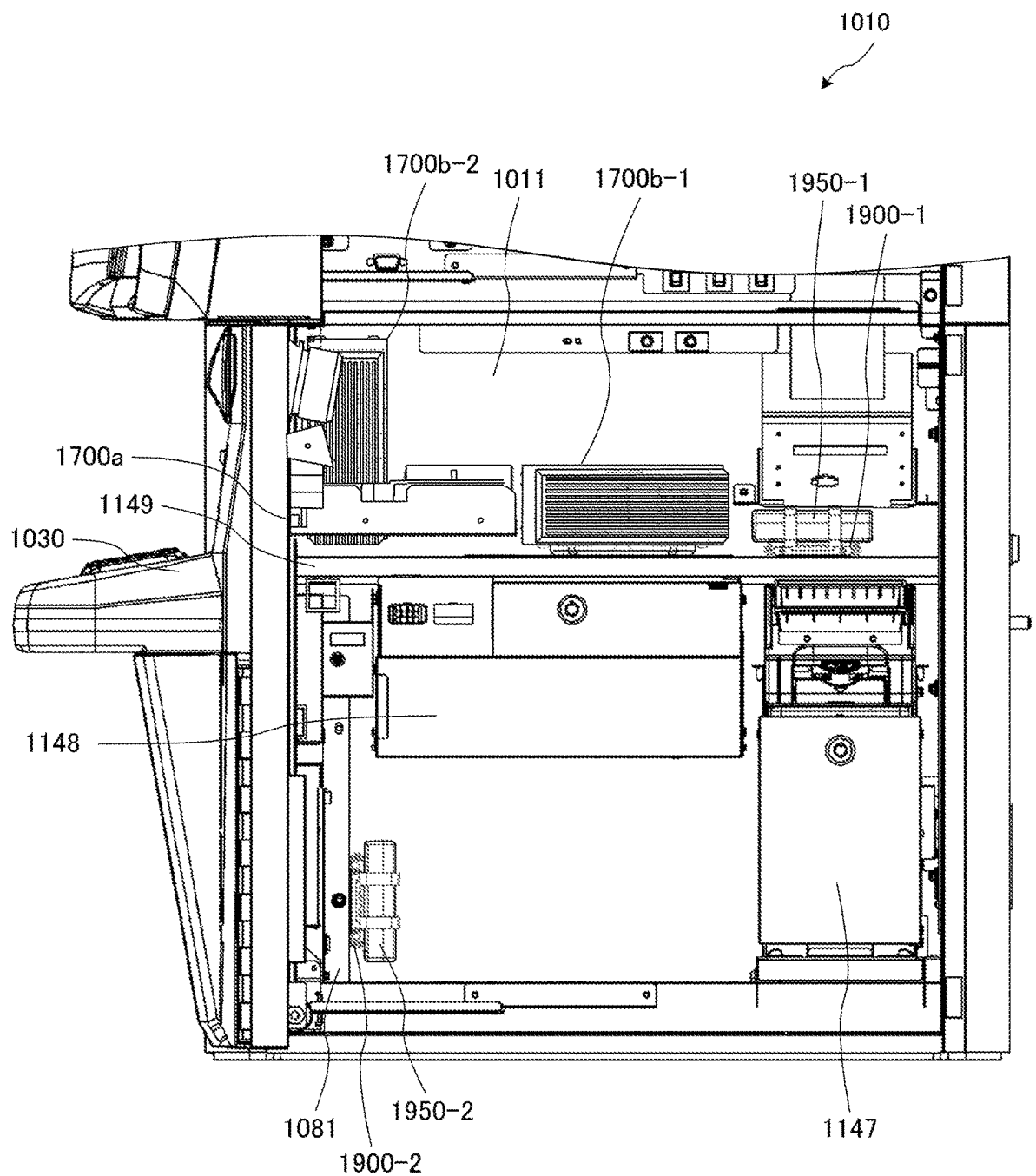
FIG. 22 is a diagram exemplifying a plurality of patterns, in each of which the power adapter is attached by the power adapter fixture according to the one embodiment of the present invention.

FIG. 22 is a diagram exemplifying two representative patterns, in each of which the power adapter fixture 1900 and the power adapter 1950 are attached when the PTS main body 1700b is attached inside of the slot machine 1010. It is to be noted that in FIG. 22, respective kinds of cables connecting the PTS front unit 1700a and the PTS main body 1700b and a cable connecting the PTS main body 1700b and the power adapter 1950 are not shown.

As to the slot machine 1010 shown in FIG. 22, the cabinet 1011 of the slot machine 1010 with the upper door 1142 and the lower door 1144 being opened shown in FIG. 6 is partially illustrated.

The PTS main body 1700b-1 is attached on the shelf plate member 1149 by the magnetic force of the three magnets (1810, 1811, and 1812) in the state in which the magnet cover 1801 is in contact with the metallic plate member of the upper side of the shelf plate member 1149. In addition, the PTS main body 1700b-2 is attached on the left side of the cabinet 1011 of the slot machine 1010 by the magnetic force of the three magnets (1810, 1811, and 1812) in the state in which the magnet cover 1801 is in contact with the side part metallic plate member on the inner side of the cabinet 1011.

In a first pattern, a power adapter fixture 1900-1 and a power adapter 1950-1 are attached on the upper side of the shelf plate member 1149. In other words, the metallic plate member of the upper side of the shelf plate member 1149 and a fixture main body 1901-1 of the power adapter fixture 1900-1 are attracted and attached with each other by the magnetic force of the magnets and magnet sheets with which the power adapter fixture 1900-1 is provided. In this state, one side of a cable of the power adapter 1950-1 is connected, for example, to the PTS main body 1700b-1 or the PTS main body 1700b-2, and the other side of the cable extends in a left downward direction of the cabinet 1011 and connected to the power supply unit 1081.

In a second pattern, a power adapter fixture 1900-2 and a power adapter 1950-2 are attached on a right side face of the power supply unit 1081. In other words, the metallic plate member of a right side of the power supply unit 1081 and a fixture main body 1901-2 of the power adapter fixture 1900-2 are attracted and attached with each other by the magnetic force of the magnets and magnet sheets with which the power adapter fixture 1900-2 is provided. In this state, one side of a cable of the power adapter 1950-2 is connected, for example, to the PTS main body 1700b-1 or the PTS main body 1700b-2, and the other side of the cable is connected to the power supply unit 1081 in proximity.

In a case where as in the second pattern, the power adapter fixture 1900-2 and the power adapter 1950-2 are attached in a longitudinal direction as it is called, the power adapter fixture 1900-2 and the power adapter 1950-2 are highly likely to slip down. In this case, the above-described arrangement of the magnet sheets is effective in particular to prevent the slipping-down.

Figure 23:
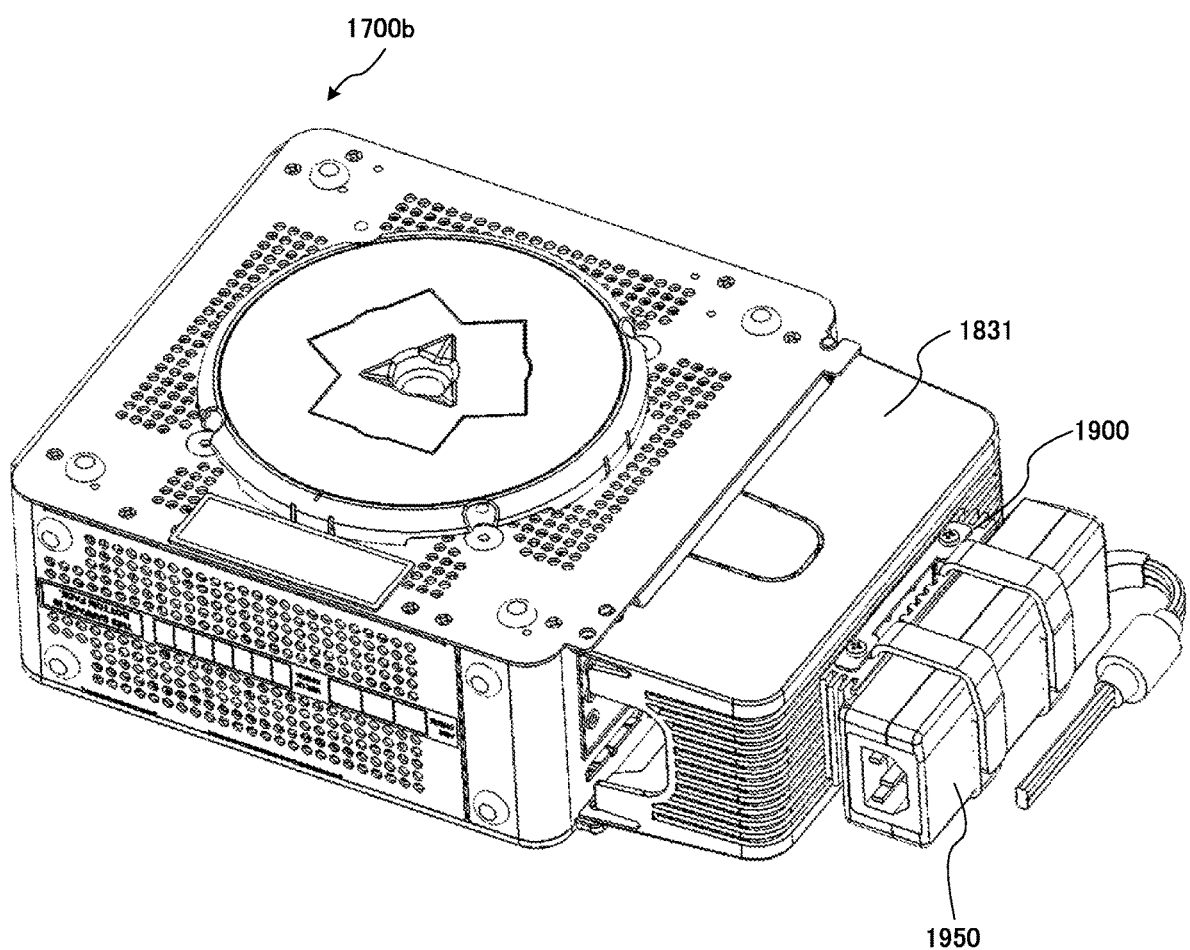
FIG. 23 is a side view illustrating a state in which the power adapter fixture is attached to the cable cover according to the one embodiment of the present invention.

FIG. 23 shows a state in which the power adapter 1950 is attached further via the power adapter fixture 1900 onto the PTS main body 1700b on which the cable cover 1831 shown in FIG. 16 is attached. As shown therein, the PTS main body 1700b, the cable cover 1831, and the power adapter 1950 which are in an integrated state can be located inside of the slot machine 1010 as shown in FIG. 18. Through the above-described configuration, heat of the power adapter 1950 is dissipated by the above-mentioned first heat dissipation fin 1901b, second heat dissipation fin 1901c, and third heat dissipation fin 1901d and in addition thereto, is conducted via the power adapter fixture 1900 to the cable cover 1831, and heat dissipation is performed by air passing through said cable cover 1831 and an inside of the cable cover 1831.

In addition, in this case, the magnet sheets are arranged in the fixture holding region 1832 of the cable cover 1831 shown in FIG. 16, and the power adapter 1950 is attached (held) onto the cable cover 1831 by the attraction of the magnets 1910 and 1911 of the power adapter fixture 1900. In addition, since the power adapter fixture 1900 is provided with the magnets 1910 and 1911, the power adapter 1950 may be attached onto the cable cover 1831 by locating a metallic member in the fixture holding region 1832 or on the periphery or a back side of the fixture holding region 1832.

In general, as shown in FIG. 22, the power adapter fixture 1900 holds the power adapter 1950, is not held by the cable cover 1831, and is attached onto the cabinet 1011 of the slot machine 1010 or the other metallic member (by the magnets 1910 and 1911) so as to be separated from the PTS main body 1700b. Through the above-described configuration, the heat of the power adapter 1950 is conducted via the power adapter fixture 1900 to the metallic member and the heat dissipation is performed. In addition, as shown in FIG. 23, the configuration can also be arranged such that the power adapter fixture 1900 holds the power adapter 1950 and at the same time, is attached onto the cable cover 1831, and the PTS main body 1700b, the cable cover 1831, and the power adapter 1950 which are in the integrated state are housed inside of the slot machine 1010.

Hereinabove, the effective heat dissipation for the power adapter 1950 of the PTS main body 1700b and the power adapter fixture 1900 for suppressing a rise in temperature of the power adapter 1950 are described. However, the application of the above-described power adapter fixture 1900 is not limited to applications related to a gaming machine such as the PTS main body 1700b or the slot machine 1010 and the power adapter fixture 1900 is widely applicable power adapters in general. For example, by attaching the power adapter fixture 1900 according to the present embodiment onto a power adapter of a personal computer and attaching the power adapter onto a metallic member of a desk (by magnets), heat dissipation by the heat dissipation fins as well as heat dissipation for said metallic member or the like are performed, thereby suppressing a rise in temperature in the power adapter itself.

In addition, in the power adapter fixture 1900 according to the present embodiment, the two magnets 1910 and 1911 are incorporated into the fixture main body 1901, and both ends are blocked by the stopper members 1902, whereby said magnets are held in the power adapter fixture 1900. However, various patterns of kinds of and the number of magnets and of ways of holding the magnets in the power adapter fixture 1900 and the like can be considered, and these are not limited to the present embodiment.

Similarly, also with respect to the number, positions, shapes, and the like of the heat dissipation fins of the fixture main body 1901 and the number, the position, the shape, and the like of the hollow part 1907, various patterns can be considered. In addition, with respect to the way of holding the power adapter fixture 1900 onto the power adapter 1950, various ways other than the way of using the belts 1940a and 1940b as in the present embodiment can be adopted.

[Configuration of Circuitry Included in Slot Machine]

Figure 24:
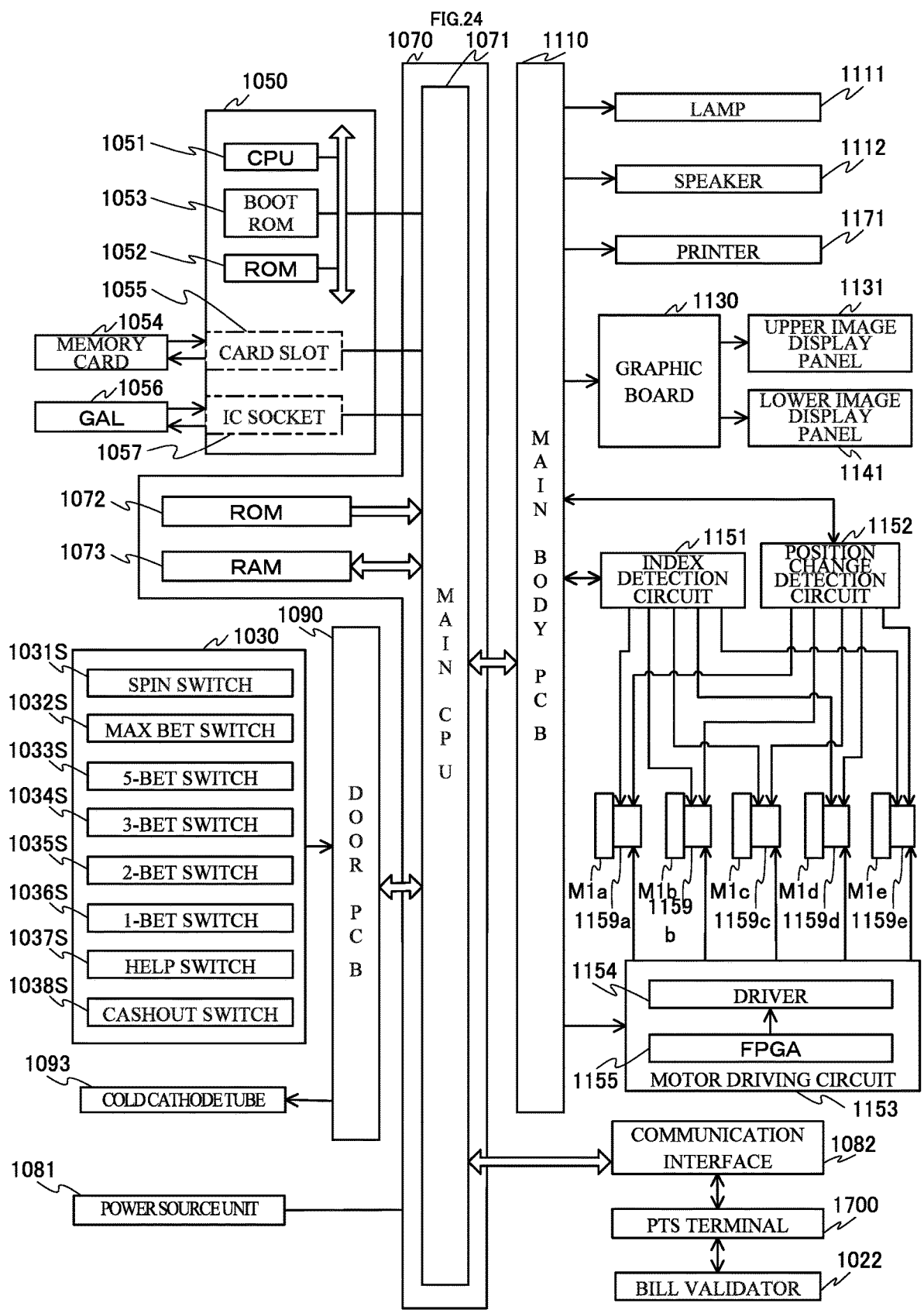
FIG. 24 is a diagram showing a circuitry configuration of the slot machine according to the one embodiment of the present invention.

Next, with reference to FIG. 24, a configuration of circuitry included in a slot machine 1010 will be described.

A gaming board 1050 is provided with: a CPU 1051, a ROM 1052, and a boot ROM 1053, which are mutually connected by an internal bus; a card slot 1055 corresponding to a memory card 1054; and an IC socket 1057 corresponding to a GAL (Generic Array Logic) 1056.

The memory card 1054 includes a non-volatile memory and stores a game program and a game system program. The game program includes a program related to game progression and a program for producing presentation by images and sounds. In addition, the above-mentioned game program includes a symbol determination program. The symbol determination program is a program for determining symbols to be rearranged.

In addition, the card slot 1055 is configured so that the memory card 1054 can be inserted thereinto and removed therefrom and is connected to a motherboard 1070 by an IDE bus. Accordingly, the memory card 1054 is pulled out from the card slot 1053S, another game program is written into the memory card 1054, and that memory card 1054 is inserted into the card slot 1053S, thereby allowing a kind and contents of a game played on the slot machine 1010 to be changed.

The GAL 1056 is a type of a PLD (Programmable Logic Device) having a fixed OR array structure. The GAL 1056 is provided with a plurality of input ports and output ports, and predetermined input into the input port causes output of the corresponding data from the output port.

In addition, the IC socket 1057 is configured so that the GAL 1056 can be inserted thereinto and removed therefrom and is connected to the motherboard 1070 by a PCI bus. The contents of the game to be played on the slot machine 1010 can be changed by replacing the memory card 1054 with another memory card 1054 having another program written therein or by rewriting the program written into the memory card 1054 as another program.

The CPU 1051, the ROM 1052 and the boot ROM 1053 mutually connected by the internal bus are connected to the motherboard 1070 by a PCI bus. The PCI bus enables a signal transmission between the motherboard 1070 and the gaming board 1050 and power supply from the motherboard 1070 to the gaming board 1050.

The ROM 1052 stores an authentication program. The boot ROM 1053 stores a pre-authentication program, a program (boot code) to be used by the CPU 1051 for activating the pre-authentication program, and the like.

The authentication program is a program (tamper check program) for authenticating the game program and the game system program. The pre-authentication program is a program for authenticating the above-mentioned authentication program. The authentication program and the pre-authentication program are written along a procedure (authentication procedure) for proving that the program to be the subject has not been tampered.

The mother board 1070 is configured by using a commercially available general-purpose mother board (printed circuit board having basic components of a personal computer mounted thereon) and includes a main CPU 1071, a ROM (Read Only Memory) 1072, a RAM (Random Access Memory) 1073, and a communication interface 1082. Here, the main CPU 1071 corresponds to a controller 1100 of the slot machine 1010.

The ROM 1072 includes a memory device such as a flash memory and stores a program such as a BIOS (Basic Input/Output System) to be executed by the main CPU 1071 and permanent data. When the BIOS is executed by the main CPU 1071, processing for initializing predetermined peripheral devices is conducted; and further, through the gaming board 1050, processing of loading the game program and the game system program stored in the memory card 1054 is started. It is to be noted that in the present invention, the ROM 1072 may be a ROM in which contents are rewritable or a ROM in which contents are un-rewritable.

The RAM 1073 stores data and programs such as the symbol determination program which are used in operation of the main CPU 1071. For example, when the processing of loading the above-mentioned game program, game system program, or authentication program is conducted, the RAM 1073 can store the program. The RAM 1073 is provided with working areas used for operations in execution of these programs. Examples of the areas include: areas that stores counters for managing the number of games, the number of BETs, the number of payout, the number of credits, and the like; an area that stores symbols (code numbers) determined by a drawing; and the like.

The communication interface 1082 is to control transmission and reception of data between a PTS terminal 1700 and the main CPU 1071. In addition, the motherboard 1070 is connected with the later-described door PCB (Printed Circuit Board) 1090 and a main body PCB 1110 by respective USBs. The motherboard 1070 is also connected with a power supply unit 1081.

When the power is supplied from the power supply unit 1081 to the motherboard 1070, the main CPU 1071 of the motherboard 1070 is activated, and then the power is supplied to the gaming board 1050 through the PCI bus so as to activate the CPU 1051.

The door PCB 1090 and the main PCB 1110 are connected with input devices such as switches and sensors and peripheral devices, the operations of which are controlled by the main CPU 1071.

The door PCB 1090 is connected with a control panel 1030 and a cold cathode tube 1093.

The control panel 1030 is provided with a spin switch 1031S, a MAX-BET switch 1032S, a 5-BET switch 1033S, a 3-BET switch 1034S, a 2-BET switch 1035S, a 1-BET switch 1036S, a HELP switch 1037S, and a CASHOUT switch 1038S which correspond to the above-mentioned respective buttons. Each of the switches outputs a signal to the main CPU 1071 upon detection of pressing of any button corresponding thereto by a player.

The cold cathode tube1093 functions as a backlight installed on the rear face sides of the upper image display panel 1131 and the lower image display panel 1141 and lights up based on a control signal outputted from the main CPU 1071.

The main body PCB 1110 is connected with a lamp 1111, speakers 1112, a printer 1171, and a graphic board 1130. It is to be noted that although in this example, a bill validator 1022 is connected to the PTS terminal 1700, a configuration in which the bill validator 1022 is connected to the slot machine 1010 may be adopted.

The lamp 1111 lights up based on a control signal outputted from the main CPU 1071. The speakers 1112 outputs sounds such as BGM, based on a control signal outputted from the main CPU 1071. Based on a control signal outputted from the main CPU 1071, the printer 1171 prints on a ticket, for example, a barcode representing encoded data of a number of credits, date and time, an identification number of a slot machine 1010, and the like stored in the RAM 1073 and then outputs the ticket as a ticket with a barcode.

It is to be noted that the upper image display panel 1131 and the lower image display panel 1141 may be configured as touch panels. Each of the touch panel detects a position where a finger or the like of a player touches and outputs a signal corresponding to the detected position to the main CPU 1071.

The bill validator 1022 identifies whether or not bills are authentic and accepts authentic bills into the cabinet 1011. An amount of the bills inputted into the cabinet 1011 is converted to a number of coins and a credit which is equivalent to the converted number of coins is added as a credit which a player has.

The graphic board 1130 controls display of images conducted by the respective upper image display panel 1131 and lower image display panel 1141 based on control signals outputted from the main CPU 1071. The graphic board 1130 is provided with a VDP (Video Display Processor) generating image data, a video RAM storing the image data generated by the VDP, and the like. It is to be noted that the image data used in generation of image data by the VDP is included in the game program which has been read from the memory card 1054 and stored into the RAM 1073.

A motor driving circuit 1153 includes an FPGA (Field Programmable Gate Array) 1155 and a driver 1154. Connected to the motor driving circuit 1153 are stepping motors 1159a to 1159e for rotating the respective reels M1a to M1e. The FPGA1155 is a programmable electronic circuit such as LSI and functions as a control circuit for the stepping motors 1159a to 1159e. The driver 1154 functions as an amplifying circuit for pulses inputted to the stepping motors 1159a to 1159e.

An index detection circuit 1151 is to detect a position of each of the reels M1a to M1e which are rotating and further, is capable of detecting losing of steps of each of the reels M1a to M1e. A position change detection circuit 1152 detects a change of a position where each of the reels M1a to M1e has stopped. For example, in a case where although in reality, a combination of symbols displayed after stopping of the reels M1a to M1e is not associated with any of combinations of symbols related to winning, the position where each of the reels M1a to M1e has stopped is changed by an external action such as a fraudulent act so as to establish any of combinations of symbols related to winning, the position change detection circuit 1152 detects the change of the position where each of the reels M1a to M1e has stopped. The position change detection circuit 1152 is configured to detect, for example, fins (not shown) attached at predetermined intervals to internal portions of each of the reels M1a to M1e and to be capable of thereby detecting the change of the position where each of the reels M1a to M1e has stopped.

It is to be noted that an excitation system of the stepping motors 1159a to 1159e is not particularly limited and a 1-2 phase excitation system or a 2 phase excitation system may be adopted. In addition, instead of the stepping motors, DC motors may be adopted. In a case where the DC motors are adopted, connected to the main body PCB 110 are a deviation counter, a D/A converter, and a servo amplifier in this order, and the DC motors are connected to the servo amplifier. In addition, rotation positions of the DC motors are detected by a rotary encoder, current rotation positions of the DC motors are supplied as data from the rotary encoder to the deviation counter.

It is to be noted although the configuration of the circuitry of the slot machine 1010 is described as the configuration shown in FIG. 24 hereinabove, a variety of other configurations may be adopted.

[Circuitry Configuration of PTS Terminal]

Figure 25:
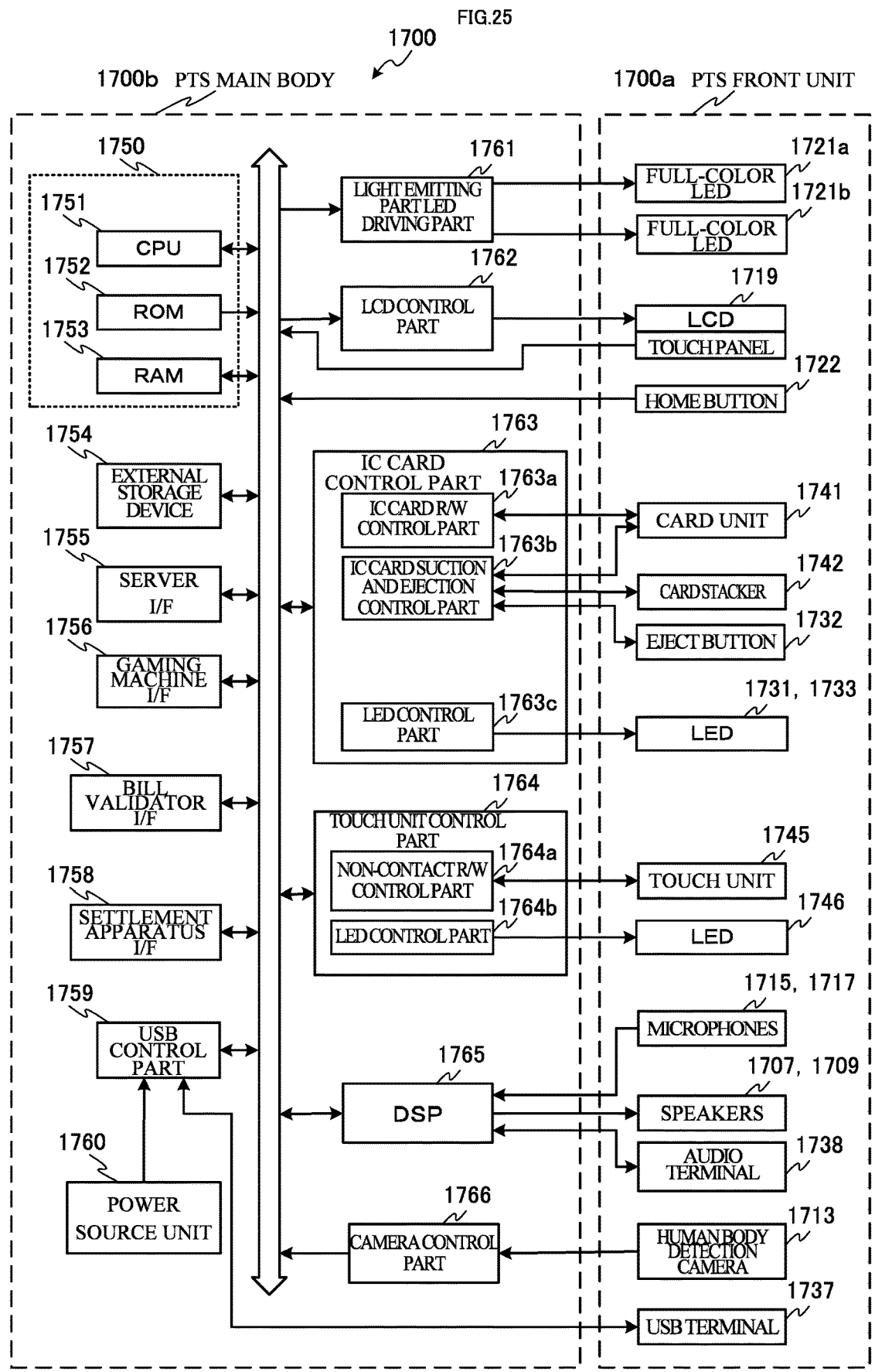
FIG. 25 is a diagram showing a circuitry configuration of the PTS terminal according to the one embodiment of the present invention.

Next, with reference to FIG. 25, a configuration of circuitry or the like which a PTS terminal 1700 includes will be described. As described above, the PTS terminal 1700 includes a PTS front unit 1700a and a PTS main body 1700b. In FIG. 25, however, the circuitry or the like which the PTS terminal 1700 includes is shown by dividing the circuitry or the like into circuitry or the like included in the PTS front unit 1700a and circuitry or the like included in the PTS main body 1700b.

A PTS controller 1750 for controlling the PTS terminal 1700 has a CPU 1751, a ROM 1752, and a RAM 1753.

The CPU 1751 controls execution of each component of the PTS terminal 1700, executes a variety of programs stored in the ROM 1752, and performs computation. For example, the CPU 1751 executes a credit updating program and updates credit-related data stored in an IC card 1500.

The ROM 1752 is constituted of a memory device such as a flash memory and has stored therein permanent data executed by the CPU 1751. For example, in the ROM 1752, a credit updating program for rewriting the credit-related data stored in the IC card 1500 or the like can be stored.

The RAM 1753 temporarily stores data required upon executing a variety of programs stored in the ROM 1752.

An external storage device 1754 is a storage device, for example, such as a hard disk device and stores a program executed by the CPU 1751 and data which a program executed by the CPU 1751 uses.

A server I/F (interface) 1755 realizes data communication between servers such as a hall management server 10, a bonus server 11, and the like and the PTS terminal 1700. A gaming machine I/F (interface) 1756 realizes data communication between a slot machine 1010 and the PTS terminal 1700, and for said data communication, a specified protocol can be used.

Besides, the PTS terminal 1700 is connected to a bill validator 1022 via a bill validator I/F (interface) 1757 and connected to a settlement apparatus 1868 via a settlement apparatus I/F (interface) 1758 and is capable of performing transmission and reception of data as needed.

A USB control part 1759 determines whether on a USB terminal 1737, power is supplied from a power supply unit 1760 and when a predetermined condition is satisfied, enables the recharging on the USB terminal 1737. When the predetermined condition is satisfied, a player connects an electronic device to the USB terminal 1737, thereby allowing said electronic device to be recharged.

A light emitting part LED driving part 1761 performs control such that in order to cause an upper light emitting plate 1720*a* of an LCD 1719 to emit light, full-color LEDs 1721*a* are lit up at predetermined timing and performs control such that in order to cause a lower light emitting plate 1720*b* of the LCD 1719 to emit light, full-color LEDs 1721*b* are lit up at predetermined timing.

An LCD control part 1762 performs control to cause the LCD 1719 to display information pertinent to members, information for the members, and the like and to display data read out from an IC card 1500 and data inputted by a player. In addition, the LCD 1719 has a touch panel function and when a touch panel is operated by a player, a predetermined signal is transmitted to the CPU 1751.

A home button 1722 is provided in the vicinity of the LCD 1719 and is a button for shifting a screen displayed on the LCD 1719 to a predetermined upper level screen. When the home button 1722 is pressed by a player, that operation by a player is transmitted to the CPU 1751, and the CPU 1751 transmits an instruction to the LCD control part 1762 to update the display on the LCD 1719 in accordance with said operation.

An IC card control part 1763 performs control for insertion and ejection of an IC card 1500, writing of credit data thereto, and the like. The IC card control part 1763 includes an IC card R/W (reader/writer) control part 1763*a*, an IC card suction and ejection control part 1763*b*, and an LED control part 1763*c*.

The IC card R/W control part 1763*a* controls a card unit 1741 and updates credit-related data stored in an IC card 1500. In addition, when an IC card 1500 is newly issued, credit-related data corresponding a settled money amount is stored. The card unit 1741 has an antenna part for reading data by an NFC or the like from the IC card 1500 or writing the data thereto.

Although the card unit 1741 has functions of an IC card reader for reading information stored in an IC card 1500 and an IC card writer for writing information to an IC card 1500, the card unit 1741 may have a function of either one of the IC card reader and the IC card writer as needed.

The IC card suction and ejection control part 1763*b* performs control for suction and ejection of an IC card 1500. When an IC card 1500 is inserted by a player into the card insertion slot 1730, the IC card suction and ejection control part 1763*b* performs control to retain the IC card while a player is executing a game. In addition, after the credit-related data has been written in the IC card 1500 upon the settlement, the IC card suction and ejection control part 1763*b* performs control to eject that IC card 1500. Further, when eject button 1732 is pressed, the IC card suction and ejection control part 1763*b* ejects the IC card 1500.

In addition, when an IC card 1500 is newly issued, the IC card suction and ejection control part 1763*b* newly takes out an IC card 1500 from a card stacker 1742 and in order to cause the IC card 1500 to store credit-related data, supplies the IC card 1500 to the card unit 1741.

The LED control part 1763*c* performs control to light up LEDs (full-color LEDs 1731) provided in the vicinity of the card insertion slot 1730 of the card unit 1741 and to light up an LED (red LED 1733) provided in the vicinity of the eject button 1732.

A touch unit control part 1764 controls data transmission and reception associated with a touch operation on an IC card 1500, a mobile phone, a smartphone, or the like. The touch unit control part 1764 includes a non-contact R/W (reader/writer) control part 1764*a* and an LED control part 1764*b*.

The non-contact R/W control part 1764*a* determines whether or not the IC card 1500 or the mobile phone comes near within a predetermined distance (for example, a touch operation has been conducted) with a touch unit 1745, and when the IC card 1500 or the mobile phone has come near within the predetermined distance, the non-contact R/W control part 1764*a* obtains a reading-out result from the touch unit 1745. The touch unit 1745 has an antenna part for performing data transmission and reception to and from the IC card 1500 or the mobile phone by an NFC or the like.

Although the touch unit 1745 has functions of the IC card reader for reading information stored in the IC card 1500 or the mobile phone and the IC card writer for writing information to the IC card 1500 or the mobile phone, the touch unit 1745 may have a function of either one thereof as needed.

The LED control part 1764*b* controls LEDs 1746 located in four corners of a front face of the touch unit 1745 to light up the LEDs 1746 at predetermined timing.

A DSP 1765 receives sound data obtained from microphones 1715 and 1717 and conducts predetermined processing for the sound data and thereafter, transmits the processed data to the CPU 1751. In addition, the DSP 1765 transmits the received sound data to speakers 1707 and 1709. Further, the DSP 1765 outputs the sound, received to an audio terminal connected with a headset, to headphones and processes the sound received from the microphones and transmits the processed sound to the CPU 1751. It is to be noted that here, the configuration of the outline is described and the descriptions of an A/D converter, a D/A converter, an amplifier, and the like are omitted.

A camera control part 1766 obtains an image of a player or the like shot by a human body detection camera 1713, subjects the image to predetermined image processing as needed, and transmit the processed data to the CPU 1751. Said data is transmitted, for example, via a server I/F 1755 to the hall management server 10, the membership management server 13, and the like.

It is to be noted that although hereinabove, the circuitry configuration of the PTS terminal 1700 is descried as the configuration shown in FIG. 25, a variety of other configurations may be adopted.

[Configuration of Symbol Combination Table]

Next, with reference to FIG. 26, a symbol combination table will be described.

The symbol combination table specifies combinations of drawn symbols related to winning and the numbers of payout. On a slot machine 1010, the rotation of symbol arrays of five reels M1*a* to M1*e* (a first reel to a fifth reel) of a reel apparatus M1 is stopped, and winning is established when the combination of symbols displayed along a winning line matches one of the combinations of symbols specified by the symbol combination table. According to the winning combination, a benefit such as payout of a credit or the like is provided for a player. It is to be noted that winning is not established (i.e. the game is lost) when the combination of symbols displayed along the winning line does not match any of the combinations of symbols specified by the symbol combination table.

Basically, winning is established when all symbols displayed along the winning line by all of the five reels M1a to M1e are of one kind out of kinds of symbols "RED", "APPLE", "BLUE 7", "BELL", "CHERRY", "STRAWBERRY", "PLUM", and "ORANGE". However, with respect to the respective kinds of symbols "CHERRY" and "ORANGE", winning is also established when one or three symbols of either kind are displayed along the winning line by the reel or the reels.

For example, when all the symbols displayed along the winning line by all of the five reels M1a to M1e of the reel apparatus M1 are the symbols "BLUE 7", the winning combination is a "BLUE" combination, and "10" is determined as the number of payout. Based on the determined number of payout, the provision of a credit is conducted. The above-mentioned provision of the credit is conducted, for example, such that the added credit is stored on the IC card 1500 and thereafter, the IC card 1500 is ejected from the card insertion slot 1730.

[Contents of Program Executed on Slot Machine]

Next, with reference to FIG. 27 to FIG. 31, one example of a program executed on a slot machine 1010 will be described.

<Main Control Process>

Figure 27:
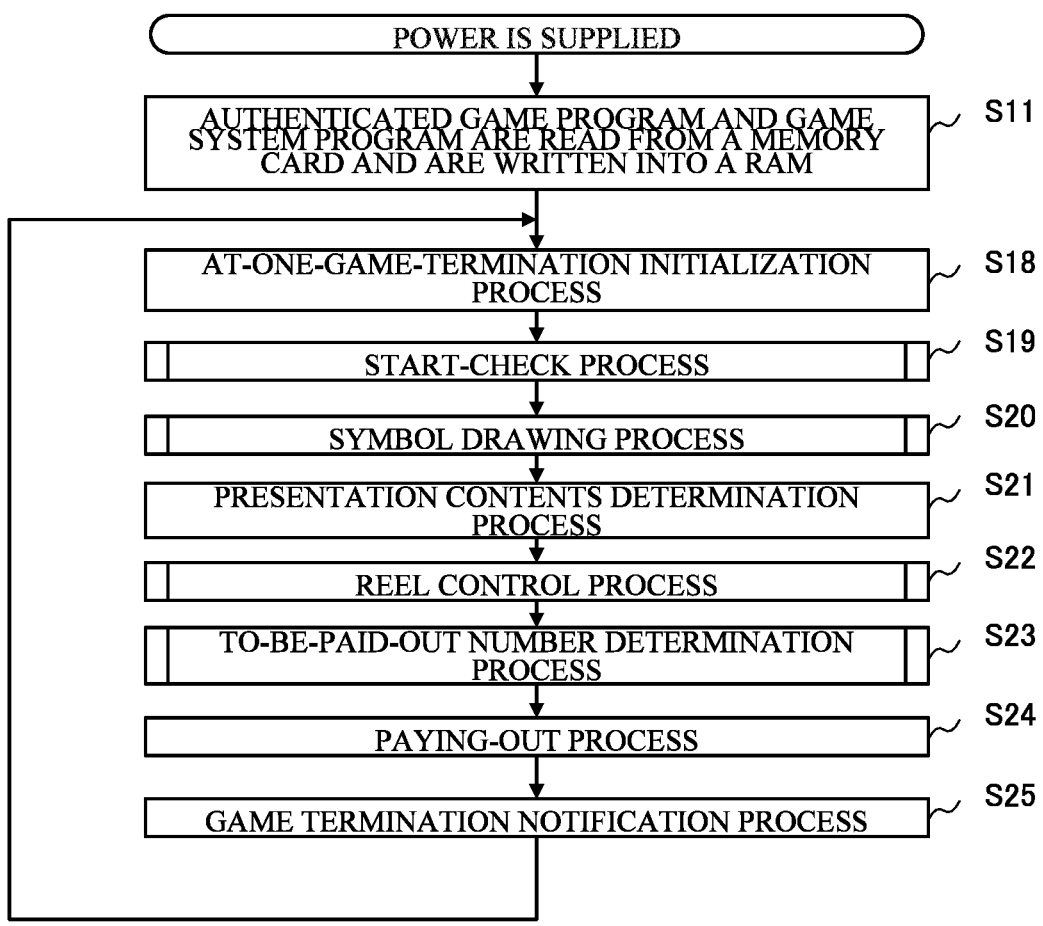
FIG. 27 is a flowchart showing a procedure of a main control process executed on the slot machine according to the one embodiment of the present invention.

First, with reference to FIG. 27, a main control process will be described. First, when the power is supplied to the slot machine 1010, a main CPU 1071 reads the authenticated game program and game system program from a memory card 1054 via a gaming board 1050 and writes the programs into a RAM 1073 (step (hereinafter, abbreviated to S) 11).

Next, the main CPU 1071 conducts an at-one-game-end initialization process (S18). For example, data that becomes unnecessary after each game in working areas of the RAM 1073, such as the number of BETs and the symbols determined by a drawing, is cleared.

Next, the main CPU 1071 conducts a start-check process which is described later (S19). In this process, input from a BET switch and a spin switch is checked.

Next, the main CPU 1071 conducts a symbol drawing process which is described later (S20). In this process, to-be stopped symbols are determined based on random number values for symbol determination.

Next, the main CPU 1071 conducts a presentation contents determination process (S21). The main CPU 1071 extracts random number values for presentation and determines any of the presentation contents from a predetermined plurality of presentation contents by a drawing. The presentation contents can be determined in accordance with a winning combination and a state of a game on the slot machine 1010. For example, the configuration can be arranged such that in accordance with winning combinations and the states of the game on the slot machine 1010, drawing probabilities related to respective presentation contents are made different from one another.

Next, the main CPU 1071 conducts a reel control process which is described later (S22). In this process, rotation of five reels M1a to M1e (a first reel to a fifth reel) of a reel apparatus M1 is started, and the to-be stopped symbols determined in the symbol drawing process at S20 are stopped in predetermined positions (for example, in a symbol display window 1135). In other words, three symbols including the to-be stopped symbols with respect to each of the reels are displayed in the symbol display window 1135.

Next, the main CPU 1071 conducts a to-be-paid-out number determination process which is described later (S23). In this process, based on a combination of symbols displayed on a winning line L, a to-be-paid-out number is determined and stored in a to-be-paid-out number counter provided in the RAM 1073.

Next, the main CPU 1071 conducts a paying-out process (S24). The main CPU 1071 adds the value stored in the to-be-paid-out number counter to a value stored in a number-of-credits counter provided in the RAM 1073. Here, for example, when a player presses a CASHOUT button, a CASHOUT switch 1038S which has detected the pressing thereof outputs a signal to the main CPU 1071, and a number of credits stored in an IC card 1500 held in a card unit 1741 is updated to a value in the number-of-credits counter.

Next, the main CPU 1071 conducts a game termination notification process (S25). In this process, data indicating that one unit game has been terminated (together with an identification code or the like of an IC card 1500 in a case where an IC card 1500 or the like has been inserted and a player can be thereby identified) is transmitted to the PTS terminal 1700. The PTS terminal 1700 transmits this data to a hall management server 10, and in response thereto, a bonus server 11 conducts a drawing for a bonus game. After finishing the processing at S25, the main CPU 1071 returns to the processing at S18 and the unit game is repeated.

<Start-Check Process>

Figure 28:
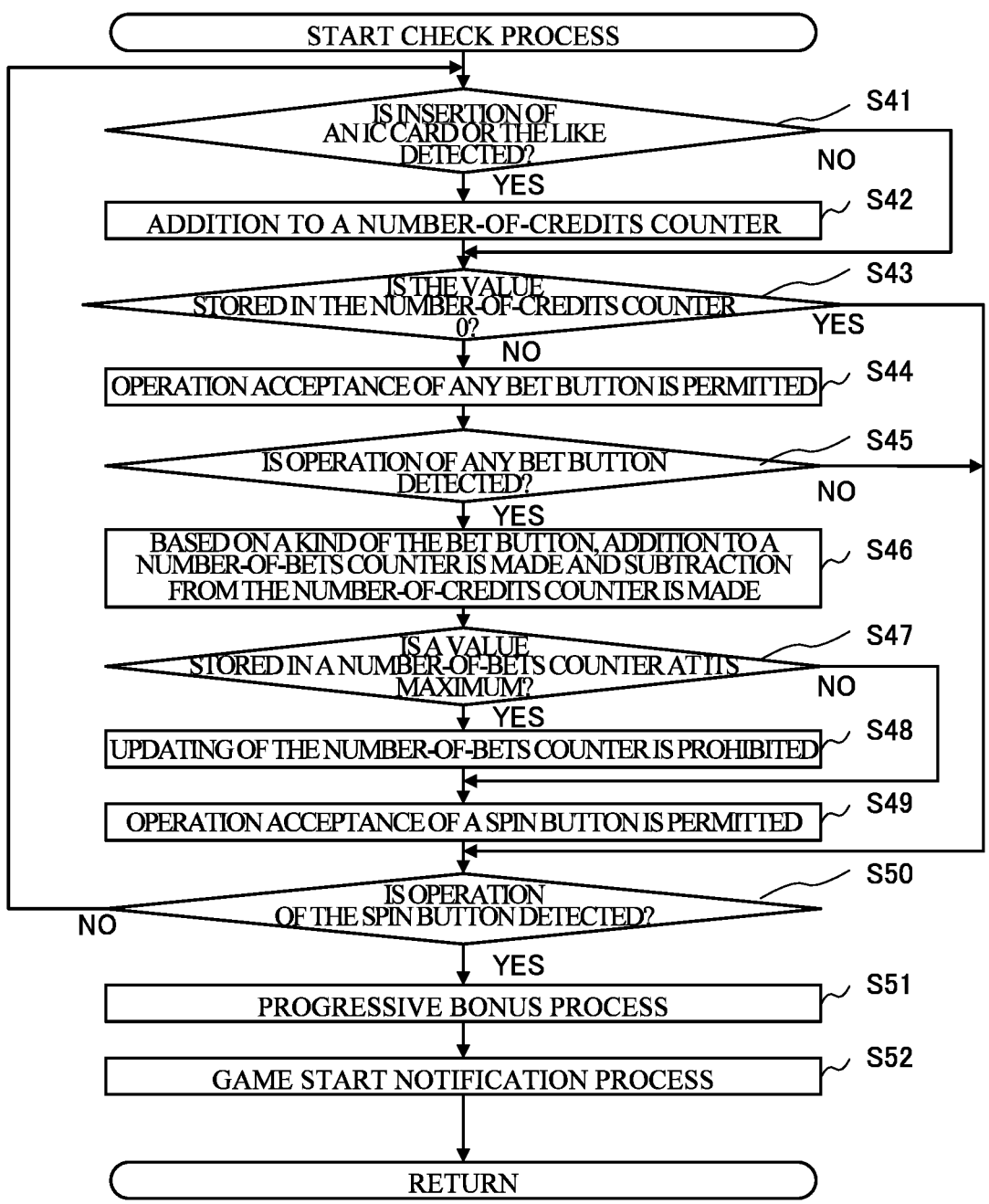
FIG. 28 is a flowchart showing a procedure of a start-check process executed on the slot machine according to the one embodiment of the present invention.

Next, with reference to FIG. 28, a start-check process will be described. The main CPU 1071 determines whether or not an IC card 1500 inserted from a card insertion slot 1730 has been held by a card unit 1741 and whether or not bills are inputted into a bill validator 1022 (S41). When the main CPU 1071 determines that the insertion of the IC card 1500 or the inputting of the bills has been detected, said IC card 1500 or authenticity of said bills are confirmed and thereafter, addition thereof to a number-of-credits counter is performed (S42).

After the process at S42 or when determining at S41 that the insertion of the IC card 1500 or the like has not been detected, the main CPU 1071 determines whether or not a value stored in the number-of-credits counter is zero (S43). When the main CPU 1071 determines that the value stored in the number-of-credits counter is not zero, the main CPU 1071 permits operation acceptance of a BET button (for example, any of a MAX BET button 1032, a 5-BET button 1033, a 3-BET button 1034, a 2-BET button 1035, and a 1-BET button 1036) (S44).

Next, the main CPU 1071 determines whether or not operation of any of the BET buttons has been detected (S45). When the pressing of any BET button by a player has been detected by a BET switch (for example, any of a MAX-BET switch 1032S, a 5-BET switch 1033S, a 3-BET switch 1034S, a 2-BET switch 1035S, a 1-BET switch 1036S), the main CPU 1071 performs addition to a number-of-BETs counter provided in the RAM 1073 and subtraction from the number-of-credits counter based on the kind of the BET button (S46).

Next, the main CPU 1071 determines whether or not a value stored in the number-of-BETs counter is at its maximum (S47). When the main CPU 1071 determines that the value stored in the number-of-BETs counter is at its maximum, the main CPU 1071 prohibits updating of the value stored in the number-of-BETs counter (S48). After S48 or when determining at S47 that the value stored in the number-of-BETs counter is not at its maximum, the main CPU 1071 permits operation acceptance of a spin button (S49).

After S49, or when determining at S45 that the operation of any of the BET buttons has not been detected, or when determining at S43 that the value stored in the number-of-credits counter is zero, the main CPU 1071 determines whether or not operation of the spin button has been detected (S50). When the main CPU 1071 determines that the operation of the spin button has not been detected, the main CPU 1071 shifts the processing to S41.

When the main CPU 1071 determines that the operation of the spin button has been detected, the main CPU 1071 conducts a progressive bonus process. In this process, one part of the bet credit is paid out via a PTS terminal 1700 to a bonus server 11, for example, as a credit accumulated for a progressive bonus (S51).

Next, the main CPU 1071 conducts a game start notification process (S52). In this process, data indicating that one unit game is started (together with an identification code or the like of an IC card 1500 in a case where an IC card 1500 or the like has been inserted and a player can be thereby identified) is transmitted to the PTS terminal 1700. The PTS terminal 1700 transmits this data to a hall management server 10, and in response thereto, a bonus server 11 conducts a drawing for a bonus game. After the processing at S52 has been conducted, the start-check process is completed.

<Symbol Drawing Process>

Figure 29:
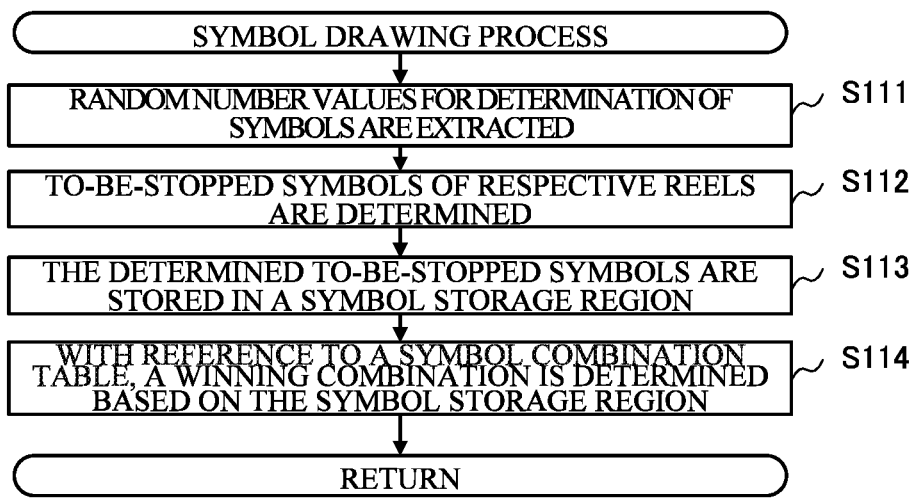
FIG. 29 is a flowchart showing a procedure of a symbol drawing process executed on the slot machine according to the one embodiment of the present invention.

Next, with reference to FIG. 29, a symbol drawing process will be described. First, the main CPU 1071 extracts random number values for symbol determination (S111). Next, the main CPU 1071 determines to-be stopped symbols for five reels M1a to M1e (a first reel to a fifth reel) of a reel apparatus M1 (S112). The main CPU 1071 conducts a drawing for each of the reels and determines any of 12 symbols as to-be stopped symbols.

Next, the main CPU 1071 stores the determined to-be stopped symbols for the respective reels in a symbol storage region provided in a RAM 1073 (S113). Next, the main CPU 1071 references a symbol combination table (FIG. 26) and determines a winning combination based on the symbol storage region (S114). The main CPU 1071 determines whether or not the combination of symbols to be displayed along a winning line by the respective reels matches any of the combinations of symbols specified by the symbol combination table and determines the winning combination. After the process has been conducted, the symbol drawing process is completed.

<Reel Control Process>

Figure 30:
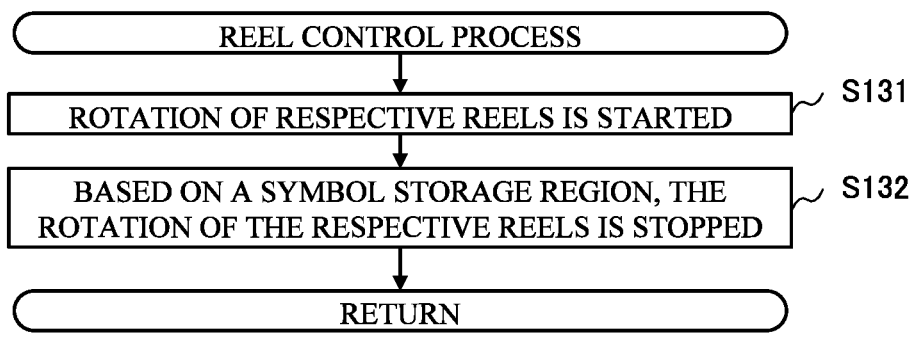
FIG. 30 is a flowchart showing a procedure of a reel control process executed on the slot machine according to the one embodiment of the present invention.

Next, with reference to FIG. 30, a reel control process will be described. First, the main CPU 1071 controls stepping motors 1159a to 1159e and starts rotation of five reels M1a to M1e of a reel apparatus M1 (S131). Next, the main CPU 71 controls the stepping motors 1159a to 1159e and stops the rotation of the five reels M1a to M1e based on the above-mentioned symbol storage region (S132). After the process has been conducted, the reel control process is completed.

It is to be noted that in accordance with timing of starting and stopping of the rotation of the reels M1a to M1e in the reel control process or other timing, the presentation determined in the presentation contents determination process (FIG. 27) is executed. For example, a moving image and a still image are displayed on an upper image display panel 1131 of the slot machine 1010, in synchronization therewith, sound is outputted from speakers 1112, and a lamp 1111 is lit up, thereby allowing said presentation to be executed.

<To-be-Paid-Out Number Determination Process>

Figure 31:
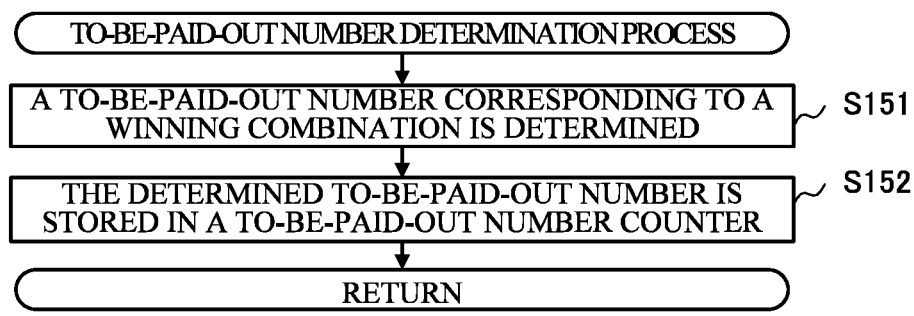
FIG. 31 is a flowchart showing a procedure of a to-be-paid-out number determination process executed on the slot machine according to the one embodiment of the present invention.

Next, with reference to FIG. 31, a to-be-paid-out number determination process will be described. First, a main CPU 1071 determines a to-be-paid-out number corresponding to a winning combination (S151). For example, when the winning combination is a combination of symbols "BELL", the main CPU 1071 determines "8" as the to-be-paid-out number (refer to FIG. 26). It is to be noted that the main CPU 1071 determines "0" as the to-be-paid-out number in a case where a game is lost. Next, the main CPU 1071 stores the determined to-be-paid-out number in a to-be-paid-out number counter (S152). After the process has been conducted, the to-be-paid-out number determination process is completed.

It is to be noted that winning has occurred in a bonus game drawing by a bonus server 11, predetermined presentation by PTS terminals 1700 is conducted over a plurality of slot machines 1010 including the slot machine 1010 on which the winning has occurred; in conjunction therewith, a bonus is paid out by the bonus server 11; and the bonus is added to, for example, the to-be-paid-out number counter.

Hereinabove, the embodiment of the present invention is described.

In the player tracking device, the player tracking device main body is connected via the power cable provided with the power adapter (for example, an AC adapter) to the gaming machine, whereby the power is supplied. One end of the power cable is connected to the connector of the power source of the player tracking device main body and the other end thereof is connected to the power supply source (power supply unit) of the gaming machine.

In the meantime, the above-described power adapter of the power cable includes electric components such as capacitors, and lives of these electric components are largely influenced by ambient temperature. For example, there is even a trial calculation estimating that if the ambient temperature is reduced by approximately 2° C., a service life may be prolonged by nearly one year.

Since inside of the housing of the gaming machine, large numbers of various circuits and mechanisms are located, temperature is liable to become high. In a case where as with the power cable of the player tracking device, the power adapter is located inside of the housing of the gaming machine, in particular, a heat dissipation countermeasure for the power adapter itself becomes important. However, such heat dissipation countermeasure has not been taken for the conventional gaming machine.

The embodiment of the present invention provides a power adapter fixture described below.

The embodiment of the present invention has been made in view of the above-described regard. An object thereof is to provide a power adapter fixture which is operable to effectively dissipate heat of a power adapter itself.

A power adapter fixture according to a first aspect of the present invention has the below-described configuration.

The power adapter fixture (for example, a power adapter fixture 1900) having a fixture main body (for example, a fixture main body 1901) attached onto a power adapter, the fixture main body including:

a connection part (for example, a connection part 1905) being connected so as to be operable to conduct heat from the power adapter (for example, a power adapter 1950); and a heat dissipation part (for example, a first heat dissipation fin 1901b, a second heat dissipation fin 1901c, and a third heat dissipation fin 1901d) for dissipating the heat being conducted from the connection part.

By employing the above-described configuration, since the fixture main body is provided with the heat dissipation part for dissipating the heat conducted from the connection part to outside air, effective heat dissipation for the power adapter can be performed by said heat dissipation part.

In the first aspect, the power adapter fixture according to a second aspect of the present invention further has the below-described configuration.

The fixture main body includes an attachment part (for example, an attachment part 1909) for attachment to the outside so as to be operable to conduct heat.

By employing the above-described configuration, since the fixture main body includes the attachment part for attachment to the outside so as to be operable to conduct the heat, the power adapter can be attached to the outside and the heat of the power adapter can also be dissipated via said attachment part to the outside.

In the second aspect, the power adapter fixture according to a third aspect of the present invention further has the below-described configuration.

The attachment part has magnets (for example, magnets 1910 and 1911) arranged thereon for allowing attachment onto a metallic member.

By employing the above-described configuration, since the magnets are arranged on the attachment part, the attachment and detachment to and from the outside of the power adapter can be facilitated. In addition, since the attachment onto the metallic member which is excellent in thermal conduction is performed, the heat dissipation is made effective.

In the third aspect, the power adapter fixture according to a fourth aspect of the present invention further has the below-described configuration.

The fixture main body has a hollow part (for example, a hollow part 1907) constituting a hollow space between the connection part and the attachment part, and the magnets are located on an inner face of a side of the attachment part of the hollow part.

By employing the above-described configuration, since the fixture main body is provided with the hollow part between the connection part and the attachment part, an area in contact with outside air is increased and the heat dissipation thereby becomes effective. In addition, since the magnets are located on the inner face of the side of the attachment part of said hollow part, the arrangement of the magnets is facilitated.

In the fourth aspect, the power adapter fixture according to a fifth aspect of the present invention further has the below-described configuration.

The heat dissipation part is located on an inner face of a side of the connection part of the hollow part.

By employing the above-described configuration, since the heat dissipation part is located on the inner face of the side of the connection part of the hollow part, the heat dissipation on the side of the connection part where temperature becomes high is made effective.

In the fourth aspect, the power adapter fixture according to a sixth aspect of the present invention further has the below-described configuration.

In the attachment part, magnet sheets (for example, magnet sheets 1912a and 1912b) are located on a face in contact with the outside, which are peripheral portions.

By employing the above-described configuration, since in the attachment part, the magnet sheets are located on the face in contact with the outside, which are the peripheral portions of the magnets, through the magnetic force and the friction of said magnet sheets, displacement is suppressed and a stable attachment state can be maintained. As compared with a case where magnetic forces of the magnets are strengthened in order to suppress the displacement, the detachment is facilitated.

In the power adapter fixture according to the embodiment of the present invention, since the fixture main body is provided with the heat dissipation part for dissipating the heat to the outside air, the effective heat dissipation for the power adapter connected by the connection part can be performed.

REFERENCE SIGNS LIST

1 game system
1010 slot machine
1011 cabinet
1030 control panel
1131 upper image display panel
1135 symbol display window
1141 lower image display panel
1700 PTS terminal
1700a PTS front unit
1700b PTS main body
1720a and 1720b light emitting plates
1721a and 1721b full-color LEDs
1706 and 1708 speaker ducts
1707 and 1709 speakers
1750 PTS controller
1801 magnet cover
1803 base panel
1810, 1811, and 1812 magnets
1815 base stopper
1900 power adapter fixture
1901 fixture main body
1901b first heat dissipation fin
1901c second heat dissipation fin
1901d third heat dissipation fin
1910 and 1911 magnets

The invention claimed is:

1. A power adapter fixture comprising:
 a fixture main body attached to a power adapter, the fixture main body including:
  a connection part including an outer face and an inner face, the connection part connectable to a power adapter so as to be operable to conduct heat from the power adapter;
  a heat dissipation part having at least one heat dissipating fin capable of dissipating heat conducted from the connection part;
 wherein, the inner face of the connection part partially defines a hollow part constituting a hollow space capable of dissipating heat conducted from the connection part.

2. The power adapter fixture of claim 1, wherein the fixture main body includes an attachment part capable of conducting heat, the attachment part including an outer face and an inner face;
 wherein, the inner face of the attachment part further partially defines the hollow part;
 wherein, the inner face of the attachment part is oppositely disposed from the inner face of the connection part and is separated therefrom by the hollow part; and
 wherein, the outer face of the attachment part is detachably securable to a surface.

3. The power adapter fixture of claim 2, wherein the attachment part includes at least one magnet disposed on at least one of the inner face or the outer face of the attachment part.

4. The power adapter fixture of claim 3, wherein the inner face of the attachment part includes at least one magnet.

5. The power adapter fixture of claim 4, wherein the inner face of the connection part includes a plurality of heat dissipating fins extending therefrom.

6. The power adapter fixture of claim 5, wherein the outer face of the attachment part includes at least one magnet in the form of a sheet.

7. A heat sink assembly configured to conduct heat from a heat producing assembly connectable thereto, the heat sink assembly comprising:
   a heat sink main body including a connection part forming a first wall of the heat sink main body and a pair of side walls extending from the connection part, the connection part side connectable to the heat producing assembly from which heat is to be conducted,
   wherein, the connection part includes an inner side and an outer side, the outer side having a planar surface, and the inner side and the side walls including a plurality of heat dissipative fins configured to dissipate heat.

8. The heat sink assembly of claim 7 further comprising an attachment part attachable to a non-heat sink assembly surface, the attachment part detachably securable to the pair of side walls to thereby form a second wall of the heat sink main body.

9. The heat sink assembly of claim 8, wherein when the attachment part is secured to the pair of side walls, the attachment part is disposed opposite the first wall such that the first wall, the second wall, and the pair of side walls define a hollow.

10. The heat sink assembly of claim 9, wherein the attachment part includes at least one magnet to magnetically secure the attachment part to a magnetically attractive surface.

11. The heat sink assembly of claim 10, wherein the attachment part includes an inner side and an outer side corresponding to the second wall formed by the attachment part, and at least one inner magnet is disposed on the inner side of the attachment part.

12. The heat sink assembly of claim 11, wherein the attachment part includes a plurality of inner magnets disposed on the inner side of the attachment part.

13. The heat sink assembly of claim 11, wherein the outer side of the attachment part includes at least one outer magnet disposed thereon.

14. The heat sink assembly of claim 13, wherein the outer side of the attachment part has a substantially planar outer side surface, and the at least one outer magnet is flush mounted to the substantially planar outer side surface.

15. The heat sink assembly of claim 14, wherein a plurality of outer magnets are flush mounted to the substantially planar outer side surface.

16. The heat sink assembly of claim 15, wherein a pair of outer magnets are flush mounted to the substantially planar outer side surface and are each respectively disposed proximate opposite terminal ends of the attachment part.

17. The heat sink assembly of claim 7, wherein the inner side of the connection part includes at least one recess capable of receiving a belt structure therein configured to secure the heat sink.

18. The heat sink assembly of claim 17, wherein the inner side of the connection part includes at least two recesses each capable of receiving a belt structure therein for securing the heat sink.

19. The heat sink assembly of claim 7, wherein the outer side of the connection part includes a thermally conductive sheet.

20. The heat sink assembly of claim 19, wherein the thermally conductive sheet is magnetic.

21. The heat sink assembly of claim 7, wherein each of the side walls includes an outer side and an inner side, and
   wherein, one or more heat dissipative fins disposed on each respective side wall is disposed on the outer side thereof.

22. A heat sink assembly for a power adapter configured to conduct heat from a power adapter connectable thereto, the heat sink assembly comprising:
   a heat sink main body including a connection part forming a first wall, an attachment part forming a second wall, and a pair of side walls extending from the connection part to the attachment part,
   wherein, the first wall, second wall and pair of side walls define a hollow such that the connection part, the attachment part, and the side walls each have an inner side and an outer side, and
   wherein, the inner side of the connection part and the outer sides of the pair of side walls include a plurality of heat dissipative fins configured to dissipate heat,
   wherein, the outer sides of the connection part and the attachment part have a planar surface, and
   wherein, the inner and outer sides of the attachment part each include at least two magnets disposed thereon.

23. The heat sink assembly of claim 22, wherein the at least two magnets disposed on the outer side of the attachment part are flush mounted with the outer side of the attachment part and are disposed proximate opposite terminal ends of the attachment part.

24. The heat sink assembly of claim 23, wherein the inner side of the connection part includes a pair of oppositely disposed recesses for each receiving a securing belt therein.

* * * * *